United States Patent [19]

Levin

[11] Patent Number: 5,390,258
[45] Date of Patent: Feb. 14, 1995

[54] FEATURE GUIDED METHOD AND APPARATUS FOR OBTAINING AN IMAGE OF AN OBJECT

[75] Inventor: David N. Levin, Chicago, Ill.

[73] Assignee: Argonne National Laboratories/University of Chicago Development Corporation, Chicago, Ill.

[21] Appl. No.: 927,352

[22] Filed: Aug. 7, 1992

[51] Int. Cl.$^6$ .................................................. G06K 9/00
[52] U.S. Cl. ............................................ 382/6; 382/54; 364/413.2; 364/413.21; 364/413.15
[58] Field of Search ............... 382/6, 54; 364/413.13, 364/413..16, 413.14, 413.2, 413.21, 413.15, 413.19

[56] References Cited

U.S. PATENT DOCUMENTS

| | | | |
|---|---|---|---|
| 4,606,004 | 8/1986 | Crawford | 382/6 |
| 5,150,429 | 9/1992 | Miller et al. | 382/54 |
| 5,165,100 | 11/1992 | Hsieh et al. | 364/413.16 |

OTHER PUBLICATIONS

Liang et al., "A Generalized Series Approach to MR Spectroscopic Imaging", *IEEE Transactions on Medical Imaging*, vol. 10, 1991, at p. 132.

Hu et al., "Technique for Reduction of Truncation Artifact in Chemical Shift Imges", *IEEE Transactions on Medical Imaging*, vol. 10, No. 3, Sep. 1991, pp. 290–294.

Constable et al., "Data Extrapolation for Truncation Artifact Removal", *Magnetic Resonance in Medicine*, vol. 17, 1991, pp. 108–118.

Haacke et al., "Constrained reconstruction: A super-resolution, optimal, signal-to-noise alternative to the Fourier transform in magnetic resonance imaging", *Medical Physics*, vol. 16, No. 3, May/Jun. 1989, pp. 387–397.

Vaals et al., "Increased Time Resolution in Dynamic Imaging", Abstract from 1992 SMRI Annual Meeting Printed Program, a supplement to *Journal of Magnetic Resonance Imaging*, Mar./Apr. 1992 issue, vol. 2(P).

Webb et al., "Applicaiton of a Generalized Series Reconstruciton Algorithm to Biological MR Imaging", Abstract from 1992 SMRI Annual Meeting Printed Program Works in Progress Supplement, *Society for Magnetic Resonance Imaging*.

Liang et al., "Constrained Reconstruction Methods in MR Imaging", *Reviews of Magnetic Resonance in Medicine*, pp. 1–172.

*Primary Examiner*—David K. Moore
*Assistant Examiner*—D. B. Anderson
*Attorney, Agent, or Firm*—Welsh & Katz, Ltd.

[57] ABSTRACT

A method and apparatus for obtaining an image from an object acquire training signal measurements which represent images of a plurality of training objects having at least one predetermined feature in common with the object and derive, from the training signal measurements, a set of basis functions that provide a convergent series expansion of the images. The method and apparatus determine a signal measurement prescription for the object based on the basis functions. A signal measurement acquiring device is controlled to acquire signal measurements of the object as determined by the signal measurement prescription. A truncated basis function expansion of the image is generated from the acquired signal measurements. Estimates of additional signal measurements are carried out based on the truncated basis function expansion. The image is reconstructed using the obtained signal measurements and the estimated additional signal measurements.

14 Claims, 21 Drawing Sheets

FEATURE GUIDED METHOD AND APPARATUS FOR OBTAINING AN IMAGE OF AN OBJECT

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyrights whatsoever.

FIELD OF INVENTION

The invention relates generally to methods and apparatus for reconstructing images and more particularly to methods and apparatus for obtaining medical images such as magnetic resonance (MR) imaging systems, computed tomography (CT) imaging systems, positron emission tomography (PET) imaging systems, or other like imaging systems.

BACKGROUND OF THE INVENTION

Conventional MR images are reconstructed by Fourier transformation of a limited number of phase-encoded signals in the center of k-space. Generally there is a tradeoff between imaging time and spatial resolution since these attributes are influenced in conflicting ways by the number of phase-encodings. For example, to decrease imaging time, the number of phase-encodings has to be decreased, thereby causing truncation artifacts and poor resolution of the reconstructed images. To obtain higher spatial resolution and reduce truncation artifacts, it is generally necessary to measure more phase-encoded signals, thereby lengthening acquisition time.

Several investigators have proposed constrained image reconstruction schemes which reduce truncation-artifacts in MR images without acquiring more phase-encoded signals. Generally constrained imaging methods seek to use previous experience with the imaging of certain types of objects to enhance the subsequent imaging of similar objects. In each case, a small number of phase-encoded signals in the center of k-space are measured, and prior information about image content was used to estimate high-k image components. Some of these schemes use mathematical hypotheses about image edge structure in order to estimate high-k signals from the measured low-k data. For example, Haacke et al. in an article entitled "Constrained reconstruction: A superresolution, optimal signal-to-noise alternative to the Fourier transform in magnetic resonance imaging," Medical Physics, Vol. 16, No. 3, May/June 1989, fits the low resolution data with a parametric "box car" model which does not have truncation artifacts.

Constable and Henkelman in an article entitled "Data Extrapolation for Truncation Artifact Removal," Magnetic Resonance in Medicine, vol 17, 1991, begin with a low resolution image produced by conventional Fourier transformation of the measured phase-encoded signals. The image was filtered to smooth out Gibbs "ringing" and then subjected to edge enhancement. High-k components of the object were estimated from the inverse Fourier transformation of this processed image. The final image was reconstructed by Fourier transformation of an array consisting of the measured signals in the center of k-space and the estimated high-k Fourier components.

Other investigators proposed ways of using highly resolved anatomic images to constrain the reconstruction of a chemical shift image or functional image of the same cross-section. These methods were based on the feeling that spectroscopic or functional images should resemble anatomic images in some sense. For example, Hu and Stillman in an article entitled "Technique for Reduction of Truncation Artifact in Chemical Shift Images," IEEE Nuclear Science Symposium, Medical Imaging Conference, Oct. 22-27, 1990, propose a technique for reducing truncation artifacts in chemical shift images by using boundary information available from anatomical images. This method of estimating high-k components is similar to that of Constable and Henkelman, except that edges in anatomic images are utilized to guide the smoothing of truncation artifacts in the chemical shift data.

Another method, such as that disclosed by Liang and Lauterbur in an article entitled "A Generalized Series Approach to MR Spectroscopic Imaging," IEEE Tran. on Medical Imaging, Vol 10, 1991, proposes a method of reconstructing temporally-varying functional images from an anatomical image and a small number of phase-encoded signals. Specifically, each functional image is approximated by the product of a previously-measured high resolution anatomical image and a time-dependent image with only a few spatial components. The latter may be estimated from a small number of phase-encoded signal measurements. Other methods acquired an initial high resolution anatomical image of the region of interest. Subsequent functional images of the region were reconstructed from a few measured phase-encoded signals in the center of k-space together with high-k components copied from the initial high resolution image.

All of these methods were shown to offer an advantage in at least some imaging situations. However, each method depends on specific assumptions about image edge content or about the correlation between different types of images of the same cross-section. In each case, this assumption is based on the author's intuition about which features should be incorporated in the final images. In any imaging situation, it is difficult to know if such a constraint is applicable. A problem arises if the user's intuition is wrong and an inappropriate constraint is applied, the resulting images could be degraded by peculiar artifacts which may be difficult to recognize.

Consequently there exists a need for a method and apparatus for obtaining images of an object which is not based on the user's intuition about what the final image should look like and which constraints should be applied to achieve that "look." Furthermore, there exists a need for an improved method and apparatus which does not suffer from the above limitations and which generates a high resolution image in a relatively short period of time.

SUMMARY OF THE INVENTION

These needs and others are substantially met by the method and apparatus for obtaining an image from an object as disclosed below.

It is an object of the invention to properly balance the trade-off between image resolution and acquisition time by utilizing prior knowledge which is contained in a "training" set of high resolution images of the relevant body part in other subjects.

It is a further object of the invention to provide a method and apparatus which employs feature recognition imaging which determines how to scan and reconstruct images of other similar subjects without incorrect guesswork or free parameters.

The method includes acquiring training signal measurements which represent images of a plurality of training objects, such as a plurality of brain images, having at least one predetermined feature in common with the object. The method further includes determining a signal measurement prescription, for selecting a subset of signals to be measured, based on a set of basis functions derived from the training signal measurements. After the scan prescription has been determined, signal measurements of the object are acquired as determined by the signal measurement prescription and a truncated basis function expansion of the image is generated from the acquired signal measurements. Additional signal measurements, not measured pursuant to the prescription, are estimated based on the truncated basis function expansion.

An image of the object may then be reconstructed from the collection of both measured and estimated signals using any suitable reconstruction technique such as back-projection in the case of CT or Fourier transformation in the case of MR. The training signal measurements are used to calculate a training matrix which is then used to determine the orthonormal basis functions. This process is only done once, typically as a preprocessing step, for a given type of object. In a preferred embodiment, the set of basis functions is derived by diagonalizing training matrices calculated from training images. During the signal measurement prescription process, an operator inputs an expected signal-to-noise level, that is expected during the step of acquiring signal measurements of the object as determined by the scan prescription.

An apparatus is disclosed which carries out the above method and includes a data acquisition device, such as an MR scanner, for acquiring training signal measurements which represent images of the plurality of training objects; a computer for storing a program which derives, from the training signal measurements, the set of basis functions that provide the convergent series expansion of the image. The computer determines a signal measurement prescription for the object based on the basis functions. The data acquisition device under software control, acquires signal measurements of the object, such as by scanning the object, as determined by the signal measurement prescription. The computer generates a truncated basis function expansion of the image from the acquired signal measurements and estimates additional signal measurements based on the truncated basis function expansion. The computer reconstructs the image of the object using both the obtained signal measurements and the estimated additional signal measurements and displays the image on a display device.

The apparatus also includes a user input device for inputting an estimation of a signal-to-noise level expected during the step of acquiring signal measurements of the object and also serves to receive input corresponding to a number of selected signal measurements and a number of basis functions.

BRIEF DESCRIPTION OF THE DRAWINGS

FIG. 2b graphically depicts the feature recognition coordinate system as applied to the training images of FIG. 2a;

Figure 8:
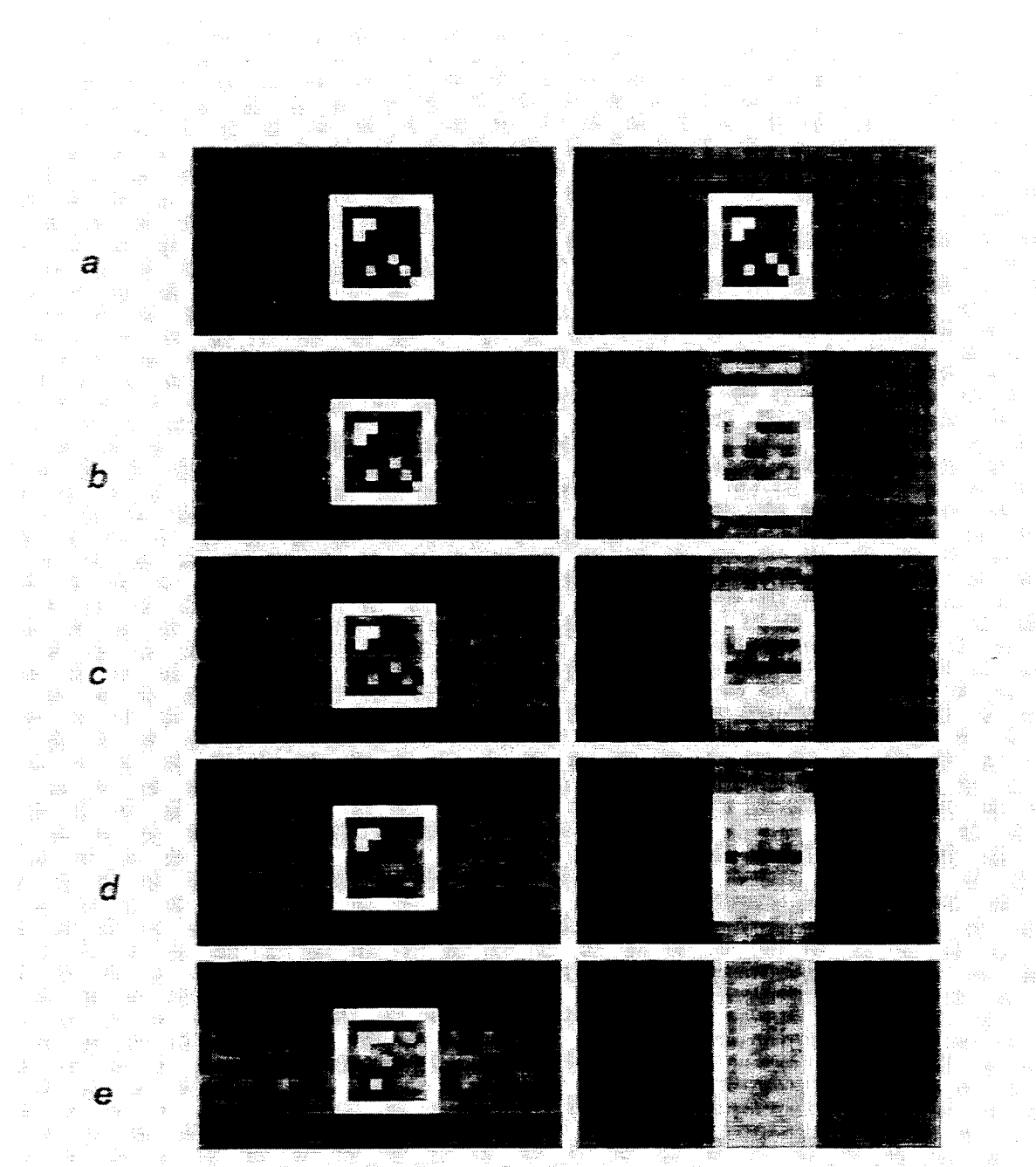
FIG. 8 pictorially illustrates a comparison of feature recognition images and Fourier transforms reconstructions of one of the simulated training images.
Figure 12:
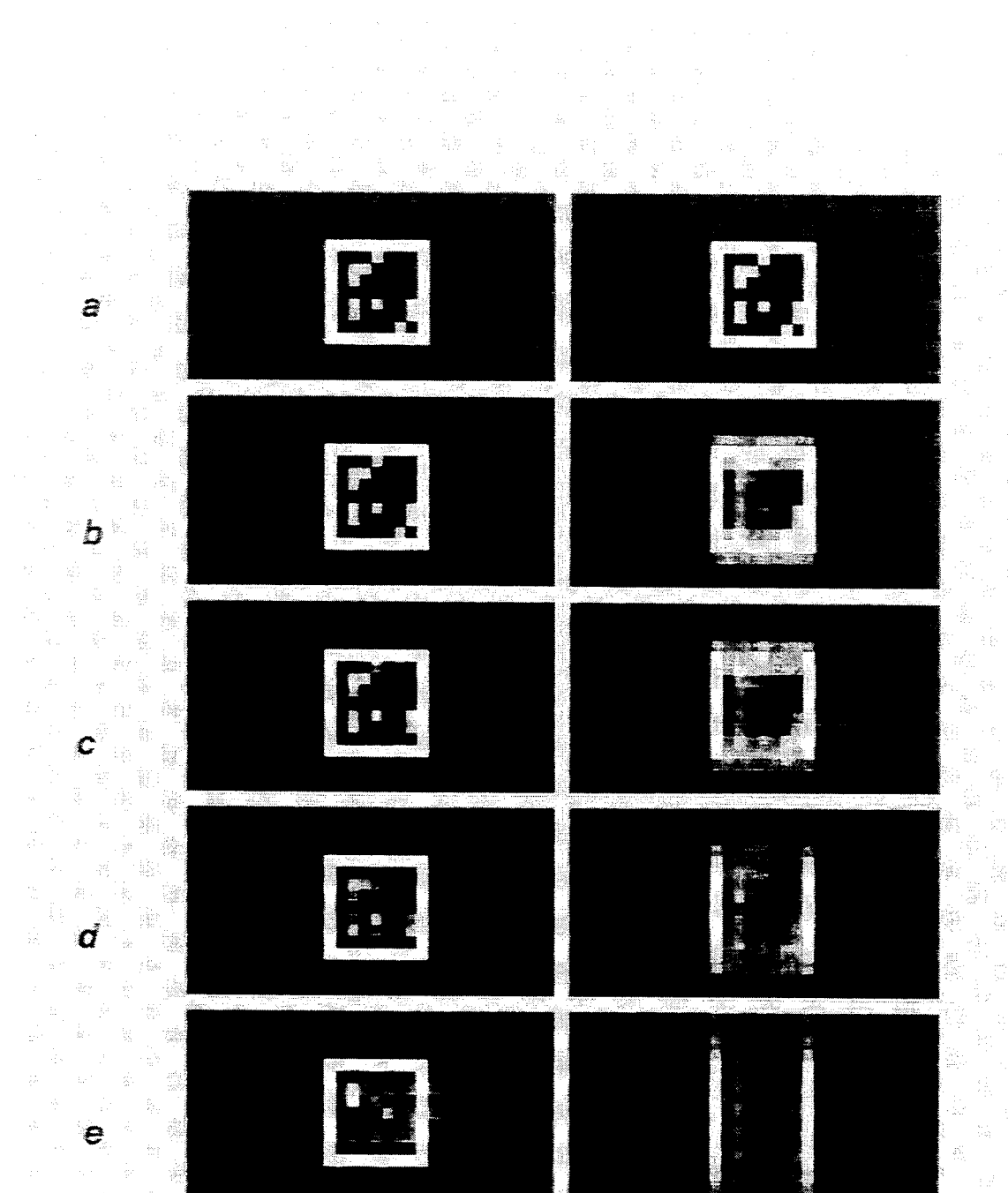
Figure 13:
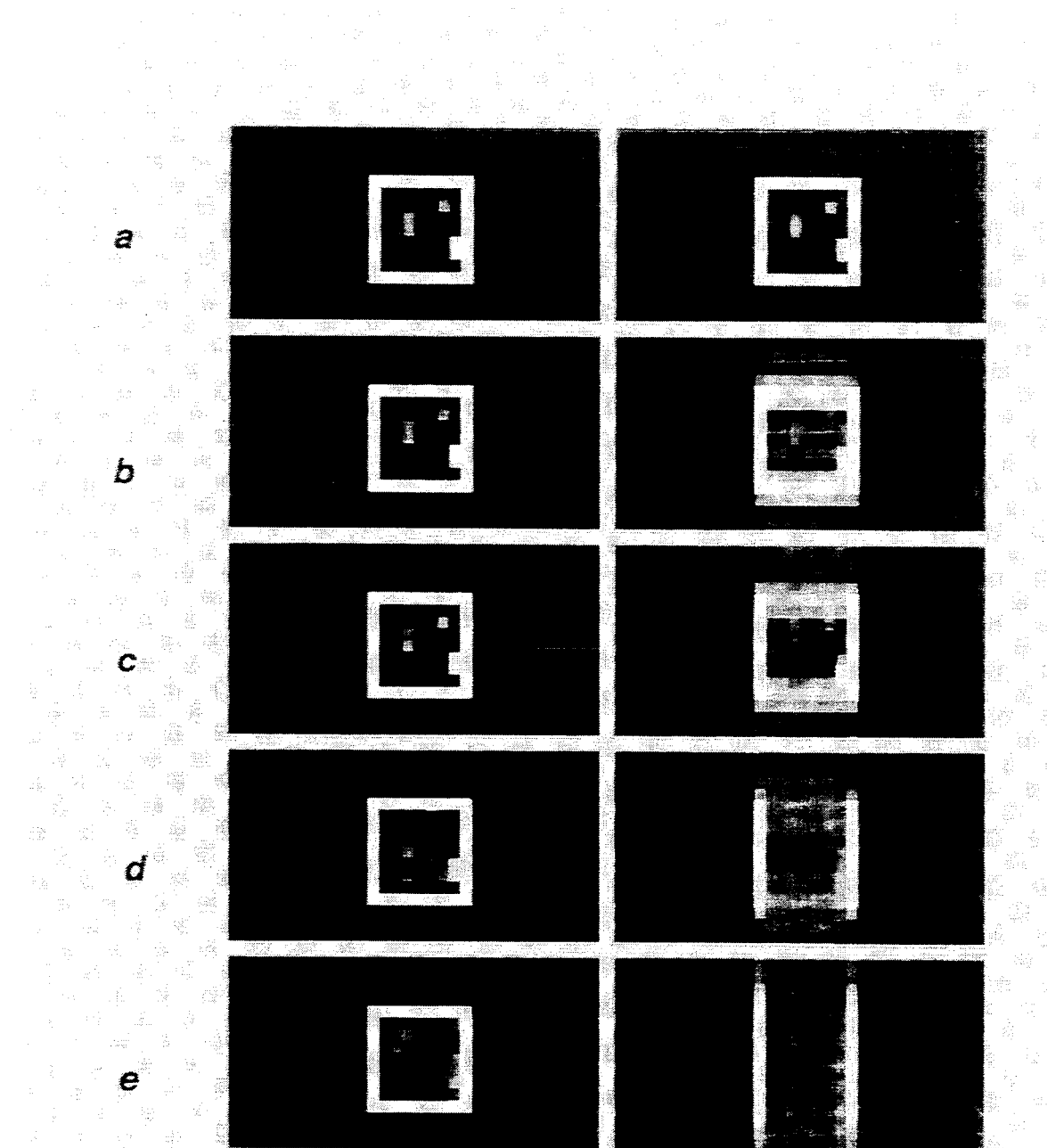
Figure 14:
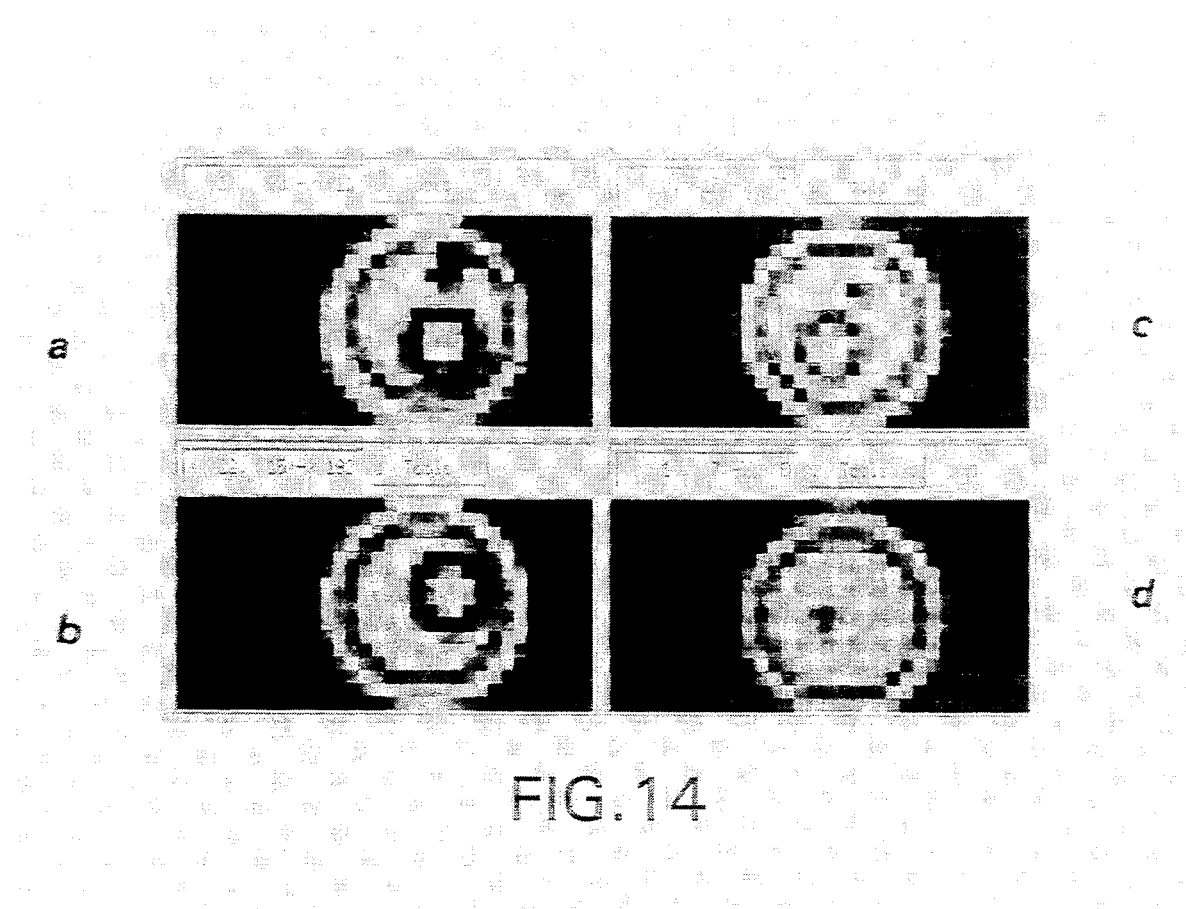
Figure 15:
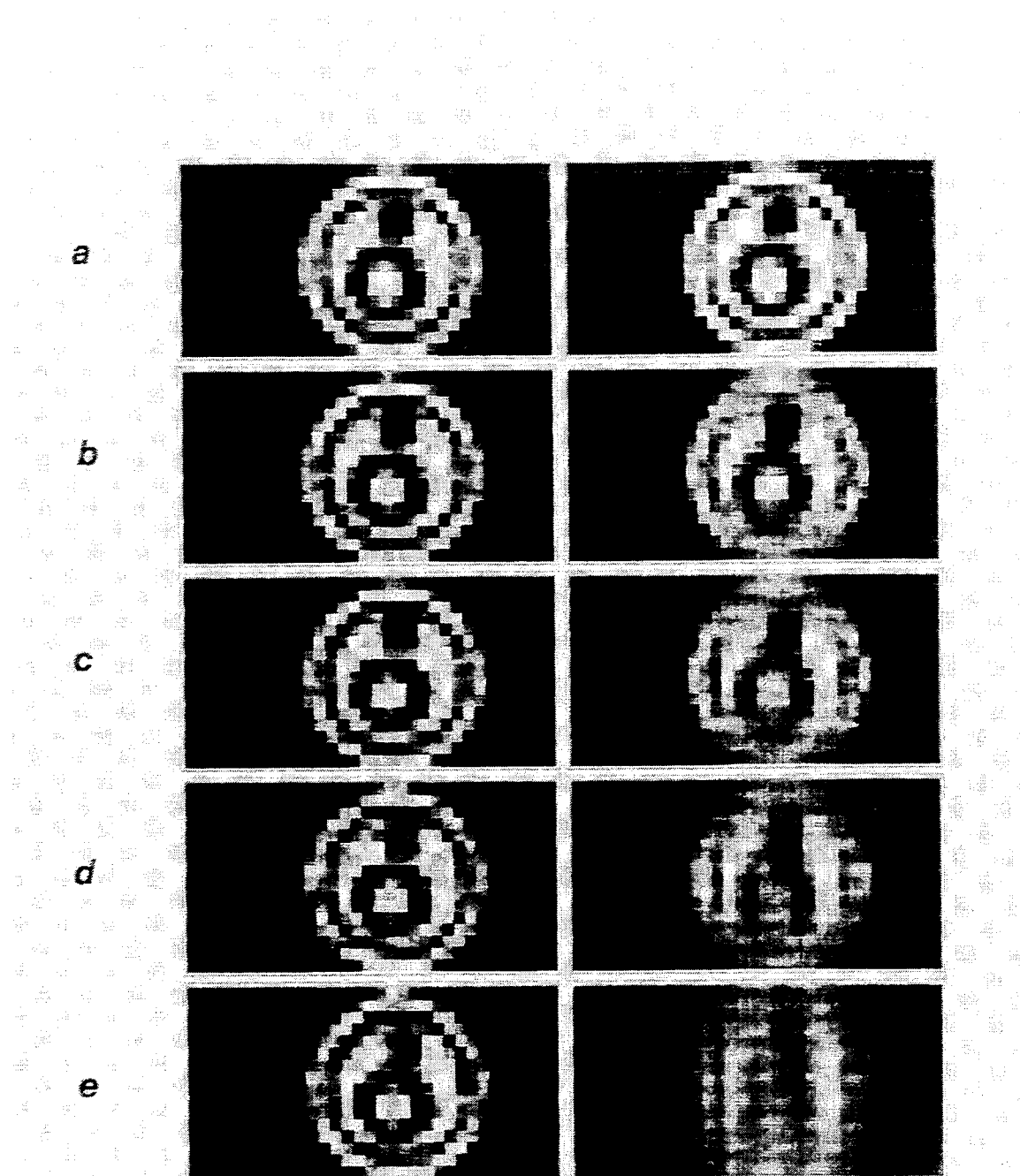
Figure 16:
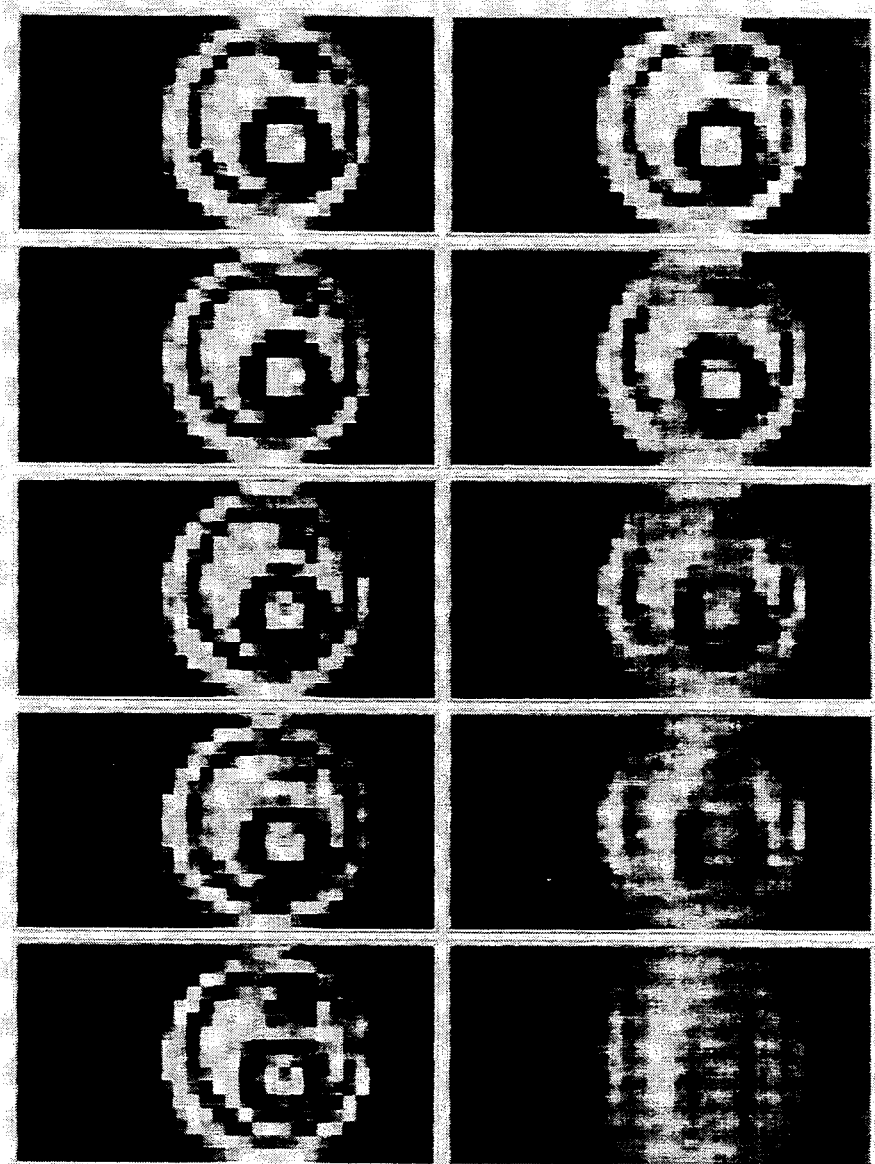
Figure 17:
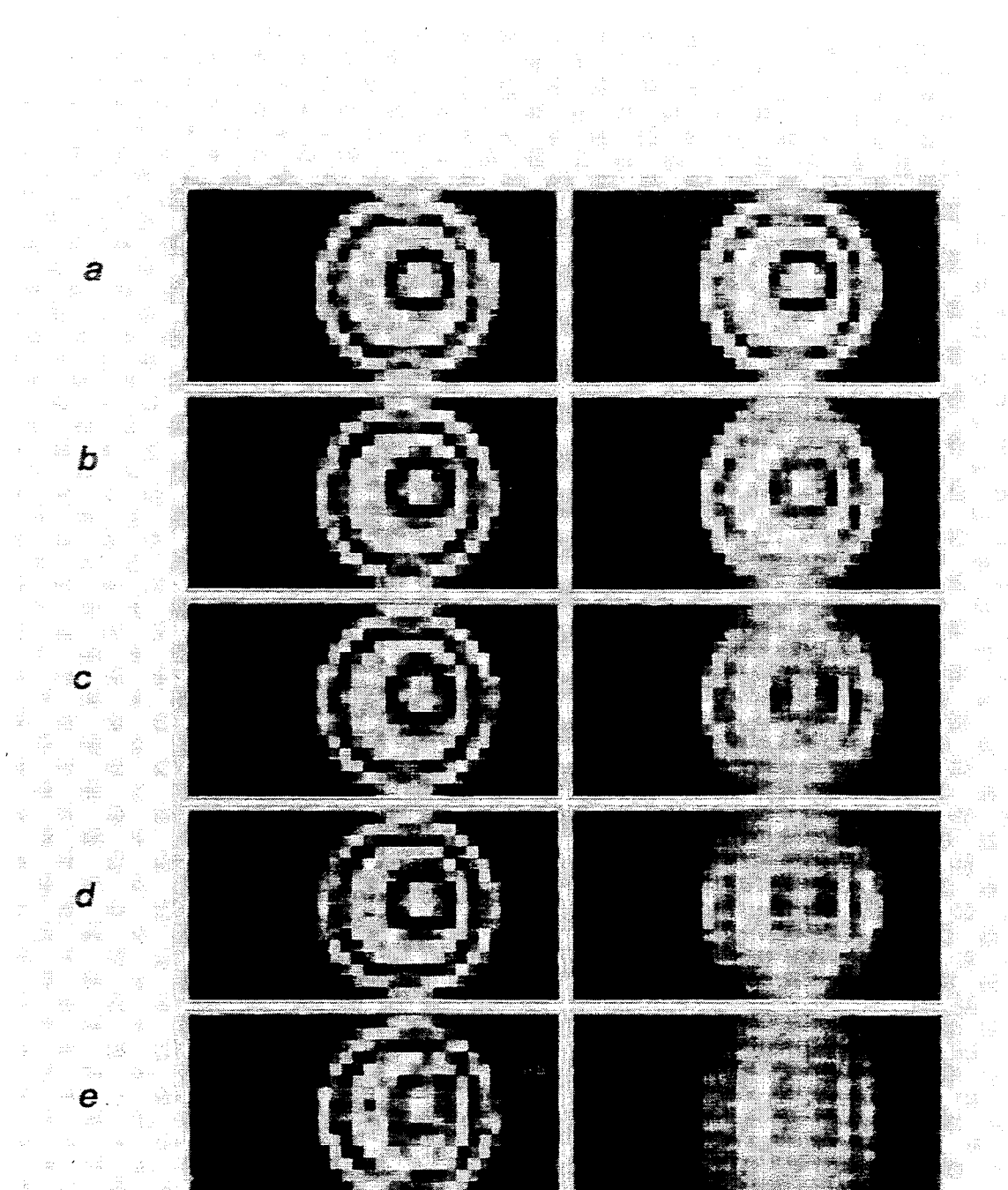
Figure 18:
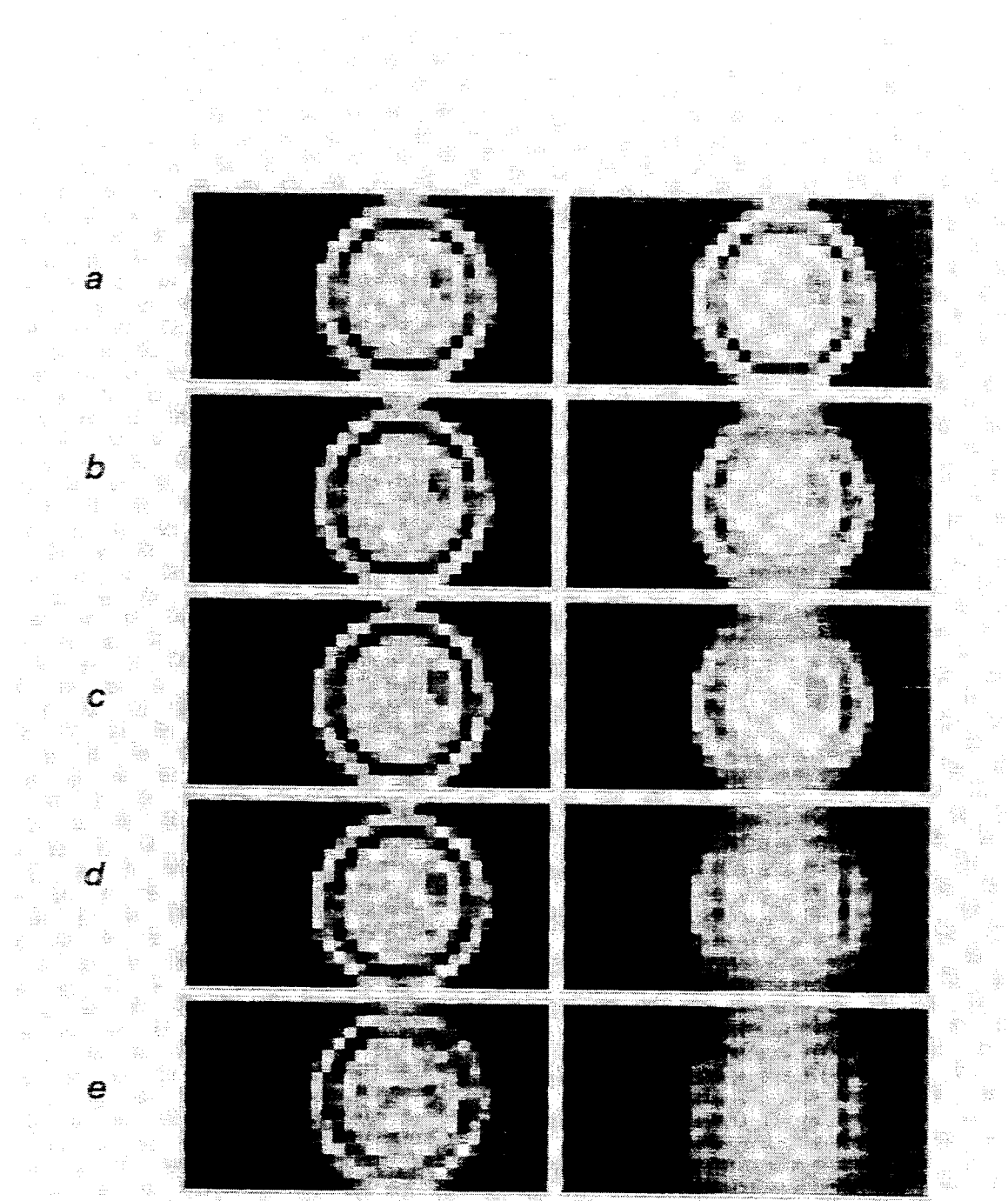

of the training image in FIG. 8 from measured signals with a higher level of noise;

FIG. 12 pictorially illustrates a feature recognition (left) and Fourier transformation reconstructions (right) of an object which was not in the training set of simulated objects;

FIG. 13 pictorially illustrates the feature recognition (left) and Fourier transformation reconstruction (right) of another object which was not in the training set of simulated objects;

FIG. 14 pictorially illustrates typical examples of a set of 44 training images obtained by scanning phantoms in a whole body imager;

FIG. 15 pictorially illustrates the feature recognition (left) and Fourier transformation reconstructions (right) of one of the images in the phantom training set;

FIG. 16 pictorially represents the feature recognition (left) and Fourier transformation reconstructions (right) of another of the images in the phantom training set;

FIG. 17 pictorially represents the feature recognition (left) and Fourier transformation (right) reconstructions of unknown phantom image which did not belong to the set of phantom training images; and FIG. 18 pictorially represents the feature recognition (left) and Fourier transformation reconstructions (right) of another unknown phantom image which did not belong to the set of phantom training images.

DESCRIPTION OF THE PREFERRED EMBODIMENTS

Figure 1A:
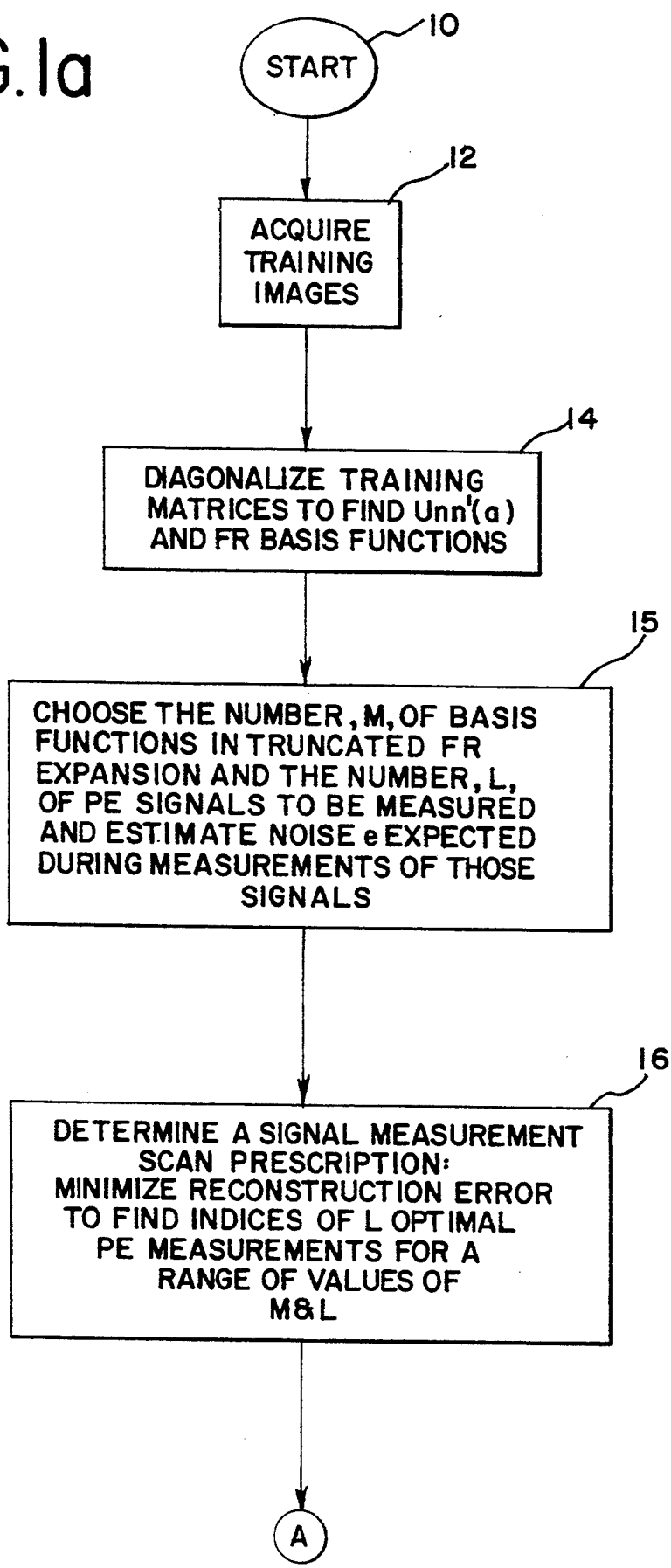
FIGS. 1a and 1b are a flow chart generally depicting the method of obtaining an image of an object in accordance with the invention as applied to magnetic resonance imaging.

Referring to FIGS. 1a-1b and 2a-2f, the method of obtaining an image of an object as particularly applied to an MRI application, begins at block 10 (FIG. 1a). The method of obtaining an image will also be referred to as feature recognizing (FR) imaging. In block 12, a training set is acquired which includes acquiring training signal measurements which represent images of a plurality of training objects having at least one predetermined feature in common with the object. A "training" set includes a large collection of images of objects resembling the objects to be scanned. Each of the images includes training signal measurements which form the training images. These training images are assumed to have spatial resolution and signal-to-noise relationships which are high enough to resolve all significant features in these objects. For example, training images of a brain constitute a collection of high resolution brain images (normal and abnormal). Images can be acquired without having to position objects the way similar objects were positioned during earlier scans as will be explained later.

From a mathematical standpoint, every cross-sectional image corresponds to a function in configuration space or, equivalently, in k-space. Therefore, every image can be represented as a linear combination of any set of orthonormal functions which are complete. Many such complete sets are known. For example, an image might be represented as a sum of products of Fourier functions of Cartesian coordinates (x,y). Alternatively, the same image can be expanded in terms of products of Legendre polynomials and Bessel functions of polar (angular and radial) coordinates, respectively. In actual practice, it is possible to use only a finite number of terms in such a series expansion. Therefore, error will be minimized if the most convergent expansion is used.

The rate of convergence of any image representation depends on the class of objects being considered. For example, if the object is slowly oscillatory in nature, the Fourier series will converge very rapidly. However, if the object has strong edges, the Fourier expansion will converge rather slowly. On the other hand, if the object is nearly rotationally symmetric, an expansion in Legendre polynomials will be more economical since only a few angular harmonics will be needed. In any case, if a given image representation does not converge rapidly for a particular object, use of only a limited number of terms will lead to truncation artifacts (e.g., Gibbs "ringing" of a truncated Fourier series).

As shown in block 14, FR imaging derives a complete set of FR basis functions from the training signal measurements. These FR basis functions may be orthonormal functions which provide the most convergent representation of a given collection of training images. This series expansion represents those training images more accurately than any other series representation of the same length. Any subsequently scanned object, known to resemble the training objects, will then be represented by the optimal basis functions so that truncation artifact is minimized. In general, these basis functions are "custom designed" for each body part; e.g., special "brain basis functions" are derived from the collection of brain training images.

The preferred training images are ordinary 2DFT MR images. Such imaging is performed by measuring phase-encoded (PE) signals (signal measurements) which sample lines in the k-space representation of the image. These sampled points form a Cartesian grid which is centered at the origin of k-space and has a uniform distribution in each direction. The spacing between points is determined by the field of view $D_f$ in the frequency-encoding (FE) direction and by the field of view $D_p$ in the PE direction; specifically, $$\Delta p = \frac{2\pi}{D_f} \quad (1)$$

$$\Delta q = \frac{2\pi}{D_p}.$$

where $\Delta p$ and $\Delta q$ are the intervals between wave vectors of sampled points in the FE and PE directions, respectively. The number of sampled points in the FE direction ($N_f$) and in the PE direction ($N_p$) is determined by the desired resolution along each axis; i.e., $$N_f = \frac{D_f}{\Delta x} \quad (2)$$

$$N_p = \frac{D_p}{\Delta y}$$

where $\Delta x$ and $\Delta y$ are pixel sizes in the FE and PE directions, respectively. The signal $f_n(a)$ with FE index a and PE index n represents a Fourier component of the complex image I (x,y):

$$I(x,y) = \frac{1}{\sqrt{D_f D_p}} \sum_{a=1...N_f} \sum_{n=1...N_p} f_n(a) e^{ipax + iqny} \quad (3)$$

This is the conventional Fourier image of the object; the absolute magnitude of this quantity is usually displayed. Note that, for the purposes of explanation, this Fourier reconstruction is treated as the "exact" image. In other words, the image in Eq. (3), which is produced by Fourier transformation of the "complete" set of $N_p$ PE signals, is the image which the inventive FR imaging method seeks to recover from a subset of those signals.

For any fixed value of FE index a, the array of numbers $f_n(a)$ can be regarded as a complex column vector in an $N_p$-dimensional space. Every vector in that space represents a possible configuration of the image after it has been Fourier transformed with respect to a specific FE wave vector $p_a$. This "image vector space" is spanned by many sets of complete orthonormal unit vectors. $U_{nn'}(a)$ denotes the $n^{th}$ component of the n' basis vector of such a set where n and n' range between 1 and $N_p$. Note that $U_{nn'}$ is a unitary matrix for each value of a. Since these basis vectors span the image space, $f_n(a)$ can be written as a linear combination of these basis vectors:

$$f_n(a) = \sum_{n'=1...N_p} U_{nn'}(a) v_{n'}(a) \tag{4}$$

where $v_n(a)$ denotes the component of the image along the $n^{th}$ unit vector. In order to gain an intuitive understanding of this equation, Eq. (3) will be used to perform a Fourier transformation of both sides $$I(x,y) = \sum_{a=1...N_f} \sum_{n=1...N_p} v_n(a) V_{an}(x,y) \tag{5}$$

where $$V_{an}(x,y) = \frac{1}{\sqrt{D_f D_p}} e^{ipax} \sum_{n'=1...N_p} U_{n'n}(a) e^{iqn'y} \tag{6}$$

The left side of Eq. (5) is the high resolution image which the inventive FR imaging method seeks to recover from a reduced data set: namely, the highly resolved image obtained by Fourier transformation of the full array of PE signals Eq. (3). The right side of Eq. (5) is a decomposition of that image into orthonormal functions $V_{an}(x,y)$, corresponding to unitary combinations of the usual Fourier functions. The non-Fourier functions $V_{an}(x,y)$ can be regarded as a set of "features" which can be superposed to create the desired high resolution image. As $U_{nn'}(a)$ approaches $\delta_{nn'}$, these "features" reduce to the usual oscillatory Fourier functions. For other choices of the $U_{nn'}(a)$, these "features" can be highly localized distributions along the PE direction, although they still have oscillatory behavior along the FE direction.

It has been recognized with the FR imaging method that if the training images bear enough similarity to one another, the training images can be constructed accurately by superposing only a small number of commonly found features; i.e., the FR expansion in Eq. (5) will converge rapidly for the training images. Therefore, where a specific set of such non-Fourier basis functions are known which converge very rapidly to images of a certain class of objects (e.g., brains), these images may be accurately represented by the terms with $n \leq M$ on the right side of Eq. (5), where $M < N_p$; in other words, $v_i(a) \approx 0$ for $i > M$ and all a. These are the basis functions found in block 14. Based on the foregoing, it has been recognized that these images can be recovered from measurements of just L PE signals where $L \geq M$.

In block 15, an operator chooses the number M of basis functions in truncated FR expansion, the number L of phase-encoded signals to be measured and the estimated noise e expected during the measurement of those signals.

In block 16, a signal measurement prescription is formed which specifies which L PE signals should be measured during the scan procedure for the object to be scanned. The FR imaging method employs Eq. (4) to solve for $v_n(a)$ with $n \leq M$ in terms of measurements of $f_k(a)$ for the prescribed L values of k and for all values of a.

In block 18 (FIG. 1b), an operator may choose the values of M and L likely to produce a suitable image. The selected phase-encoded signals are those signals identified in the signal measurement prescription.

In block 20 the signal measurement prescription is carried out by the scanning system to measure the L selected signals from the object. Consequently, the inventive FR imaging method controls the scanning procedure of a data acquisition device to measure the selected signals.

In block 22, unmeasured signals are estimated to complete an array of data (measured signals and estimated unmeasured signals) which is used to reconstruct an image of the object. To estimate unmeasured signals, Eq. (4) is used to estimate the $N_p$-L unmeasured PE signals from the calculated values of $v_n(a)$.

In block 24, the high resolution image is reconstructed by Fourier transformation of the full array of L measured and $N_p$-L estimated PE signals (i.e., Eq. (3)).

For block 14, to find the unique set of basis functions which provide the optimally convergent expansion of a set of training images, first let $\Delta I(x,y)$ be the contribution of the terms with $n > M$ on the right side of Eq. (5):

$$\Delta I(x,y) = \sum_{a=1...N_f} \sum_{i=M+1...N_p} v_i(a) V_{ai}(x,y) \tag{7}$$

Then, the root mean squared error made by truncating the non-Fourier expansion at $n=M$ is proportional to $E_t$ $$E_t^2 = \int_{FOV} dx\,dy |\Delta I(x,y)|^2 = \sum_{a=1...N_f} \sum_{i=M+1...N_p} |v_i(a)|^2 \tag{8}$$

making use of the orthonormality of the non-Fourier functions $V_{ai}(x,y)$. The part of the truncation error due to omission of basis functions with FE index a is $E_t(a)$ where $$E_t(a)^2 = \sum_{i=M+1...N_p} |v_i(a)|^2 \tag{9}$$

$$= \sum_{i=M+1...N_p} \sum_{n,n'=1...N_p} U_{in}(a)^+ f_n(a) f_{n'}(a)^* U_{n'i}(a)$$

and where the inverse of Eq. (4) was used. Let $f_n(a,j)$ be a Fourier component of the $j^{th}$ training image. If all J training images are subjected to truncation of their non-Fourier expansion, the average truncation error will be:

$$<E_t(a)^2> = \sum_{i=M+1...N_p} \sum_{n,n'=1...N_p} U_{in}(a)^+ T_{nn'}(a) U_{n'i}(a) \tag{10}$$

where:

-continued $$T_{nn'}(a) = \frac{1}{J} \sum_{j=1...J} f_n(a,j) f_{n'}(a,j)^* \quad (11)$$

The goal is to choose $U_{nn'}(a)$ (i.e., choose, $V_{an}(x,y)$ via Eq. (6)) to minimize the truncation error in Eq. (10). It can be shown that the "training matrix" $T_{nn'}(a)$ is Hermitian and has real non-negative eigenvalues $\lambda_n(a)$. Therefore, the training matrix can be diagonalized by a unitary transformation so that the diagonal elements (eigenvalues) are in descending order. If $U_{nn'}(a)$ is chosen to be this diagonalizing transformation, Eq. (10) implies:

$$<E_t(a)^2> = \sum_{i=M+1...N_p} \lambda_i(a) \quad (12)$$

In other words, for this choice of $U_{nn'}(a)$ the truncation error is the sum of the $N_p$-M smallest eigenvalues of the training matrix. It is reasonable to expect that any other choice of $U_{nn'}(a)$ will lead to a larger truncation error since Eq. (10) will contain admixed contributions from eigenvectors with larger eigenvalues. In fact, such a result can be proven in a rigorous mathematical fashion: the truncation error in Eq. (10) is minimized if $U_{nn'}(a)$ is chosen to be the unitary matrix which diagonalizes $T_{nn'}(a)$ as is well known in pattern recognition literature where it is called principal components analysis or the Karhunen-Loeve Theorem. One such proof can be found in T. Y. Young and T. W. Calvert's book entitled, "Classification, Estimation, and Pattern Recognition", American Elsevier, New York, 1974.

The basis functions $V_{an}(x,y)$, which minimize the truncation error given by Eq. (8), are related to the optimal form of $U_{nn'}(a)$ by Eq. (6). These new basis functions represent "features" in the training images and, therefore, are referred to herein as Feature Recognizing (FR) basis functions. The magnitude of the eigenvalue associated with each FR basis function reflects how frequently and strongly that feature appears in the training images. To illustrate note that $$\lambda_n(a) = \sum_{n',n''=1...N_p} U_{nn'}(a)^+ T_{n'n''}(a) U_{n''n}(a) = \quad (13)$$

$$\frac{1}{J} \sum_{J=1}^{J} \left| \int_{FOV} dxdy \, I_j(x,y) V_{an}(x,y)^* \right|^2$$

where $I_j(x,y)$ is the $j^{th}$ training image and where Eqs. (11), (6), and (3) are used. In other words, $\lambda_n(a)$ is the average squared projection of the training images onto $V_{an}(x,y)$. Therefore, an FR basis function $V_{an}(x,y)$ with a high index n and any index a (and low value of $\lambda_n(a)$) corresponds to a relatively low amplitude component and/or rare component of the training images. For example, if the training set is a representative collection of brain images, the $V_{an}(x,y)$ for large n will be primarily distributed in areas where the training images vanish (e.g. air-filled areas at the periphery of the FOV). By omitting such functions from the series expansion in Eq. (5), the image reconstruction is being constrained to be zero in regions where all the training images vanish. For small n $V_{an}(x,y)$ is associated with a large eigenvalue $\lambda_n(a)$ and, therefore, represents a feature (or collection of features) which has high amplitude and/or is common in the training images. For example, such FR basis functions should describe the approximate configurations of the scalp, brain surface, and ventricles which are nearly universal features of head images. Therefore, images, which are reconstructed from just the first few terms in Eq. (5), will display these structures in recognizable form.

The inventive method offers an advantage since, the derivation of the FR basis functions is a pre-processing step which need only be done once for each set of training images. Thereafter, images of other scanned objects can be reconstructed instantly by linear transformations of the signals, as will be described later. Where it desired to use reduced data sets to recover 256×256 images, the training images should be acquired with that resolution: i.e., 256 PE signals should be measured, each sampled 256 times in the presence of a FE gradient. The 256×256 training matrix $T_{nn'}(a)$ for each FE index a is then derived by summing the data in dyadic form (Eq. (11)). Thus, all of the training data, which may represent hundreds or even thousands of scans, is "lumped together" in 256 training matrices, each of which requires the storage space of an ordinary 256×256 complex image. The unitary transformations $U_{nn'}(a)$ are calculated, which diagonalize the training matrices and which lead to the FR basis functions $V_{an}(x,y)$ in Eq. (6). It is practical to perform this pattern analysis procedure on a relatively modest computer since it only has to be done once for each training set.

Figure 2A:
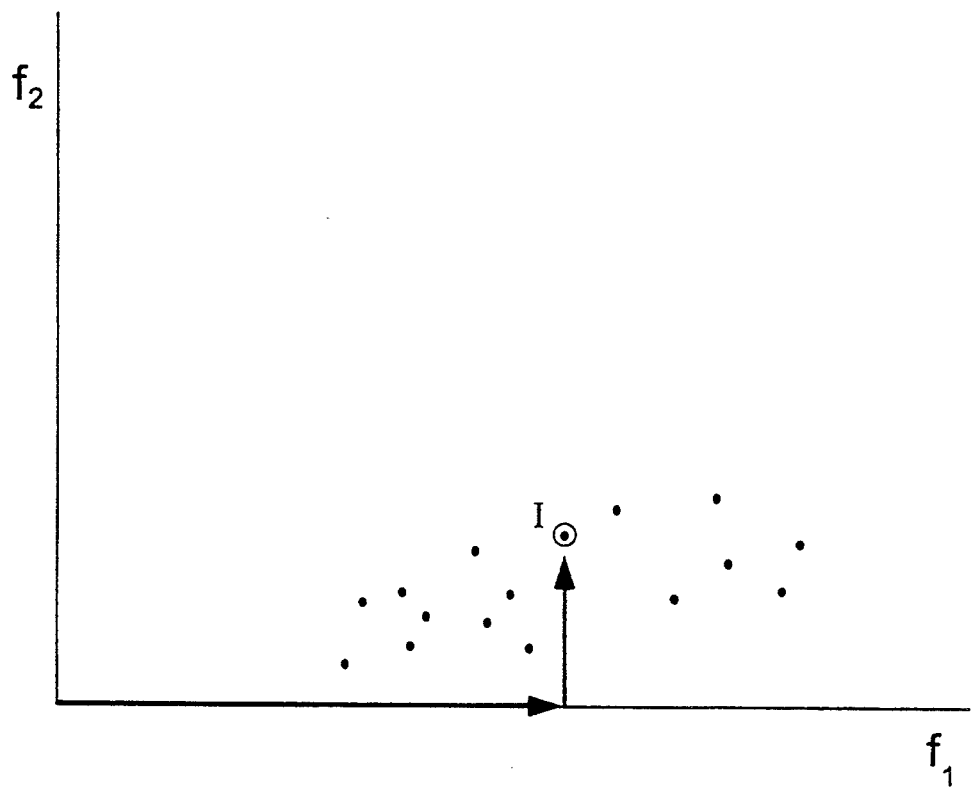
FIG. 2a is a graphical representation of the vector space of images with $N_p = 2$ wherein each dot denotes a training image which is associated with a vector extending from the origin to the dot.
Figure 2B:
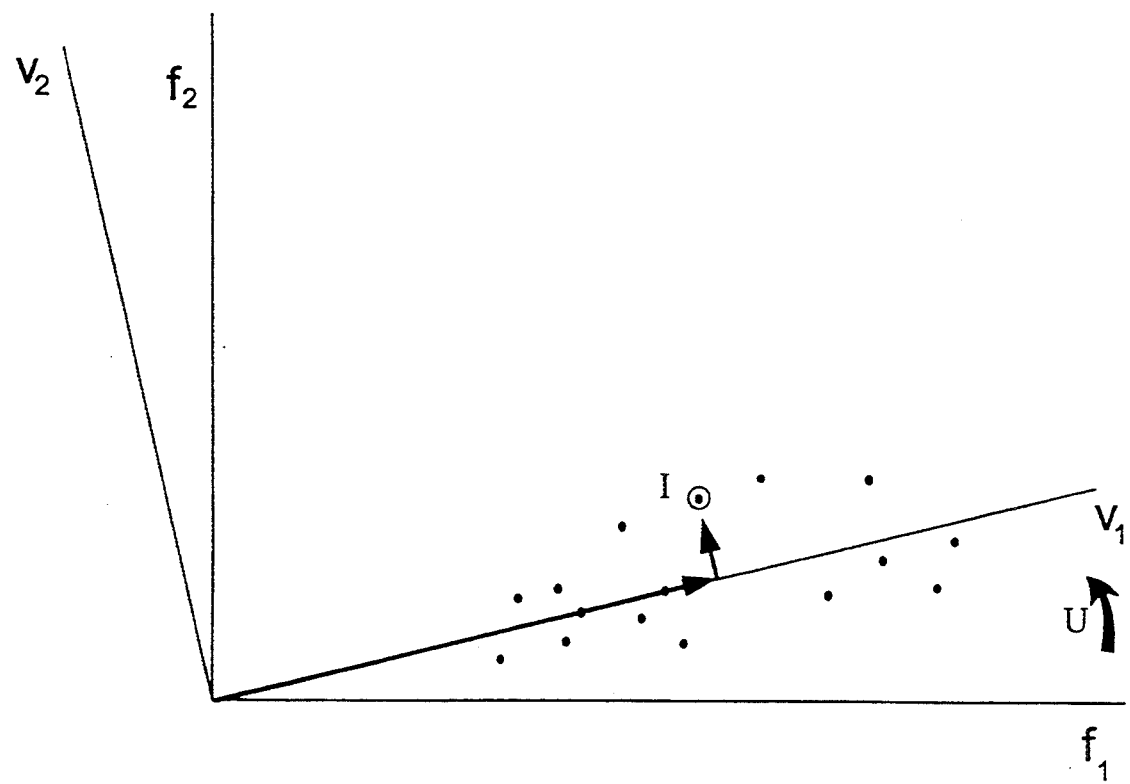

FIGS. 2a and 2b illustrate the image space picture of the Fourier and FR image representations. FIG. 2a illustrates the vector space of images with $N_p=2$; i.e., images with just two Fourier components, $f_1$ and $f_2$. Each dot denotes a training image which is associated with a vector extending from the origin to the dot. The encircled image, labeled I, has the Fourier decomposition represented by the two arrows. In this "geometric" picture of "image space" each image corresponds to a "vector," which can be represented by $f_n(a)$ in the coordinate system defined by the usual Fourier components.

Alternatively, the image can be represented by $v_n(a)$ in the coordinate system defined by the image components $V_{an}(x,y)$ as seen in FIG. 2b. In FIG. 2b, the $v_1$ and $v_2$ axes denote the FR coordinate system which is derived by applying a unitary transformation U to the Fourier coordinate system. The first FR axis $v_1$ is oriented so that it best fits the cluster of training images. This axis corresponds to the training set hyperplane for M=1.

The arrows denote the FR decomposition of the encircled image, labeled I.

As shown in Eq. (4), these two coordinate systems are "tilted" with respect to each other by a unitary "rotation." Because of their similarity to one another, the training images are clustered together in image space, and this cluster determines a series of directions, along which the training images have components with sharply decreasing average size $\sqrt{\lambda_n(a)}$. These directions define a "canonical" coordinate system of the training set, tilted with respect to the Fourier system by the unitary transformation which diagonalizes the training matrix. The FR coordinate system is chosen to coincide with this canonical system. If $N_p$-M dimensions of the training set cluster are small, the training images will have small FR components along those directions. The training image or similar image will typically lie in or near the subspace ("hyperplane") defined by the other M FR axes. Then, the image can be approximated by the first M FR components; i.e., by the truncated version of Eq. (5).

Since the FR coordinate system may be tilted by large angles with respect to the Fourier system, the M-dimensional hyperplane of training images may lie far from the hyperplane defined by the first M Fourier components. Thus, the first M Fourier components may produce an image which is a poor approximation of a training image; i.e., it may have more truncation artifact than the image reconstructed from the first M FR components.

Referring to block 22, the estimation process may be understood by assuming that the FR expansion in Eq. (4) is truncated after M terms. Then the M unknown coefficients $v_m(a)$ can be calculated from any set of L PE signals $f_k(a)$ where $L \geq M$ and k takes on L values denoted by {L}. Although L can always be chosen to be equal to M, it may be advantageous to measure an over-determined set of PE signals (i.e., $L > M$) so that the calculation of $v_m(a)$ will benefit from some signal averaging. The $v_m(a)$ are given by the least squares solution of Eq. (4)

$$v_m(a) = \sum_{k \in \{L\}} [(R(a)^+R(a))^{-1}R(a)^+]_{mk} f_k(a) \quad (14)$$

$$m = 1 \ldots M$$

here $R_{km}(a)$ is an $L \times M$ matrix with elements $R_{km}(a) = U_{km}(a)$ for $m = 1 \ldots M$ and $k \in \{L\}$. This can be substituted back into Eq. (4) to estimate the $N_p$-L unmeasured PE signals:

$$f_h(a) = \sum_{k \in \{L\}} [Q(a)(R(a)^+R(a))^{-1}R(a)^+]_{hk} f_k(a) \quad (15)$$

$$h \notin \{L\}$$

where $Q_{hm}(a)$ is the $(N_p-L) \times M$ matrix with elements $Q_{hm}(a) = U_{hm}(a)$ for $m = 1 \ldots M$ and $h \notin \{L\}$. Finally, as shown in block 24 (FIG. 1b), the image can be reconstructed by conventional Fourier transformation (Eq. (3)) of the L measured PE signals and the $N_p$-L estimated PE signals in Eq. (15). The FR imaging method is then completed for the object of interest as shown in block 26.

With respect to the reconstruction step in block 24, for the case L=M, the same image can be produced by simply substituting Eq. (14) into Eq. (5) to calculate the image directly from the FR representation. If $L > M$, the M $v_m(a)$ are derived by a least squares fit to an over-determined set of measurements. In that case, direct substitution of Eq. (14) into Eq. (5) will produce an image with Fourier components not exactly equal to the input of measurements. Therefore, it is preferable to use a Fourier reconstruction formula (Eq. (3)) so that the L measured signals can be used directly along with FR estimates of the $N_p$-L unmeasured signals (Eq. (15)). Because of truncation-induced errors in these FR estimates, there may be discontinuities where measured and estimated PE signals lie next to one another in k-space. It might be advantageous to smooth out these discontinuities by taking weighted averages of signals on either side of such an interface or use some other type of suitable filtering.

The FR image reconstruction process has the following meaning in terms of the "geometry" of image space. The L PE signal measurements $f_k(a)$ determine the projection of the image on L axes of the Fourier coordinate system. The image is assumed to be well-described by the truncated FR expansion, i.e., to lie in or near the M-dimensional hyperplane which contains most of the training images. Eq. (14) represents an estimate of the image's position in that hyperplane, obtained by a least squares fitted "back-projection" of the measured Fourier components onto that subspace. The unmeasured Fourier components of the image are estimated by projecting this approximate image vector onto the appropriate Fourier axes (Eq. (15)).

Where the FR expansion is truncated at the $M^{th}$ term, the image can be reconstructed from L measured PE signals where $L \geq M$. From previous experience with the FR method, the operator determines (block 15) the number of FR basis functions M and the number of PE signal measurements L which are likely to lead to an accurate image reconstruction. Although any set of L signals can be used to create an image, different measurement sets may lead to more or less error than others. In general, the optimal measurements producing the least reconstruction error correspond to PE signals scattered non-uniformly in k-space. The following description explains how the computer determines, in block 16, the identity of the optimal L PE measurements.

With respect to errors due to noise, assume that the PE signal measurements are affected by noise which has the following realistic properties: (1) The average value of many measurements of noise is zero: $\overline{e_n} = 0$ where $\overline{e_n(a)}$ is the noise encountered when $f_n(a)$ is measured; (2) There is no average correlation between noise in different PE and FE "channels": $\overline{e_n(a)^* e_{n'}(a')} = 0$ for $n \neq n'$ and $a \neq a'$; (3) The mean squared noise is channel-independent: $\overline{e_n(a)^* e_n(a)} = e^2$. For any choice of indices {L} of the measured signals, let $\delta I(x,y)$ be the difference between the "exact" image and the FR reconstruction, and let $E_r$ be proportional to the root mean squared error in the reconstructed image:

$$E_r^2 = \int_{FOV} dxdy |\delta I(x,y)|^2 \quad (16)$$

It follows from Eqs. (3) and (15) that $$E_r^2 = \sum_{a=1\ldots N_f} \sum_{k \in \{L\}} |e_k(a)|^2 + \sum_{a=1\ldots N_f} \sum_{h \notin \{L\}} \left| f_h(a) - \sum_{k \in \{L\}} [Q(a)(R(a)^+R(a))^{-1}R(a)^+]_{hk} [f_k(a) + e_k(a)] \right|^2 \quad (17)$$

During multiple measurements and reconstructions of this image, the average reconstruction error will be $$E_r^2 = N_f L e^2 + e^2 \sum_{a=1\ldots N_f} Tr[(Q^+(a)Q(a))(R^+(a)R(a))^{-1}] + \sum_{a=1\ldots N_f} Tr[W(a)F(a)W(a)^+] \quad (18)$$

where $F_{nn'}(a)$ is an $N_p \times N_p$ dyadic matrix of image "vectors":

$$F_{nn'}(a) = f_n(a) f_{n'}(a)^* \quad (12)$$

and $W_{hn}(a)$ is an $(N_p-L) \times N_p$ matrix $$W_{hk}(a) = -[Q(a)(R(a)+R(a))^{-1}R(a)+]_{hk} \quad (20)$$

for $h \notin \{L\}, k \in \{L\}$ $$W_{hh'}(a) = \delta_{hh'} \text{ for } h \notin \{L\}, h' \notin \{L\}$$

The properties of the noise which imply the vanishing of various "cross terms" involving $e_n(a)$ were used in deriving Eq. (18).

Determining a signal measurement prescription, block 16, is accomplished in part by finding indices of optimal phase-encoding measurements which minimize average error. Eq. (18) describes the average error that would be encountered during multiple FR reconstructions of a single image from noisy measurements. The size of the average error for a typical image is estimated by calculating the amount of error in recovering the training images from just L PE signals with similar noise e. It follows from Eq. (18) that the FR reconstruction error, averaged over the entire training set, is:

$$<E_r^2> = N_f L e^2 + e^2 \sum_{a=1...N_f} Tr[(Q^+(a)Q(a))(R^+(a)R(a))^{-1}] + \sum_{a=1...N_f} Tr[W(a)T(a)W(a)^+] \quad (21)$$

where T is the training matrix given by Eq. (11). The right side of Eq. (21) depends on which L signals are measured since the matrices Q, R, and W are influenced by the choice of PE indices $\{L\}$. The FR method will be most accurate if the measured phase encodings $\{L\}$ are chosen so that the expression in Eq. (21) is minimal or at least relatively small.

The first term in Eq. (21), which is independent of the choice of measurements, is simply due to the noise in the L measured PE signals. That noise also propagates through Eq. (15) into the estimated PE signals, giving rise to the second term in Eq. (21) which is influenced by the choice of measurement indices $\{L\}$. This noise-induced error would be present even if there were no truncation error, i.e., even if there were no error due to the fact that terms with $n>M$ in Eq. (5) were omitted. The third term represents the error in the FR estimates of the missing PE signals due to truncation of the FR expansion. This error would be present even in the absence of noise and is due primarily to two mechanisms: (1) The reconstructed image did not include contributions from terms with $n>M$ in Eq. (5); (2) The estimates of the leading terms in Eq. (5) (i.e., $v_n(a)$ for $n \leq M$) may be erroneous since they are based on solving truncated versions of exact equations, Eq. (4). The first type of truncation error is independent of which L PE signals are measured. However, the second type of truncation error is influenced by that choice of measurements as is the noise-induced error represented by the second term in Eq. (21). For example, by considering the "image space geometry" of the FR method, the measured signals correspond to a point in a "measurement" subspace or hyperplane, defined by the L measured Fourier components of the image. The FR approximation of the image lies in the "FR model" hyperplane which nearly contains all training images. Image reconstruction is done by back-projecting the measured Fourier components onto that hyperplane (Eq. (14)). In the absence of noise, the line of back-projection passes from the experimentally determined point in the measurement hyperplane through the unknown image point which may lie slightly outside the "FR model" hyperplane.

If the measurement hyperplane is chosen to make small angles with the model hyperplane, the line of back-projection will be nearly perpendicular to the model hyperplane, and will intersect that hyperplane approximate to the location of the unknown image's actual component in that subspace. Therefore, this component will be determined accurately, and the second type of truncation error described above will be small. Furthermore, the noise in the signal measurements will not be greatly amplified since these measurements are back-projected almost orthogonally onto the FR model subspace. This means that the second term in Eq. (21) will also be small.

Figure 2C:
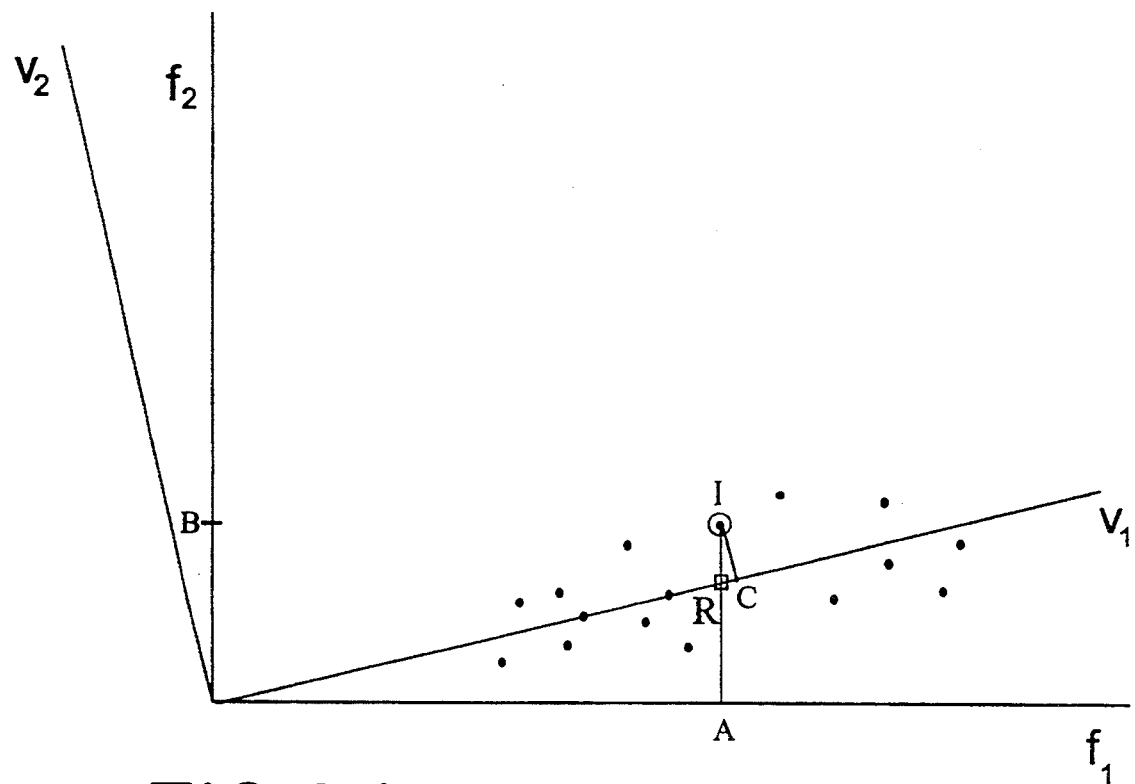
FIG. 2c graphically depicts the feature recognition reconstruction of an image from one noiseless phase-encoded signal.

FIG. 2c illustrates the FR reconstruction of an image I (encircled) from one noiseless PE signal $f_1$. The reconstructed image (the square labeled R) is located in the training set hyperplane at the point which corresponds to the measured value (A) of the PE signal. The line segments CI and RC correspond to truncation errors of the first and second kind, respectively. The points A and B represent the conventional FT reconstruction of the image from one PE signal.

Figure 2D:
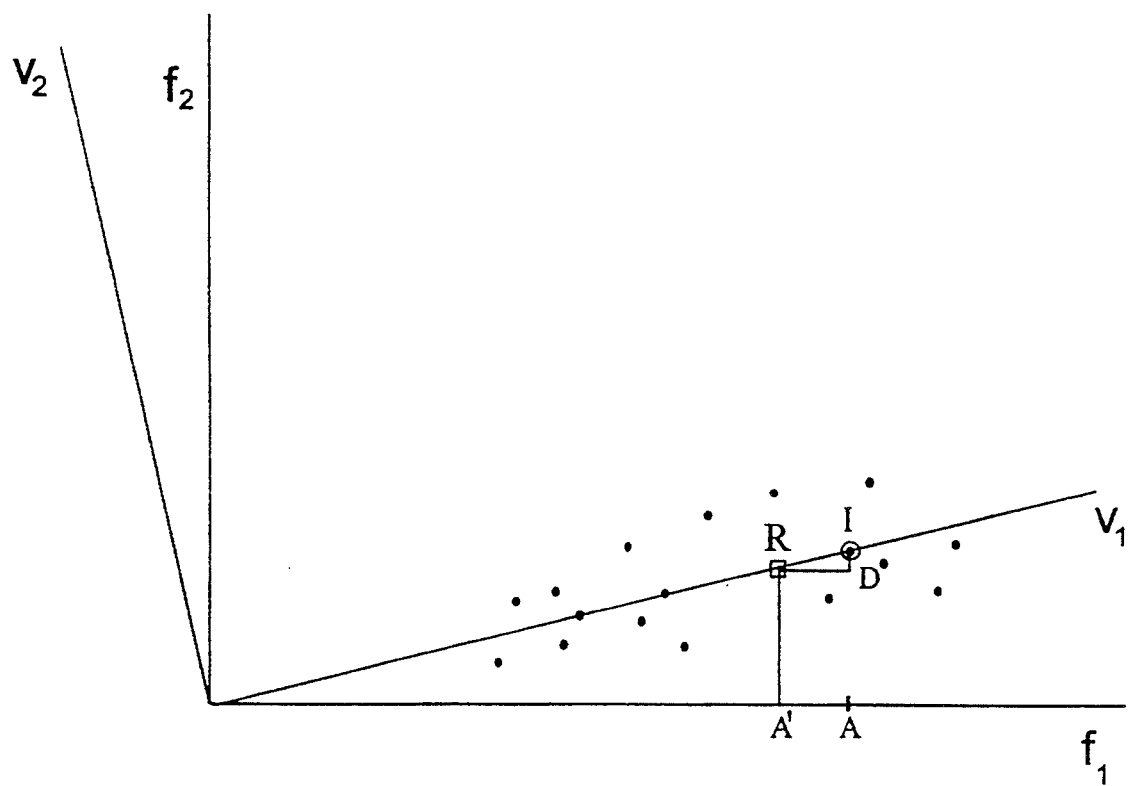
FIG. 2d graphically depicts the feature recognition reconstruction of an image from noisy measurements from one phase-encoded signal.

FIG. 2d shows the FR reconstruction of an image I (encircled) from noisy measurements of one PE signal $f_1$. There is no truncation error since the image happens to lie in the training set hyperplane. The reconstructed image R (square) is located in the training set hyperplane at the point corresponding to the noisy measurement (A') of the PE signal. The line segments RD and DI represent errors due to directly measured noise and propagated noise, respectively.

Figure 2E:
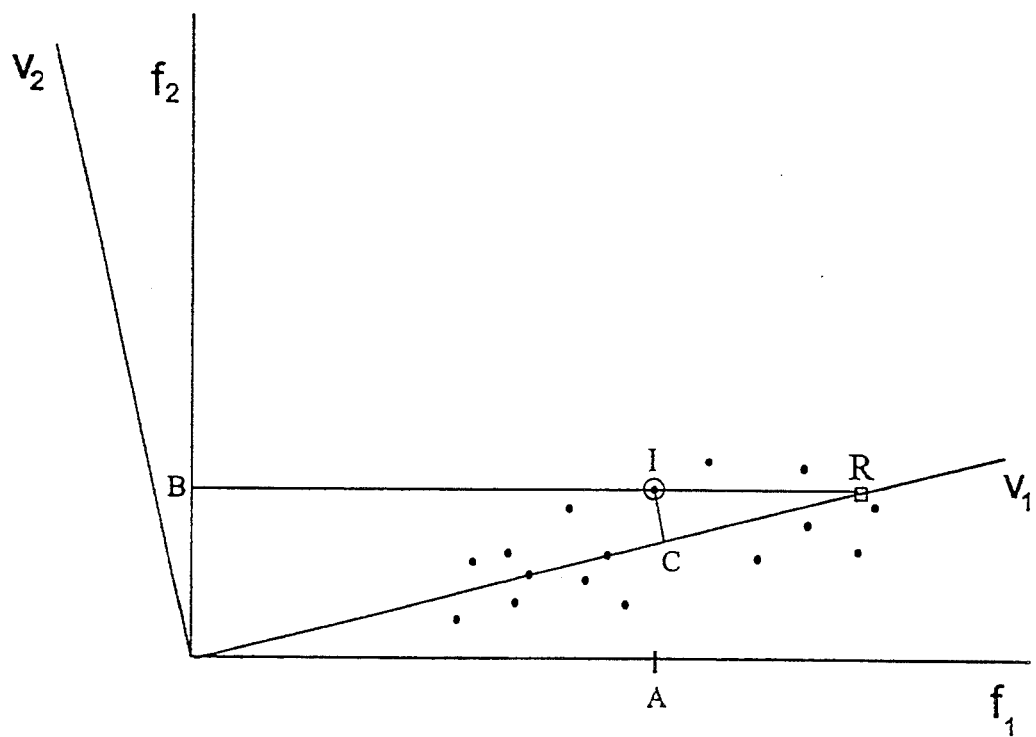
FIG. 2e graphically depicts the feature recognition reconstruction of the image in FIG. 2c from noiseless measurements of the other phase-encoded signal.

FIG. 2e shows the FR reconstruction (R) of the image (I) of FIG. 2c from noiseless measurements (B) of the other PE signal. The truncation error of the first kind (line segment CI) is the same as in FIG. 2c, but the truncation error of the second kind (line segment RC) is larger. Therefore, the first Fourier axis is the optimal measurement hyperplane since it is more parallel to the training set hyperplane and produces less truncation artifact of the second kind.

Figure 2F:
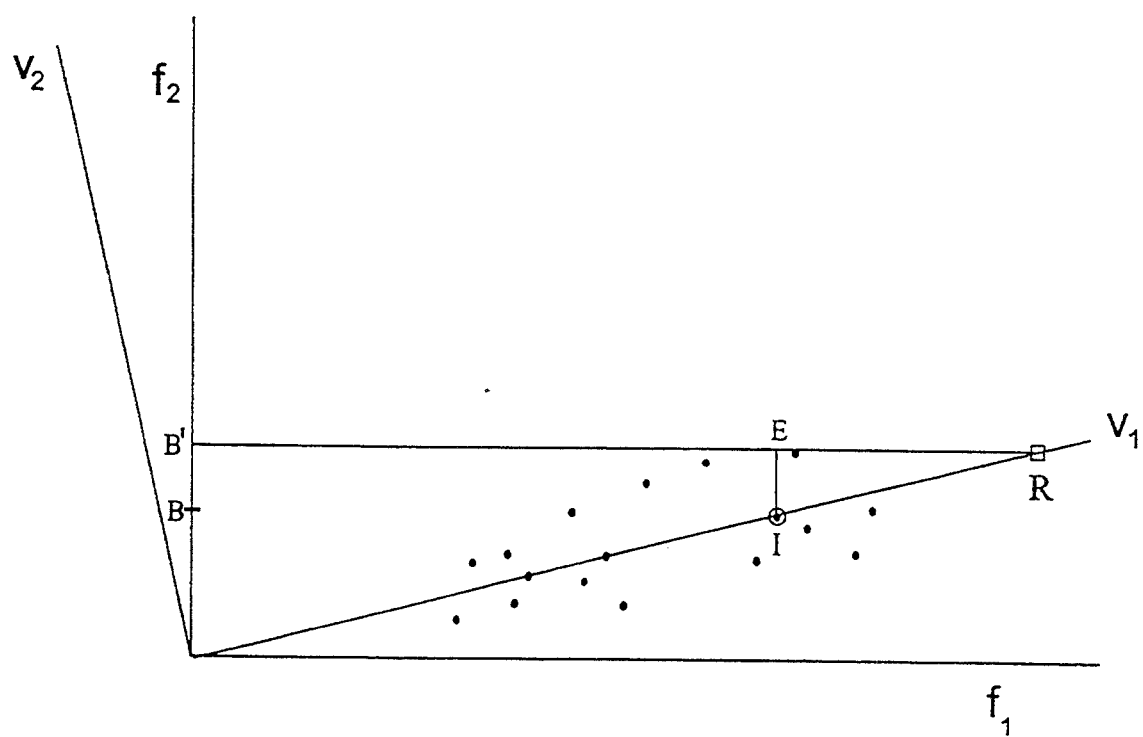
FIG. 2f graphically depicts the feature recognition reconstruction of the image of FIG. 2d from noisy measurements of the other phase-encoded signal.

FIG. 2f shows the FR reconstruction (R) of the image (I) in FIG. 2d from noisy measurements (B') of the other PE signal. The error due to directly measured noise (line segment EI) is unchanged, but the error due to propagated noise (line segment RE) is much larger. Therefore, the first Fourier axis is the optimal measurement hyperplane since it is more parallel to the training set hyperplane and produces less error due to propagated noise.

As shown in FIGS. 2e and 2f, if the measurement and model hyperplanes are oriented at large angles, the measured signals will be back-projected at an acute angle relative to the FR model subspace. Then, noise will be amplified during the back-projection process, and even small displacements of the image from the model hyperplane will cause large errors in the estimated component of the image in the model hyperplane. In this case, the second and third terms in Eq. (21) will be large. Therefore, the PE measurements which minimize the total reconstruction error $<\bar{E}_r^2>$ correspond to the measurement hyperplane which makes the smallest angle with the model hyperplane.

The conventional Fourier transform (FT) method of image reconstruction is based on the assumption that the image is well described by a truncated Fourier series. For example, it is assumed that the image has negligible Fourier components with n>M. This leads to truncation error in the form of Gibbs "ringing" which causes loss of spatial resolution. False negative diagnoses can result when small structures are obscured by "ringing" emanating from strong edges. False positive diagnoses can occur when partial volume averaging blurs small sharply defined structures into "masses" or when "ringing" simulates a linear abnormality (e.g., a syrinx in the spinal cord). In order to decrease these truncation artifacts, it is necessary to increase M. This means that imaging time must be increased so that more PE signals can be measured in the center of k-space. The minimum acceptable value of M depends on the class of objects being imaged.

For example, if it is necessary to detect small abnormalities in the vicinity of strong edges (e.g., microadenomas in the pituitary), a high resolution technique (i.e. high M) is necessary. However, if one is primarily concerned about large abnormalities in a relatively homogenous organ (e.g., tumors in the liver), then low resolution (i.e., low M) is adequate. If additional imaging time is available after M signals have been acquired, it can be used to increase image contrast-to-noise ratio so that low contrast structures can be detected. The most efficient way to do this is to acquire additional phase-encodings with $n \leq M$ so that signal averaging can be done. It would be a waste of time to acquire additional measurements with n>M since these data are "signal poor".

The practical application of any MR imaging technique involves a "trade-off" between imaging time and image quality (i.e., spatial resolution and contrast-to-noise ratio). It should be emphasized that with method of FT imaging, the imager's choices of M and the amount of signal averaging are based on his judgement of how much resolution and contrast-to-noise are needed in a particular imaging situation. Ultimately, these choices are based on assumptions about the sizes, edge strengths, and contrasts levels of the imaged structures. In other words, the correct application of the conventional FT technique involves an implicit assumption that the object being scanned belongs to a class of familiar objects with certain geometric and contrast characteristics. If the scanned object does not belong to this constrained class, inaccurate images will result. In many cases, this unfortunate situation can be recognized by the presence of image artifacts; then, the subject can be imaged again with a more appropriate technique (e.g., higher M).

It will be noted that the FR image may be degraded by noise-induced error which propagates into the estimated $N_p$-M PE signals; i.e., the second term in Eq. (21). There is no analogous effect in ordinary Fourier reconstruction. However, as previously discussed, this term will be small if the measured phase-encodings are chosen appropriately; i.e., if the measurement hyperplane makes small angles with the hyperplane of the training images. Both FR and FT images will be affected by the first type of truncation error contributing to the third term in Eq. (21); i.e., the omission of terms with n>M in the FR and FT expansions of the image. This error may be less using the FR method since the FR expansion is designed to minimize this effect (i.e., to minimize the right side of Eq. (8)). Finally, the FR method encounters the second type of truncation error contained in the third term in Eq. (21); i.e., the estimates of the first M terms in the FR expansion are inexact since they are based on solving truncated versions of exact equations, Eq. (4). As shown in FIG. 2c, this effect will be small if the first type of truncation error is small (i.e. if the training images are "clustered" near a hyperplane in the image space) and if the measured phase-encodings are chosen appropriately (i.e., the measurement hyperplane is nearly parallel to the FR model hyperplane).

In general, the conventional Fourier expansion is not well suited for representing objects with strong edges; such edges contribute large components which decrease slowly with k (like 1/k) and cause slow convergence of the Fourier series. In the image space picture this means that the image vectors are oriented at relatively large angles with respect to the M-dimensional subspace defined by the M Fourier components in the center of k-space. In other words, the other $N_p$-M components (i.e., higher k components) are large and cannot be ignored. As long as such images are clustered in or near a tilted M-dimensional hyperplane (i.e., as long as they are "similar to each other), they will be well-described by the first M terms of the FR expansion corresponding to that hyperplane.

Therefore, the FR expansion can be truncated at a smaller M and still have an acceptably small truncation error. In other words, an acceptable FR image can be produced from fewer PE signal measurements, obtained in less imaging time. Thus, the FR method can create a more favorable trade-off between imaging time and spatial resolution: high resolution images can be produced in less time, or higher resolution images can be produced in the same time. It is possible that the FR images will be noisier since they may be degraded by propagated noise (the second term in Eq. (21)) which is not present using conventional FT method images. However, propagated noise tends to be minimal in known scanners.

In summary just as in the Fourier case, the FR method is based on the assumption that the scanned object resembles a certain class of familiar objects. In Fourier MRI, the imager implicitly assumes that the scanned object has certain poorly specified size, edge strength, and contrast characteristics. This information is then used to design an appropriate imaging technique. In the FR case, the imager explicitly assumes that the scanned object resembles a precisely specified set of training images. Then, the FR method automatically extracts all of the important features of those objects and uses this information to design an optimal image acquisition and reconstruction technique. If the FR or FT method is used to scan an object which does not have the assumed characteristics, truncation artifacts can result. In either approach, these artifacts can be recognized as the consequences of an inappropriate imaging technique. Then, the subject can be imaged again with different scanning parameters.

Figure 3:
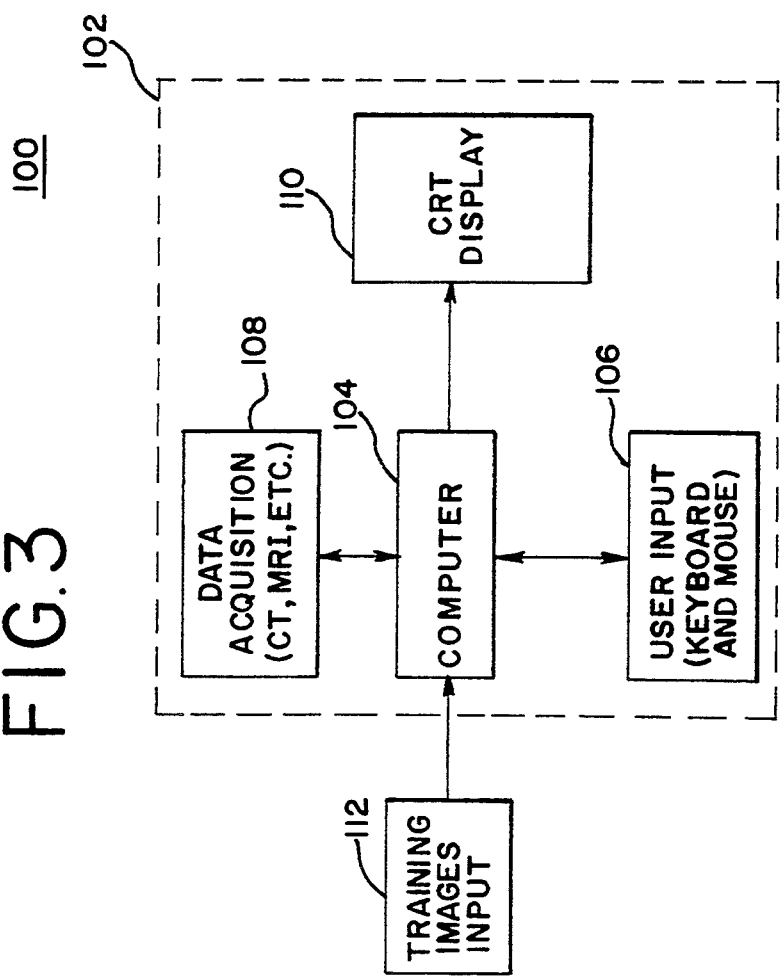
FIG. 3 is a block diagram of the apparatus for obtaining an image of an object in accordance with the invention.
Figure 1B:
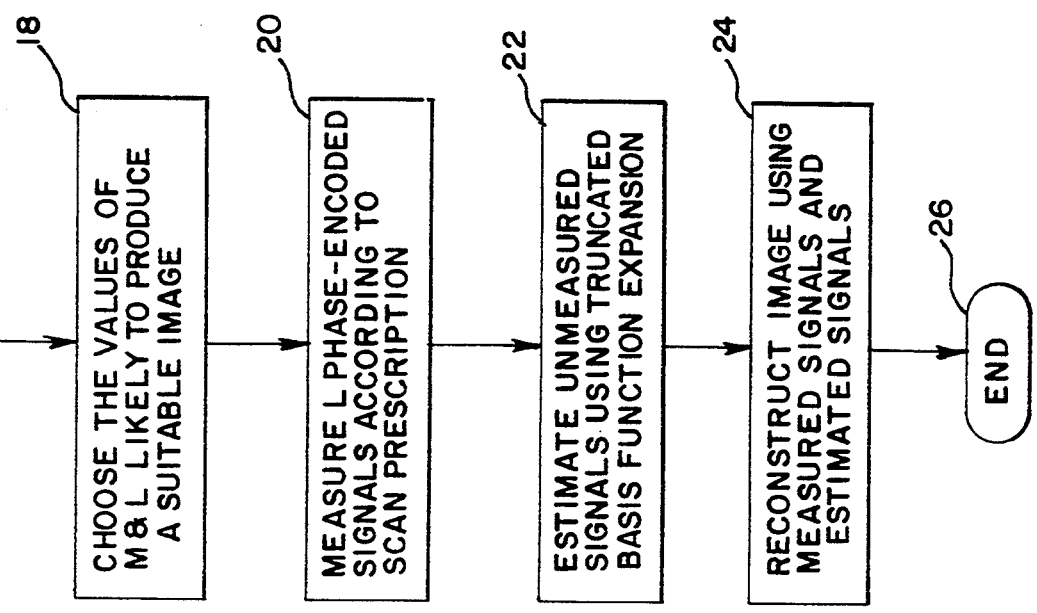

FIG. 3 generally depicts an FR imaging system 100 which includes a typical imaging system 102 which further includes a computer 104 coupled to a user input device 106 such as a keyboard and mouse. The computer 104 also communicates with a data acquisition device 108. The imaging system 102 also includes a display device 110 coupled to the computer for displaying images generated by the computer 104. The FR imaging system 100 may also have a training image input device 112 which may interface with the computer 104 to download training signal measurements from remote locations or other imaging systems.

The imaging system 102 may be a 1.5T full body scanner such as a model-Signa MRI machine available from General Electric Company. However, any suitable imaging system with ample computer memory and data acquisition functions may be employed. The imaging system 102 may be a CT, PET, SPECT, or other like imager.

The computer 104 receives data on training images from the data acquisition device 108 which may be in the form of several hundred brain scans stored in memory accessible by the data acquisition device 108. The computer 104 may also receive data on training images from the training image input device 112. The computer 104 contains adequate memory to store and sufficient computing processing power to implement the FR imaging method as described above. The computer 104 includes a program for deriving, from the training signal measurements, a set of basis functions that provides a convergent series expansion of the images and for determining a signal measurement prescription for the object based on the basis functions. The data acquisition device 108 acquires signal measurements of the object as determined by the signal measurement prescription.

The computer 104 generates a truncated basis function expansion of the image from the acquired signal measurements and estimates additional signal measurements based on the truncated basis function expansion. The computer 104 reconstructs the image of the object using the obtained signal measurements and the estimated additional signal measurements. The image is then displayed on the display device 110 for visual analysis by the operator or a physician.

In using the imaging system 100 of FIG. 3, an operator may begin the FR imaging process by acquiring training images. These images should be acquired at standard locations and with standard orientations with respect to an intrinsic coordinate system in the object. In general, such a coordinate system can be defined with respect to three or more intrinsic landmarks. For example, for brain scanning, the operator may define the origin of the coordinate system to be the anterior commissure. The $Y_oZ_o$ plane would be defined to be the plane passing through the anterior commissure, the posterior commissure, and the ponto-medullary junction at the midline. The $Y_o$ axis would be defined to be along the line connecting the anterior and posterior commissures. The $Z_o$ axis would be defined to be perpendicular to the $Y_o$ axis. The $X_o$ axis would be defined to be perpendicular to the $Y_oZ_o$ plane. A "distance unit" (DU) would be defined to be, for example, one-fifth the distance between the anterior and posterior commissures.

Next the operator may choose geometric and non-geometric imaging parameters for a standard scan. For example, the geometric parameters may be the number of slices, the thickness of slices in DU's, gaps between slices in DU's, positions and orientations (angles) of the slices with respect to the $X_o$, $Y_o$, and $Z_o$ axes. Other geometric parameters that may be defined may include the field of view (FOV) which may include the size of the FOV in each direction (in DU's), the position of the center of the FOV in $X_o$, $Y_o$, and $Z_o$ coordinates, and the orientation of the FOV within a slice plane. Using the user input device 106, the operator may select the number of basis functions M desired to produce an image and the number of measurements L used to generate an image of the object in accordance with the previously described FR imaging method. Other non-geometric parameters may also be defined such as repetition time (RT), time to echo (TE), flip angle and other well known parameters.

The operator may acquire a quick scout image using any suitable pulse sequence and technique which produces images on which the landmarks are visible. The system 100 then measures the scanner coordinates of the landmarks, for example with brain scanning, the coordinates would be identified as those corresponding to the anterior and posterior commissures as well as the ponto-medullary junction. The system 100 then calculates the mapping between the intrinsic coordinate system and the scanner coordinate system so that the position and orientation of the patient in the data acquisition device 108 could be compensated for, by performing subsequent scans in a standard and constant manner with respect to the intrinsic coordinate system. For example, for brain scanning, this may include a combination of the translations, rotations, and rescalings. In general, when one accounts for possible shears and independent rescalings along the three axes, one could define four landmarks and calculate a general mapping between coordinate systems.

The system 100 then calculates the coordinates of the standard slices and the field of view in the data acquisition device 108 coordinate system which would include identification of the thickness, gaps, positions, and orientations of the slices and the size, orientation and position of the field of view. The operator would then scan the training object with a standard imaging technique such as a FT scanning technique or download prior signal measurements from previous training images. It should be noted that the data may have to be adjusted so that the field of view is in the standard position. This can be done by multiplying data by a phase factor derived from the previous calculation of the scanner coordinates of the desired field of view. The system 100 then renormalizes the data from the training scan to account for variable receiver gain. For example, all data is rescaled so that the datum at the origin of k-space has unit magnitude. Once the data has been renormalized, the system 100 would calculate training matrices from the data using Eq. 11. The system 100 would then find unitary transformations $U_{nn'}(a)$ which diagonalize the training matrices as previously discussed.

The noise level e expected in subsequent scans of unknown objects, may be estimated. The operator may then choose the number of measurements to be taken L and the number of basis functions M which provide a satisfactory convergent series expansion. The apparatus would then find indices $(L)_{OPT}$ which minimize the error $<\overline{E}_r^2>$ where $<\overline{E}_r^2>$ is given by Eq. 21 and where Q(a), R(a), and W(a) are all given in terms of $U_{nn'}(a)$. The determination of the optimal indices are repeated for a wide range of e, L and M.

The acquisition and reconstruction of the image of the object to be scanned, in the case of MR, would be accomplished by estimating the noise e which could be expected during the scan. Next the proper L and M is chosen which would be based on the operator's experience with feature recognition methods. The operator then acquires a scout image using any technique which produces images in which the landmarks are visible. The scanner coordinates of the landmarks are then measured in a similar manner as for the acquisition of the training images as previously discussed. Mapping between the intrinsic and scanning coordinate systems, standard slices and FOV are then carried out also in a similar manner as discussed for the acquisition of the training images. Also, in a similar manner as with the acquisition of the training images, the coordinates for the standard slices and the field of view in the scanner coordinate system are calculated. Next, the object is scanned based on the scan prescription so that phase-encoded signals are obtained with indices (L). The data are multiplied by phase factors corresponding to the desired FOV position and are renormalized to account for receiver gain as described with the acquisition of the training image process. Next, the phase-encoded signals for indices not in $(L)_{OPT}$ are estimated based on Eq. 15 with Q and R given in terms of $U_{nn'}(a)$. Finally the image is reconstructed using Eq. 3 as previously described.

TESTING RESULTS

Figure 4:
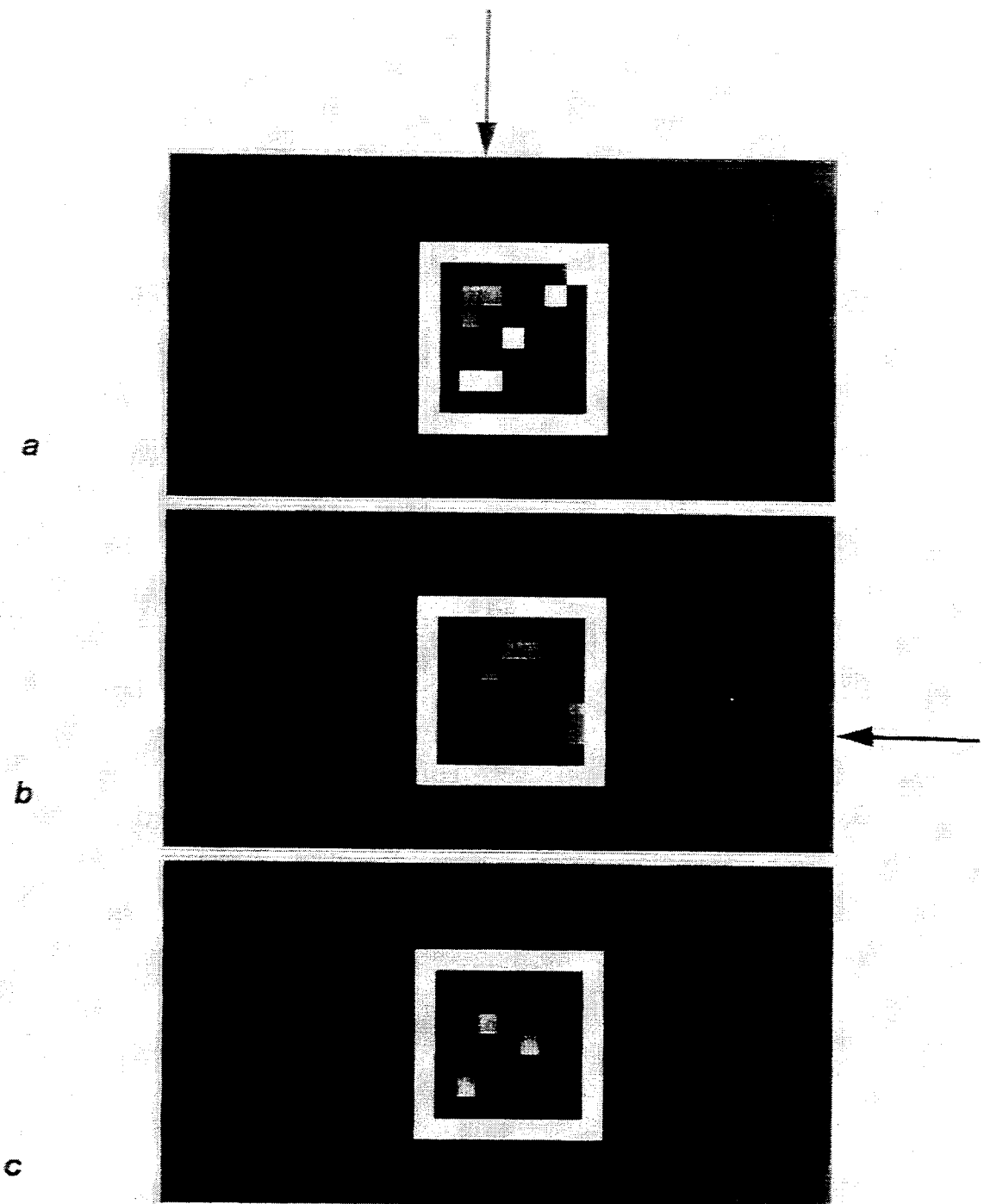
FIG. 4 pictorially represents typical examples from a set of 36 training images of simulated 2-dimensional objects.

Referring to FIGS. 4a-4c the aforedescribed method was tested using 36 simulated 2D training objects in a rectangular FOV. Each training image consisted of a 32×16 matrix with 32 pixels along the FE direction (horizontal) and 16 pixels along the PE direction (vertical). Each pixel was assigned a real value between 0 and 1000. No noise was added since the training images were assumed to have been acquired under ideal conditions (e.g. with enough signal averaging to generate a high signal-to-noise ratio). Simulated PE signals were obtained by 2DFT of each training image.

Each training image consisted of a 9×9 square outer rim which was surrounded by empty pixels. This peripheral rim and void constituted universal features analogous to the ellipsoidal rim of scalp tissue and surrounding air seen in all brain images. Approximately 78% of the training images contained a 3 pixel structure analogous to a commonly found normal anatomical structure (e.g., a common configuration of the ventricles) while 22% of the images contained a 2 pixel aggregate which represented an uncommon "anatomical variant" as seen in FIGS. 4a and 4b. Finally, all of the images were marked by signals at various locations within the rim which could represent "lesions" as well as unusual "variants of normal anatomy".

FIGS. 4a-4c show typical examples from a set of 36 training images of simulated 2D objects. All of the training images were marked by a square peripheral rim and a surrounding signal void. A 3 pixel aggregate was present at a certain location (arrow in panel a) in 78% of the images, and a two pixel aggregate (arrow in panel b) was present at another location in 22% of the images. All images were also marked by "lesions" scattered within the rim.

Figure 5:
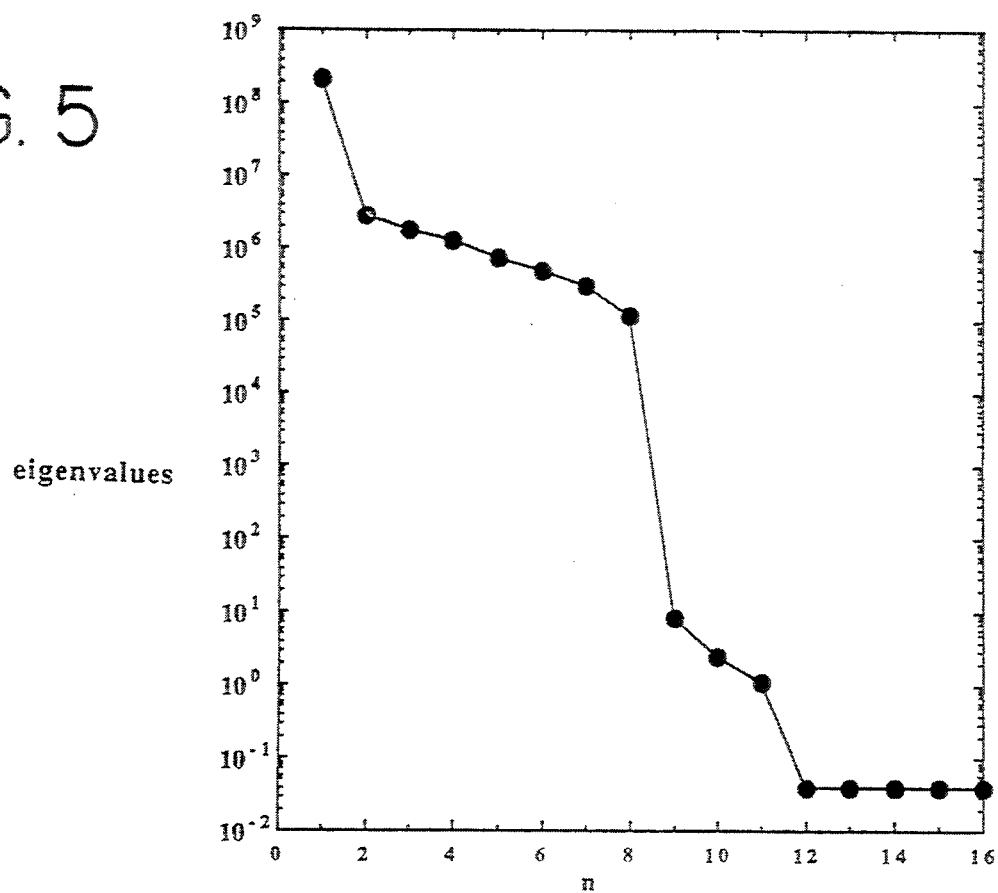
FIG. 5 graphically illustrates the eigenvalues of the training matrices corresponding to the training set of simulated objects shown in FIG. 4.

Eq. (11) was used to form the training matrices from these data, and these were diagonalized by unitary transformations $U_{nn'}(a)$. The corresponding eigenvectors (columns of $U_{nn'}(a)$) were used to calculate the FR basis functions (Eq. (6)). Since these constituted a complete orthonormal set, they may be used to expand any image as in Eq. (5). FIG. 5 shows the eigenvalues of the training matrices corresponding to the training set of simulated objects. Each point represents the sum of the $n^{th}$ eigenvalues of the training matrices with different FE indices. The last 8 eigenvalues are zero to within the round-off error of the computation.

Figure 6:
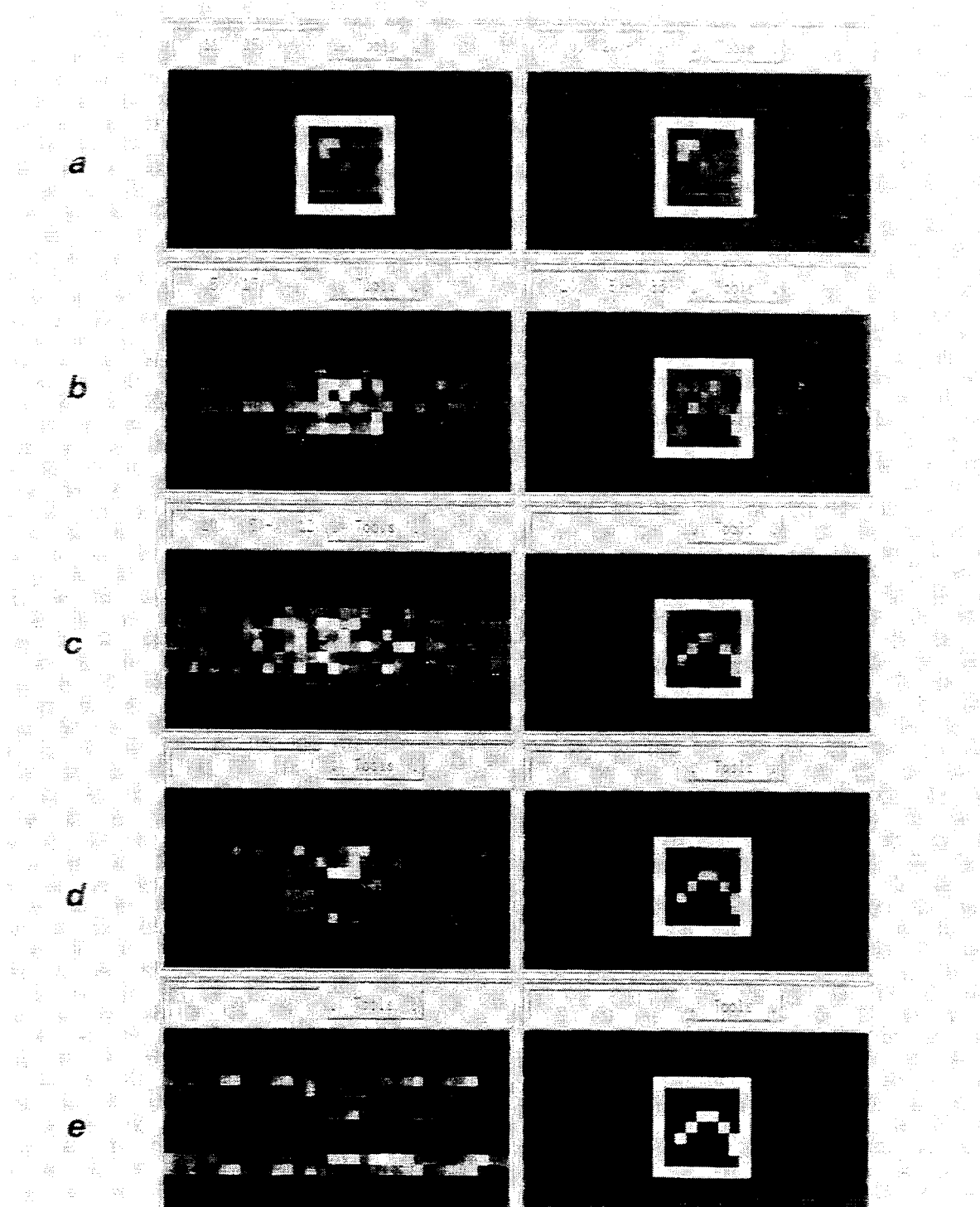
FIG. 6 pictorially represents a simulated image from the training set showing the training image decomposed into components along each feature recognized basis function derived from the training set and the sum of all feature recognition components having varying indexes.

To illustrate, the FR basis functions were used to represent the training image in FIG. 6 as well as the image in FIG. 7 which is not a member of the training set. FIG. 6 illustrates a simulated image from the training set decomposed into components along each FR basis function derived from that training set. The left panels show the image's component along the FR basis functions with index n equal to (a) 1, (b) 2, (c) 4, (d) 6, and (e) 8. The right panels show the sum of all FR components within less than or equal to (a) 1, (b) 2, (c) 4, (d) 6, and (e) 8. This image has vanishing FR components with n greater than 8.

Figure 7A:
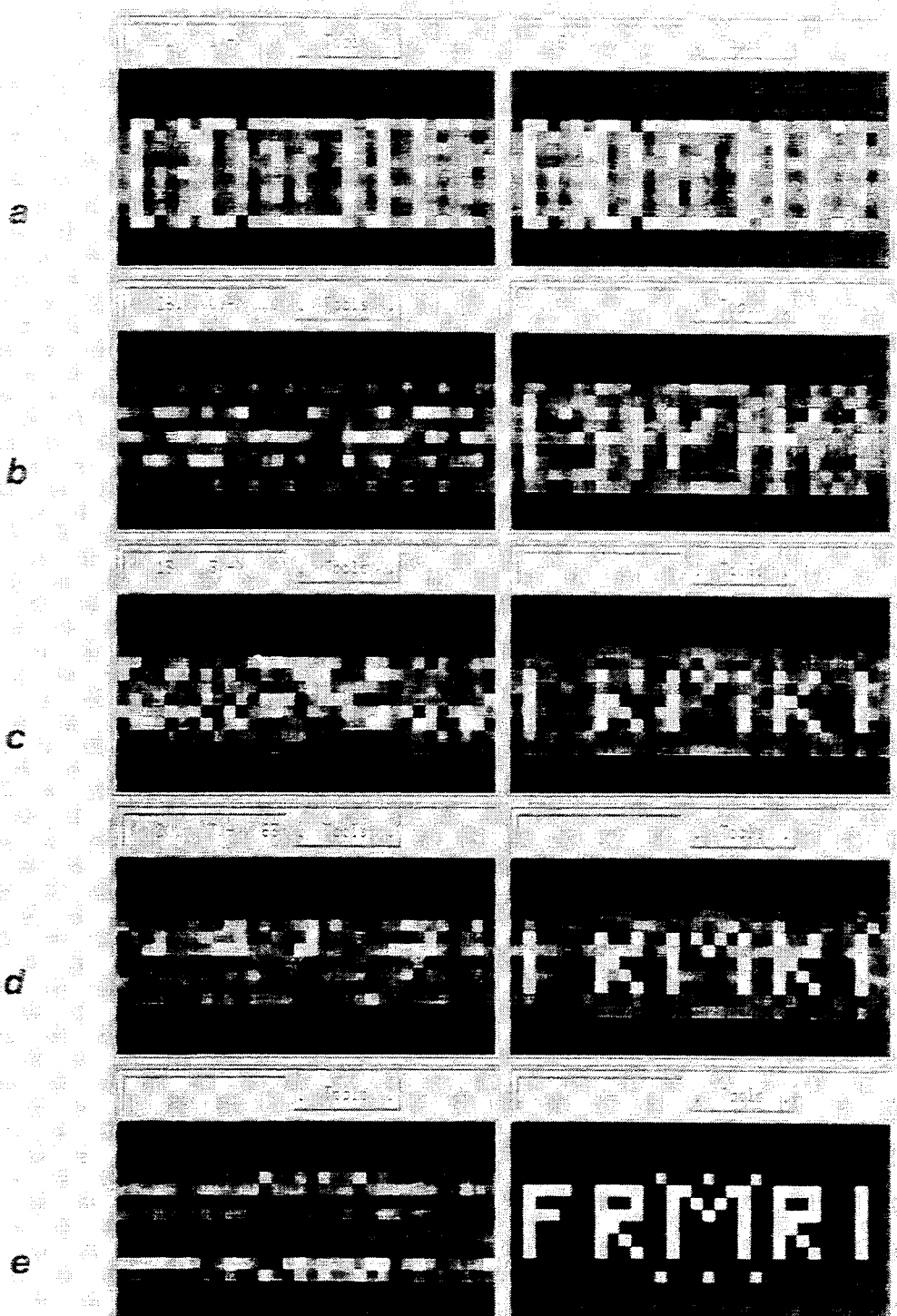
FIGS. 7a and 7b pictorially represent an image which did not belong to the training set of simulated objects which is decomposed into. components along each of the FR basis functions derived from the training set and the sum of all feature recognition components using varying indexes.
Figure 7B:
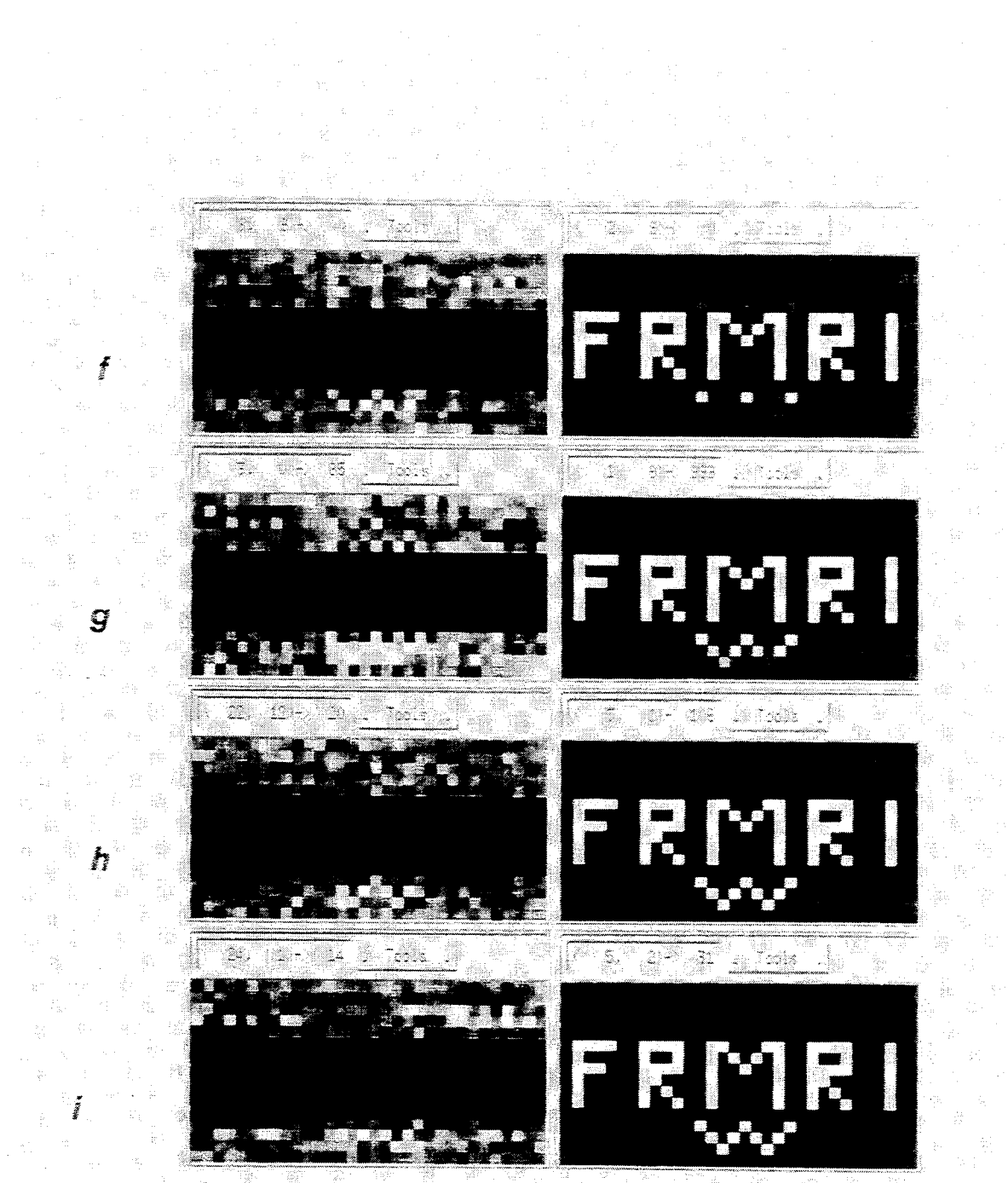

FIGS. 7a and 7b show how an image, which did not belong to the training set of simulated objects, was decomposed into components along each of the FR basis functions derived from that training set. The left panels show the images component along the FR basis functions with indices (n) equal to (a) 1, (b) 2, (c) 4, (d) 6, (e) 8, (f) 10, (g) 12, (h) 14, and (i) 16. The right panels show the sum of all FR components with n less than or equal to (a) 1, (b) 2, (c) 4, (d) 6, (e) 8, (f) 10, (g) 12, (h) 14, and (i) 16.

Notice that the object in FIGS. 7a and 7b is marked by high intensity structures outside the peripheral rim, where all training images have a void. These two figures show that the FR functions are localized distributions along the PE axis, unlike the uniformly distributed Fourier Functions. The last 8 eigenvalues are zero (FIG. 5), indicating that the training images contain no components along the corresponding FR basis functions (see Eq. (13)). This is because seven of the 8 basis functions (shown in FIG. 7) are localized outside the peripheral rim, i.e., in the "air" which surrounds all of the training objects. The eighth basis function with a vanishing eigenvalue projects out differences between the 4th and 12th image rows which are identical in all training images. Therefore, as shown in FIG. 6, each training image can be represented exactly as a sum of FR functions with 8 or less PE indices. In other words, the FR method has automatically found a series representation of the training images which can be truncated without error at M=8. This means that in the absence of noise, the 16 line training images can be recovered exactly from only 8 PE signals. It is not necessary to obtain the other 8 PE signals since they only provide information about the peripheral regions which are filled with "air."

According to Eq. (13), the largest eigenvalue should correspond to the most commonly found feature in the training images. In this case, the first FR basis function (FIG. 6) describes the universally present outer rim and also has weaker contributions from "common anatomical" features (e.g., the 3 pixel aggregate present in 78% of the training images.). Thus, the common features of the training set will "come into focus" in images reconstructed from just a few FR basis functions; such images can be approximated by calculating their FR components from just a few PE signals.

The FR basis functions with lesser eigenvalues (e.g., $2 \leq n \leq 8$) corresponded to less common features of the training images: e.g. the "lesions and uncommon anatomical variants" which were scattered nearly randomly throughout the area inside the rim. Therefore, these functions had a rather chaotic appearance, as shown in FIGS. 6 and 7a-7b. The first basis functions in this group, which had larger eigenvalues (e.g., n=2 or 3), corresponded to lesion "fragments" which occurred rather frequently in the training set, i.e., fragments of many different lesions occurring at the same location in many different training images. In other words, basis functions with low indices tend to be distributed at locations where lesions were frequently found in the training images. Therefore, during an FR image reconstruction, lesions at those locations will tend to "come into focus" early. It is important to note that the first FR basis functions in an expansion may depict structures which are not present in the actual image. Just as in Fourier reconstructions, these spurious features will be canceled as higher basis functions are added to the series. For example, the 3 pixel aggregate in the first FR eigenfunction used to represent the object in FIG. 6 is nearly canceled by the next few basis functions in the FR expansion.

If an image is approximated by the first M terms in the FR expansion, Eq. (14) can be used to estimate its FR components from M measured PE signals. The FR representation can then be used to predict the $N_P$-M unmeasured signals (Eq. (15)), and the image can be reconstructed by Fourier transformation of the entire array of measured and estimated signals. The required set of M phase-encodings can be chosen in $\binom{N_P}{M}$ ways where $$\binom{N_p}{M} = \frac{N_p!}{M! (N_p - M)!} \quad (22)$$

The best set of such measurements will minimize the right side of Eq. (21) which gives the average error in the FR reconstruction of the training images in the presence of noise e. Since $\binom{N_p}{M}$ was relatively small for the simulated data considered here ($N_p=16$), it was possible to minimize Eq. (21) by simply calculating the right side for all possible choices of M PE indices. A value of e which would produce a signal-to-noise level of 26 in each pixel of a conventional 16 line Fourier image was used in the calculation. The resulting optimal measurement sets are shown in Table 1. For larger images $\binom{N_p}{M}$ may be quite large and it is not practical to calculate Eq. (21) for all possible choices of M phase-encodings. Instead, the best measurement set can be found by using combinatorial optimization techniques (such as simulated annealing as discussed by S. Kirkpatrick, C. D. Gelatt, and Vecchi, Science (1983)) to minimize Eq. (21).

TABLE 1

Indices {M} of the optimal phase-encoded signals to be used for the FR reconstruction of the simulated images from an even number {M} of measurements. An index equal to 9 corresponds to no phase-encoding gradient.

| M | {M} |
|---|---|
| 2 | 2 9 |
| 4 | 5 9 12 16 |
| 6 | 2 4 7 9 12 14 |
| 8 | 1 3 4 6 8 11 13 15 |
| 10 | 2 4 5 7 9 10 11 14 15 16 |
| 12 | 2 3 5 7 8 9 10 11 12 13 14 16 |
| 14 | 2 3 4 5 6 7 8 10 11 12 13 14 15 16 |

Table 1 shows that the optimal measurements may represent phase-encodings which are scattered non-uniformly in k-space. The FR method then "fills in" k-space by estimating the missing PE signals. This is quite different from other constrained image reconstruction methods which do not "tailor" the PE measurements to the class of objects being imaged. Instead, these other schemes simply utilize measured PE signals which are uniformly spaced in the center of k-space and then attempt to extrapolate them into higher-k regions.

FIG. 8 depicts panels (a-e) showing the FR (left) and FT (right) reconstructions of one of the simulated training images. The exact 2D object is shown in the images in row a. The images in the lower 4 rows were created from the following numbers of PE measurements: (b) 8, (c) 6, (d) 4, and (e) 2. These measurements contained a realistic level of noise (equivalent to a signal-to-noise ratio of 26). Note that all images were windowed in the same way and that the window parameters were chosen to make noise particularly conspicuous.

The training image in FIG. 8 was reconstructed from M optimally-chosen PE measurements. The "measurements" were affected by random noise which would result in a signal-to-noise ratio of 26 in each pixel of a conventional 16 line Fourier image. Conventional Fourier reconstructions (right column) are shown as developed from the same number of PE signals uniformly spaced in the center of k-space. Notice that the peripheral rim and surrounding signal void "come into focus" in FR images reconstructed from even a small number of measurements (e.g., M=1 or 2). This is because the very first FR basis functions represent these universally present features, including their edges. It is as if the FR method "detects" the presence of these structures in the few measured signals and then "fills in" edges and other missing details based on its "experience" with the training images. It is also evident that features, which are somewhat less common in the training images, are accurately represented only in images reconstructed from a larger number of PE signals (e.g., M=4-6). This is because some less common fragments of those structures are only represented by higher FR basis functions.

FIG. 8 also shows that there is almost no error in the FR reconstructions based on 8 or more PE measurements. This can be understood in the following way. All of the training images have 8 constant features: namely, there is no signal in each of 7 rows outside the square rim, and there are equal intensities in the two rows passing through the upper and lower margins of the rim. These features correspond to 8 linear relationships satisfied by the 16 PE signals forming the rows in the k-space representations of these images. It follows that the training images lie completely within an 8-dimensional hyperplane defined by these 8 constraints. The FR method automatically finds this hyperplane and constructs the first 8 FR basis functions so that they span it. Therefore, the FR reconstructions which are based on this 8 term series expansion will be exact except for the effects of noise. The FR method can create these accurate images from only 8 PE signals because it "knows" about the 8 constant features and it can depict them in detail without measuring the 8 missing PE signals needed by the conventional FT technique.

It can be seen that the Fourier reconstructions converge more slowly than the FR reconstructions. This is because the Fourier basis functions are typically designed to represent oscillatory features which are not present in the images of interest. They are not well suited for reproducing the sharp-edged features in the training images. Therefore, these edges are "out of focus" as they are slowly built up from successively higher harmonics. In reconstruction from lower harmonics, smaller structures tend to be obliterated by truncation artifacts emanating from edges.

Figure 9A:
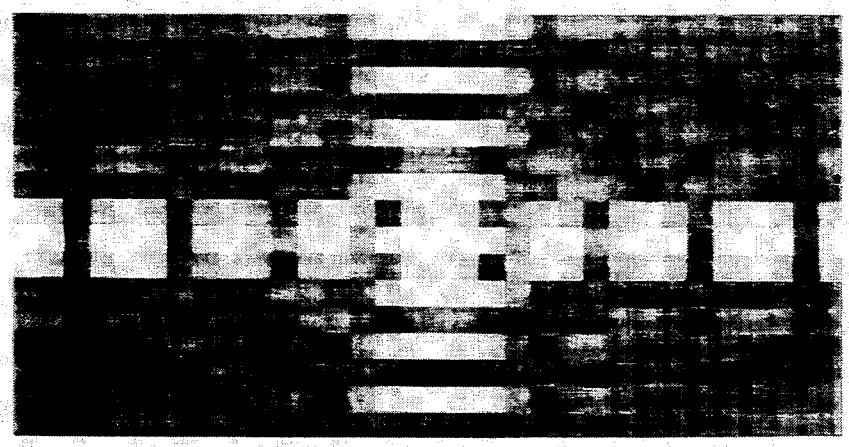
FIGS. 9a illustrates a k-spaced display of 16 noiseless phase-encoded signals corresponding to exact images in the top panels of FIG. 8.
Figure 9B:
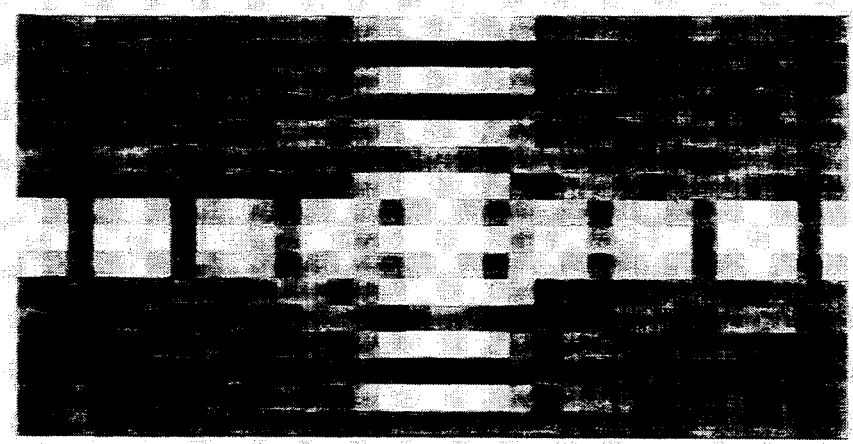
FIG. 9b illustrates a k-space display of measured phase-encoded signals and estimated phase-encoded signals used to create the FR reconstruction for M=6 in one of the panels in FIG. 8.

FIG. 9a shows a k-space display of the 16 noiseless PE signals corresponding to the exact images in the top panels of FIG. 8. FIG. 9b shows a k-space display of the 6 "measured" PE signals (arrows) and 10 estimated PE signals used to create the FR reconstruction for M=6 in FIG. 8 (third panel from the top on the left side of FIG. 8). Note how the six measured phase-encodings are scattered in k-space. Comparison with the complete array of 16 measured PE signals, as seen in FIG. 9a, shows that the FR method accurately estimated the 10 unmeasured signals which were interspersed between the measured ones.

The FR series converges more rapidly than the Fourier series. In other words, the truncation error in an FR reconstruction is generally less than that in a FT reconstruction for the same M. Both types of images will be degraded by increasing noise error as M grows (e.g., the first term in Eq. (21)). As previously mentioned, there will be more noise in the FR image which is generated by noise propagating from the M measured signals into the $N_p$-M estimated signals (i.e., the second term in Eq. (21)).

Figure 10A:
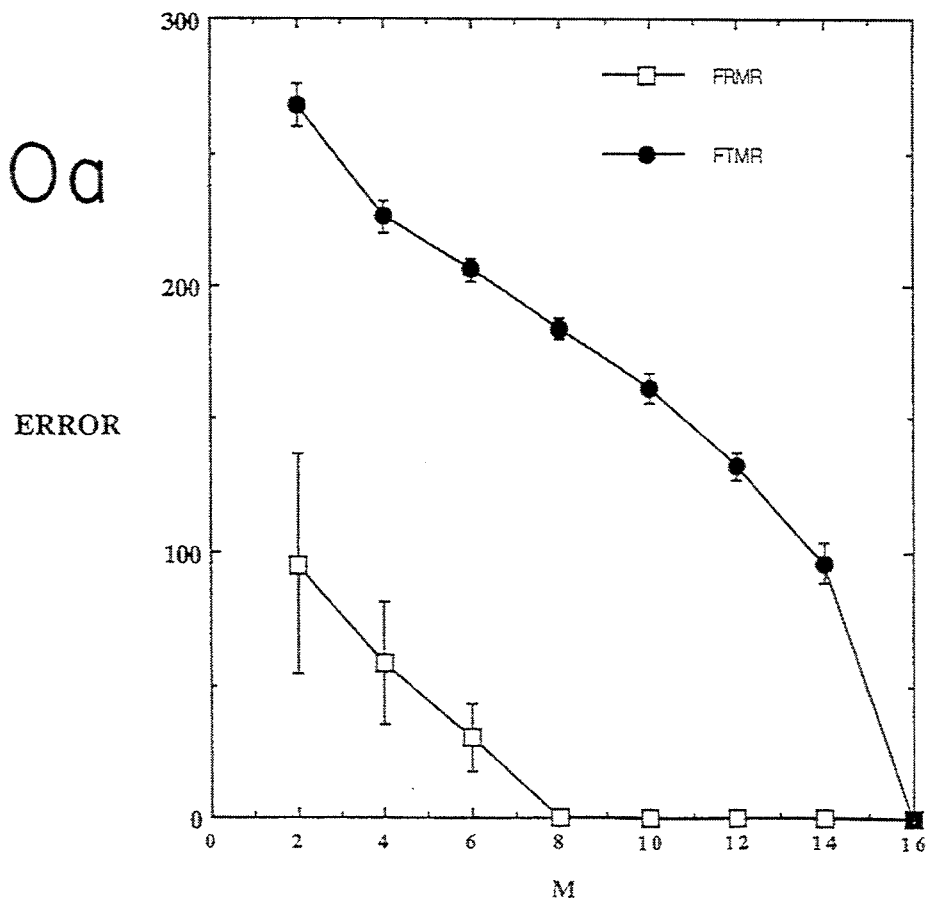
FIG. 10a graphically represents the truncation error encountered when feature recognition (lower curve) and Fourier transformation (upper curve) methods were used to reconstruct all 36 images in a simulated training set.

FIG. 10a shows the truncation error encountered when the FR (boxes) and FT (dots) methods were used to reconstruct all 36 images in the simulated training set. This is the level of error ($E_R$ in Eq. (16)) in reconstructions from M noiseless measurements. The boxes (or dots) and vertical bars represent the average and standard deviation of the error, respectively, over the entire training set. The FR truncation error (the third term in Eq. (18)) decreases rapidly as the FR expansion converges to an exact reconstruction at M=8. On the other hand, the Fourier truncation error is larger and decreases more slowly as sharp edges are slowly "built up" from higher harmonics. At M=16 the Fourier truncation error vanishes since the 16 line FT reconstruction is "exact" by definition (Eq. (3)). In the general case, the FR truncation error will also vanish at $M=N_p$ since the FR basis functions are defined to be complete over the space spanned by the $N_p$ Fourier functions.

Figure 10B:
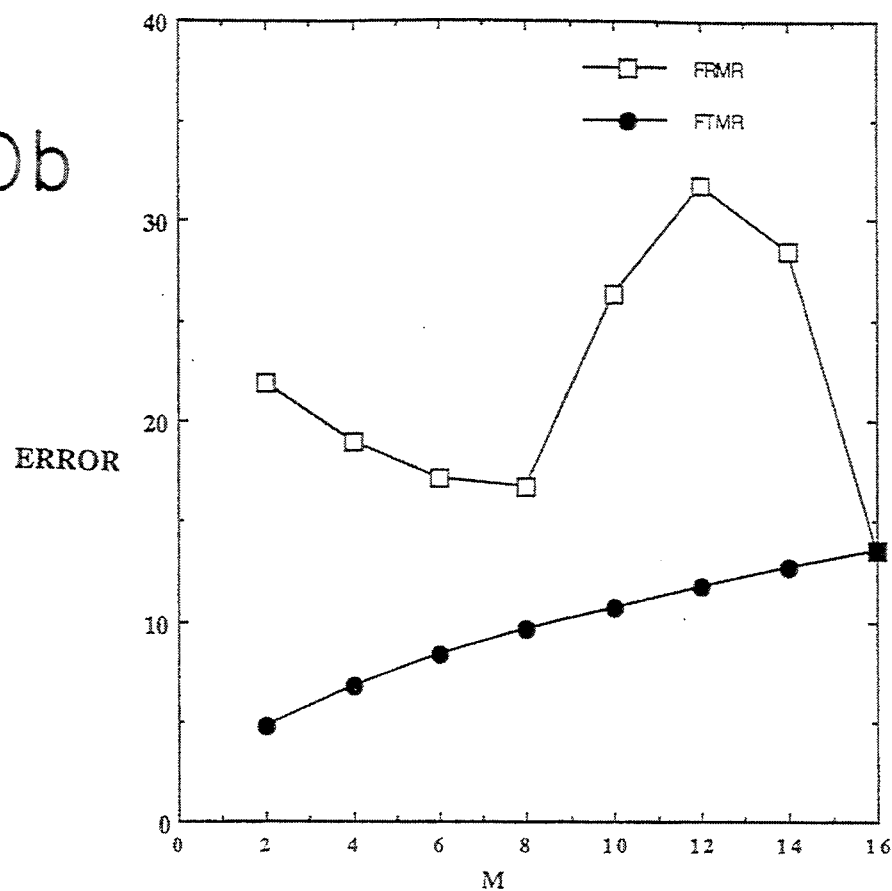
FIG. 10b graphically illustrates noise induced error encountered when the feature recognition (upper curve) and Fourier transformation (lower curve) methods were used to reconstruct the simulated training images from M measurements with a realistic signal-to-noise level.

FIG. 10b shows noise-induced error encountered when the FR (boxes) and FT (dots) methods were used to reconstruct the simulated training images from M measurements with a realistic level of noise (equivalent to a signal-to-noise ratio of 26). The graph shows the average level of error in Eq. (16) which would be present during multiple reconstructions of each image if the truncation errors in the FR and FT expansions were ignored. As illustrated, the image noise (the first two terms in Eq. (18)) may be greater in FR reconstructions because these images are affected by propagated noise in addition to the noise in directly measured signals. This graph also shows how both FR and Fourier images are affected by increasing amounts of noise as the number of measurements M increases. At M=16 the two types of images are equally degraded by noise which then originates only from directly measured signals.

Figure 10C:
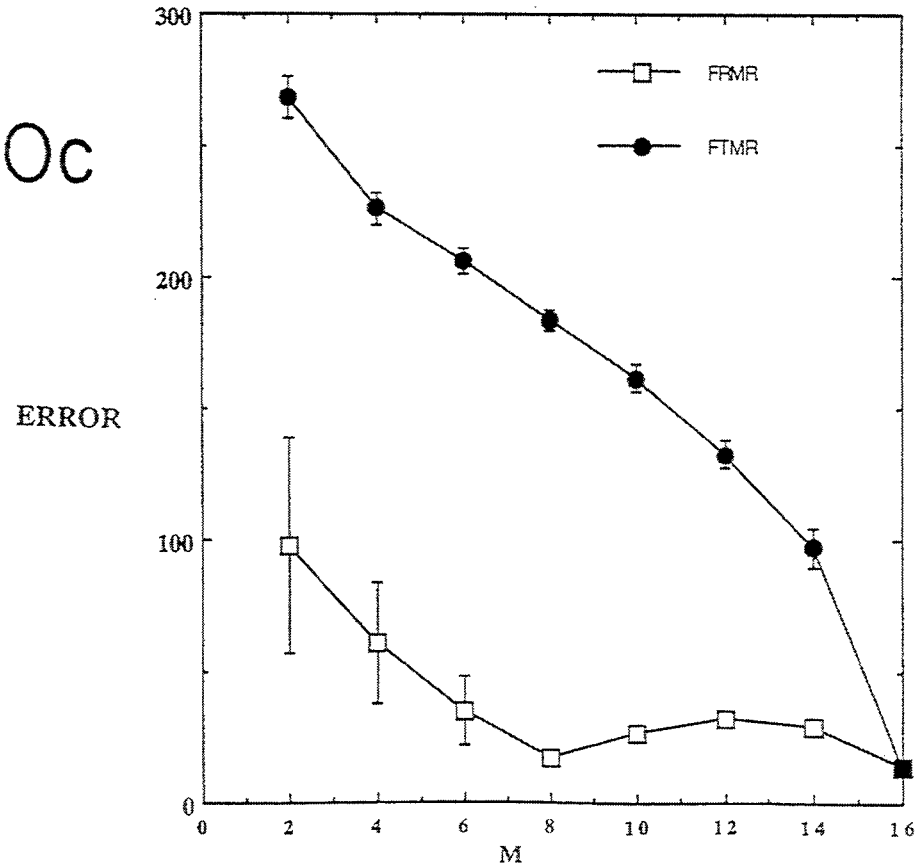
FIG. 10c graphically illustrates the total error when the feature recognition (lower curve) and Fourier transformation (upper curve) methods are used to reconstruct all 36 simulated training images from M noisy measurements.

FIG. 10c shows the total error ($E_r$ in Eq. (16)) when the FR (boxes) and FT (dots) methods were used to reconstruct all 36 simulated training images from M noisy measurements (signal-to-noise ratio of 26). The boxes (or dots) and vertical bars represent the average and standard deviation of the error, respectively, over the entire training set. For almost all values of M truncation error dominates, and the FR reconstruction is more accurate despite its greater susceptibility to noise. Finally, at $M=N_p$ the FR and FT images are identical, both being degraded only by noise in the directly measured signals.

As illustrated, the FR method provides a better trade-off between spatial resolution and imaging time. Specifically, the FR images have less truncation error than Fourier images acquired in the same time. Thus, the FR method produces higher resolution images in the same time or high resolution images in less time than the conventional Fourier scheme. For reasonable levels of noise the overall error should also be less in FR images. It will be recognized that FIG. 10c only shows one measure of image quality, and these expectations must be verified by experience with actual reconstruction of many different images.

Figure 11:
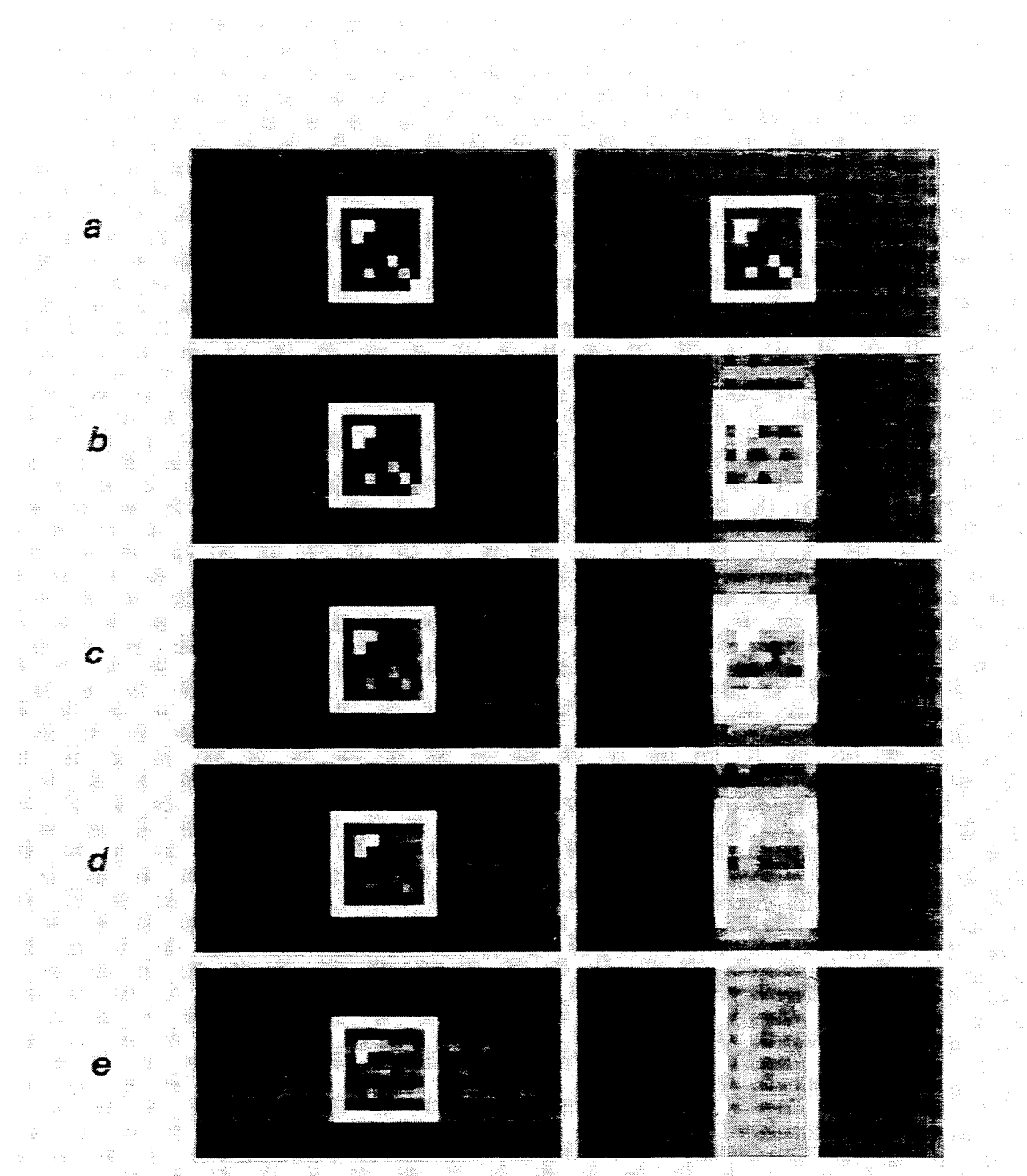
FIG. 11 pictorially illustrates the feature recognition (left) and Fourier transformation reconstruction (right)

FIG. 11 shows the FR (left) and FT (right) reconstructions of the training image in FIG. 8, calculated from (b) 8, (c) 6, (d) 4, and (e) 2 measurements with a high level of noise (equivalent to a signal-to-noise ratio of 13). The images in row a represent the exact simulated object. All images have been windowed in the same way as those in FIG. 8; i.e., the windowing parameters were chosen to make noise particularly conspicuous. These training images were reconstructed in the presence of noise which would produce a signal-to-noise ratio of 13 in each pixel of a 16 line Fourier image. It is evident that truncation artifact is still the dominant error in the Fourier images, even at these high levels of noise. Since there is much less truncation error in the FR reconstruction scheme, it still leads to better overall image quality.

FIGS. 12 and 13 show the FR (left) and FT (right) reconstructions of two "unknown" images which were not in the training set of simulated objects. These images were created from (b) 8, (c) 6, (d) 4, and (e) 2 PE signals with a realistic level of noise (equivalent to a signal-to-noise ratio of 26). Row a shows the exact simulated object in each case.

These images (FIGS. 12 and 13) contained the outer rim and surrounding signal void, which were universally present in the training images, but they were also marked by lesions with various positions and configurations. These reconstructions were done in the presence of noise which would produce a signal-to-noise ratio of 26 in each pixel of a 16 line Fourier image. As expected, the outer rim is well represented by the very first FR basis functions. Lesions at various sites are more slowly "built up" by superposing higher FR functions representing fragments of lesions at these locations in the training images. It is evident that the FR images are more highly resolved than are the FT images constructed from the same number of PE signals.

Any truncation artifacts in an FR reconstruction would be recognized by the person monitoring the study, and the exam could be repeated with a more complete set of measurements if the artifacts were problematical. If M were increased sufficiently (e.g., if M approached $N_p$), the FR reconstruction would become identical to the high resolution Fourier image created from $N_p$ PE signals. The same type of problem occurs with conventional Fourier imaging. If the scanned object has stronger, sharper edges than expected, there may be unacceptably large truncation artifacts in FT images produced with the usual degree of spatial resolution. When these artifacts are recognized, the subject can be imaged again with a more highly resolved, more time consuming pulse sequence.

TESTING OF PHANTOMS

The FR method was applied to experimental data obtained by scanning phantoms. Each phantom consisted of a plastic cylinder with a 25 mm diameter, which was filled with baby oil. A second plastic cylinder with a thin wall (2 mm) was concentrically placed within the outer cylinder so that there was a few millimeters of oil between the two walls. This structure was scanned with four different combinations of solid and hollow plastic rods placed within the inner cylinder and oriented slightly obliquely with respect to its long axis.

In each case, the phantom was placed in the head coil of a 1.5T whole body scanner (Signa, General Electric Medical Systems, Milwaukee, Wis.), and a multiplanar spin echo pulse sequence was used to image cross-sections oriented perpendicular to the long axis of the cylinder. Each scan was performed with 8 excitations and TR/TE equal to 450/16 ms. Each section was 3 mm thick and extended over a 42 cm FOV, represented as a 256×256 array of pixels with 1.64 mm sides. Since most of the FOV was air-filled, it was reduced to 52 mm (26 mm) in the FE (PE) direction by using only every eighth column (every sixteenth row) of raw data in the FE (PE) direction.

FIG. 14 shows typical examples from a set of 44 training images obtained by scanning phantoms in a whole-body imager. Low intensity "lesions" were present at various locations inside the dark rim. Certain universal features were present in all of these images. Each disk-like cross section was surrounded by a signal void representing air. Furthermore, each disk contained a thin dark peripheral rim representing the inner plastic cylinder. The remainder of each disk was filled with high signal from the baby oil except for dark "lesions" of various sizes, shapes, and locations which represented the plastic rods within the inner cylinder. The raw data for these images were assigned to arrays $f_n(a,j)$ where $n=1 \ldots 16$, $a=1 \ldots 32$, and $j=1 \ldots 44$. These were summed in dyadic form to calculate the training matrices in Eq. (11). The diagonalizing unitary matrices $U_{nn'}(a)$ are calculated in order to derive the optimally convergent FR basis functions given by Eq. (6). Next, the indices of the optimal phase-encoding measurements to be used in the FR reconstruction are determined by minimizing Eq. (21) over all choices of (M) for each $M=1 \ldots 15$.

The FR method was used to recover training images from these reduced measurement sets. FIGS. 15 and 16 show the FR (left) and FT (right) reconstructions of two of the images in the phantom training set. These were created from (a) 16, (b) 8, (c) 6, (d) 4, and (e) 2 PE signals.

From FIGS. 15 and 16, it is evident that the universal features of the training set (the dark peripheral rim; the signal void surrounding the phantom) were well represented even in highly truncated FR images produced from just two PE signals The "lesions" which were present in 25%–75% of the training images, came into focus in FR images reconstructed from 4 PE signals. Notice the sharp edges of the features which are depicted in any FR image. This is because the FR basis functions are highly localized and described the edge content of these features. Therefore, as soon as enough PE signals were available to "detect" the presence of a feature, the method inserted a detailed representation of it into the reconstructed image. Thus, the FR expansion converged rapidly to a highly resolved image of each training image. In contrast, Fourier images produced from fewer than 8 PE signals were severely degraded by truncation artifacts. Convergence was gradual as each edge was slowly constructed from 8 harmonics. This is because the Fourier basis functions are not well suited for depicting sharp edges and, unlike the FR functions, they are certainly not "tailored" to represent the known features of this training set.

FIGS. 17 and 18 show the FR (left) and FT (right) reconstructions of two "unknown" phantom images which do not belong to the set of phantom training images. These were created from (a) 16, (b) 8, (c) 6, (d) 4, and (e) 2 PE signals.

FIGS. 17 and 18 illustrate how the FR expansion was applied to reconstruct images of phantom sections which were adjacent to some of the sections in the training set. Therefore, these "unknown" images contained the same universal features as the training images, but they were marked by "lesions" at different locations than those in the training images. FIGS. 17-18 show that the FR expansion converged more rapidly to these images than did the Fourier series. Since these "unknown" images resembled the training images, their "image vectors" were near the training set hyperplane which was well represented by each FR expansion. On the other hand, these images had large high-k Fourier components due to their strong edge content. Therefore, the corresponding image vectors were far from the hyperplane represented by the FT reconstruction which was spanned by the low k Fourier components in the center of k-space.

The FR approach assumes similarity between the object to be scanned and a training set of previously imaged objects. Without any free parameters, the FR method automatically extracts important features of the training objects and uses this information to determine the best basis functions for representing the "unknown" image as well as the best subset of phase-encodings to be measured. In contrast, the conventional FT imaging technique is based on an implicit assumption that edge strengths in the object to be scanned are similar to those in other previously scanned objects. This limited amount of prior knowledge is used to determine the number of phase encodings to be acquired. However, the FT method does not use past experience to determine the choice of image basis functions or to choose the k-space locations of the acquired PE signals. Instead, it makes use of a fixed set of basis functions (sines and cosines) and a fixed set of phase-encodings (uniformly spaced in the center of k-space) which are suboptimal for most objects. Thus, compared to the FR method, the FT scheme does not fully utilize all of the prior knowledge about the object to be scanned, nor does it fully exploit the available degrees of freedom in the image reconstruction and signal acquisition processes.

Given any number of signals to be measured, the FR method uses prior knowledge (the training set) to pick the best k-space locations of those signals. The optimal PE signals are those which lead to the smallest average error in the FR reconstruction of the training images. The FR image reconstruction formula, also derived from the training set, is used to estimate the remaining PE signals. In contrast, the FT technique always utilizes PE signals uniformly spaced in the center of k-space. FT image reconstruction is then done after blind "zero-filling" of the high-k regions of k-space. Thus, in the FT scheme past experience is not used to find the best signals to be measured nor to estimate unmeasured ones in an optimal fashion.

In the FR approach, past experience should be used in a qualitative manner to estimate the number of signals that should be measured. Specifically, the number of basis functions M in the truncated FR expansion and the number of phase-encoded L should be fixed at a level which produced acceptably low truncation artifacts and adequately high resolution in earlier scans of similar objects. If an unexpectedly high level of truncation artifact is encountered during a particular scan, it suggests that the object being scanned differs significantly from the previously scanned objects; i.e., the object must have a feature which is rare among the training images. In that case, the person monitoring the scan should choose to repeat the scan with a higher M. Ultimately, as M approaches $N_p$, the FR image will become identical to a high resolution FT image. Note that low resolution FT scanning ($M<N_p$) must also be monitored to detect unexpected levels of truncation artifact. These herald the presence of unexpectedly strong edges in the object, which should then be rescanned with a higher M. If the subject is still in the scanner, a sufficient number of more peripheral lines in k-space can be acquired "on the spot" without repeating the measurement of the more central lines. A similar, "interactive" form of FR scanning can also be devised. In general, the optimal PE indices of the FR technique are scattered in k space and are not "nested": i.e., $\{M\} \notin (M+1)$. However, in particular examples it has been found that there are nested sets of PE indices which are nearly optimal in the sense that Eq. (21) is nearly minimized. These nested FE indices describe a "path" through the possible phase-encodings along which each FR reconstruction is nearly indistinguishable from the optimal one for the same number of measurements. Therefore, FR scanning along such a path could be done with adaptive termination: the scanner could keep acquiring more measurements (i.e., increasing M) until the operator saw the images converge to an artifact-free result. FR scanning along a path of nearly optimal phase-encodings has another advantage; if a pulse sequence is prematurely terminated due to patient or scanner problems, the collected data is suitable for producing an FR reconstruction which is nearly optimal for a reduced data set of that size.

In general, FR techniques based on different training sets will be appropriate for different imaging situations. For example, an FR protocol, which is designed for screening, should be based on a training set which reflects the normal and abnormal anatomy of the general population. On the other hand, an FR protocol for imaging patients with multiple sclerosis should be derived from a training set of similar patients. In general, a more homogeneous population of training images will lead to a more convergent FR series and will result in a greater comparative advantage of the FR method relative to the FT method. Of course, FR and FT scanning can be used in parallel to produce the best "mix" of scans for any particular patient.

As previously mentioned with reference to FIG. 3, to avoid extraneous differences between scans of intrinsically similar objects, caused by variable positioning of those objects and by variable receiver gain during different scans, each scan should be preceded by a quick scout scan to determine the position of the subject. The technologist can completely characterize the subject's position by measuring the coordinates of three easily recognized anatomical landmarks. For example, during a brain scan the coordinates of the anterior commissure, posterior commissure, and the ponto-medullary junction at the midline could be measured. This information suffices to determine the position and orientation of the subject in the scanner. Specifically, it determines the mapping between the scanner coordinate system and the subject's intrinsic coordinate system, defined by the three landmarks. The scanner may then calculate how subsequently imaged sections should be positioned and oriented so that they are at "standard" locations with respect to this intrinsic coordinate system. Similarly, the FOV can be rotated into a standard orientation with respect to the subject by rotating the FE and PE axes within the plane of each section. Finally, if the acquired data are multiplied by an appropriate phase factor, the data will be identical to the data which would have resulted if the FOV had been translated to a standard location with respect to the subject.

In short, if the technologist or operator measures the coordinates of three intrinsic landmarks during a scout scan, all subsequent scans can be done as if the subject was positioned within the FOV in a standard fashion. Variations in the scale of different training objects (e.g., differences in brain size among large and small subjects) will also tend to reduce the convergence of the FR expansion. However, this variability can be removed by choosing the size of the FOV to be proportional to the overall scale of the object which is also determined by the three landmark measurements. Finally, if intrinsically similar objects are scanned with different receiver gains, there will be differences in signal intensity (i.e., image vectors with different lengths) which will slow the convergence of the FR series. These variations can be removed by renormalizing all acquired signals in a standard fashion; e.g., so that $|f_n(a)|=1$ at the center of k-space. Notice that other scan parameters (e.g., TR, TE, flip angle) should be identical during scanning of all training and "unknown" objects so that the training images have predictive value.

The most computationally intense step in the FR method is block 14 (FIG. 1a); the determination of the optimal phase-encodings to be measured. Here it is necessary to minimize Eq. (21) over all choices of M indices, each chosen from $N_p$ possible values. For purposes of discussion small images ($N_p=16$) were considered so that the problem was solved exactly by direct calculation of Eq. (21) for all choices of M indices. However, it is practical to implement FR imaging with larger matrices (e.g., $N_p=256$) by using combinatorial optimization techniques to minimize Eq. (21). For example, simulated annealing may be a practical method for finding the global minimum of Eq. (21). The derivation of the FR basis functions is a much less computationally intensive step. For example, consider the FR recovery of 256×256 images. The entire set of 256×256 training images can be "lumped into" 256 training matrices, each of which is a 256×256 complex array. The number of training matrices can be reduced by grouping together adjacent columns of PE data with different FE indices and using an average training matrix for each group; however, the averaged FR expansions derived in this way will tend to be less convergent than column-by-column FR expansions if the training matrices vary rapidly with the FE index. A modest computer, is sufficient to store these matrices, diagonalize them, and determine the corresponding FR basis functions.

It will be recognized that other statistical measures of convergence may be useful in deriving the FR basis functions and other measures of quality of reconstructed images could be used to determine the scan prescription. Furthermore, spatially modulated RF pulses and gradients for direct excitation with the profiles of FR basis functions may also be used. Then, the FR components of the image could be measured directly.

The FR method has been applied along one dimension (the PE direction) of 2D images which are acquired as lines along the FE direction in k-space. In most situations there is no benefit derived from reducing the amount of data acquired in the FE direction. In those unusual cases in which it is valuable to reduce the amount of FE data (e.g., fractional echo imaging), the FR method could be applied to estimate the missing data along that direction. Imaging methods which acquire data at arbitrary points in k-space (e.g., echo planar imaging or MR spectroscopic imaging) benefit from a fully two-dimensional version of the FR technique. An $N \times N$ image of this type would correspond to an image vector with $N^2$ components, $f_{an}$ where n and a range between 1 and N. The FR basis functions would represent various image features as distributions localized in two dimensions. The M optimal k-space points to measured would have to be chosen from ($_MN^2$) this would entail a substantial computation.

The FR expansion could also be used to "clean up" motion artifacts which occur in ordinary FT imaging. For example, if it were apparent that a subject had moved during part of a conventional scan, the raw data could be examined to identify the corrupted lines in k-space. These could be replaced by estimates calculated from the remaining data by means of the FR reconstruction formula (Eq. (15)) derived from the appropriate training set.

Finally, it should be noted that the FR technique can be applied almost directly to back-projection reconstruction (BPR) used in x-ray computed tomography (CT), positron emission tomography (PET), single photon emission computed tomography (SPECT), and MRI. In order to produce high resolution BPR images, the projections must be spaced at small angular intervals. The FR technique could be used to find the angles of certain optimal measured projections and to estimate the data at intervening projection angles. Thus, a high resolution image could be produced from a subset of the usual closely-spaced projections with a concomitant reduction in radiation dose (CT) and imaging time (CT, PET, SPECT, MR). To see this, recall that the Fourier transformation of each projection view is an array of data points along a radial line in k-space. This suggests the following mathematical analogy between the CT and MR cases. Let $g_\Theta(k)$ be the CT data at the k-space point with polar coordinates $(k,\Theta)$. For each k, this can be considered to be an image vector over a space with dimensions equal to the number of closely-spaced values of $\Theta$, analogous to the vector $f_n(a)$ in the MR case. A training set of previous CT scan can be used to find the optimally convergent set of basis vectors in this space. This is done by diagonalizing training matrices analogous to Eq. (11). If the angular dependence of $g_\Theta(k)$ for each radial coordinate is approximated by the first M FR basis vectors, the missing projections can be estimated from M measured projections by means of formulas analogous to Eq. (15). A high resolution scan can then be reconstructed by the usual filtered back-projection method. As in the MR case, the M measured projections should be chosen to optimize the FR reconstruction of the training images (e.g., to minimize the analog of Eq. (21)).

A unique set of complete orthonormal functions ("features") provides the basis for the optimally convergent series expansion of the training images. The set or series contains fewer terms than the Fourier series required for previous methods to represent the training images with comparable accuracy. The coefficients in this optimal representation can be calculated from an equal number of phase-encoded signal measurements, i.e., from a subset of the usual full array of measurements required for conventional Fourier reconstruction of high resolution images. The resulting non-Fourier representation of the image is then used to estimate the unmeasured phase-encoded signals, and the image is reconstructed by Fourier transformation of the full array of measured and estimated signals. The training images are used to determine the optimal subset of signals which should be measured. These are the measurements which lead to the most accurate reproduction of the training images by means of the constrained image reconstruction process previously described. Subsequently, an accurate image of any object similar to those in the training set can be produced by acquiring these optimal measurements and reconstructing the image by means of the convergent non-Fourier expansion. The FR imaging method leads to more favorable trade-off between imaging time and spatial resolution.

The above described method uses training images which automatically lead to the selection of the most important image features which are then used to constrain subsequent imaging of the same body part of other individuals. Specifically, the method considers all possible linear constraints on image reconstruction and chooses those which lead to the most accurate reproduction of the training images from a reduced set of signal measurements. Furthermore, the method automatically specifies which subset of phase-encoded signals should be measured as well as estimates signal for "filling in" the empty regions between those signals which are usually non-uniformly scattered in k-space. Thus, the statistical properties of the training set dictate how the scan is actually performed as well as how the image is reconstructed from the measured data. This differs from other constrained imaging schemes which do not exploit the degrees of freedom in the actual scanning process; instead, these other methods simply utilize conventional Fourier data sets consisting of phase-encoded signals uniformly covering the center of k-space.

The Appendix contains copyrighted material and is a computer listing in C language for use in an MR imaging system such as a 1.5T whole body scanner (Signa, General Electric Medical Systems, Milwaukee, Wis.). Pages A1–A8 list the portion of the program used to calculate the training matrices and perform the diagonalization of the training matrices as previously described with reference to FIG. 1. Pages B1–B7 list the portion of the program used to determine the indices of optimal phase-encoded signals as described with reference to FIG. 1. Pages C1–C11 lists the portion of the program used to estimate the unmeasured phase-encoded signals and reconstruct the image by Fourier transformation using the measured signals and the estimated signals also as described with reference to FIG. 1. Pages D1–D43 list assorted subroutines which are used the other portions of the program.

While a preferred embodiment of the present invention has been illustrated and described with reference to an MRI system, it will be understood that changes and modifications may be made therein without departing
from the true spirit and scope of the invention.

```
/*\\\\\\\\\\\\\\\\\\\\\\\\\\\\\\\\\\\//////////////////////////////////// clm_tn_mtrx_cl.c -- generate total train matrice by summation over all columes

The total train matrice is Hermitian matrice, diagenized and saved as
        tm_eig.dat (ASCII format) including number of phase encodings, eigen-
        values and eigen-vectors. It will be uesd by optimization program.

Train matrix of each columes in k space are generated, diagnized
        and saved as clm_tm_eig.bin (binary format) only including multiply of
        # of columes by # of pase-encodings, # of phase_encodings and eigen-
        vectors for each colume sequentially. It will be used for imaging
        reconstruction.

input in the center of FOV:
                data in k space in float point format and bin file
                data in x space in short int format and bin file Data is normalized to |a(ky=0)(kx=0)| = 4000

5/6/92
////////////////////////////////////////////\\\\\\\\\\\\\\\\\\\\\\\\\\\\\\\\*/
#include "paramtrc.h"

define NM_FACTOR 4000.0 define DEBUG float ax,by;   /* FOV */ main()
{
   Image image[MAX_FFT_YPNT][MAX_FFT_XPNT]; /* image[y][x] */
   float **cT,**ceig_vct,*eig_vl,**cT_clm;
   int num_fenc, num_penc,num_clm,j,k,l,num_img,num_train,counter;
   char flg[20],k_flg[20],filename[20];

printf("\nEnter the number of FENC, # of PENC and # of colume -->");
   scanf("%d %d %d",&num_fenc,&num_penc,&num_clm);

ax=1.0; by=0.5; /* define FOV */

/* num_penc=MAX_PENC;
   num_fenc=MAX_FENC;
*/
   printf("\nthe number of FENC %d, # of PENC %d and # of colume %d\n",num_fenc, cT=matrix(0,num_penc-1,0,2*num_penc-1);   /* complex train matrice */
   cT_clm=matrix(0,num_clm*num_penc-1,0,2*num_penc-1);
         /* complex colume train matrice */
   eig_vl=vector(0,num_penc-1);              /* eigen-values of train matrice */
   ceig_vct=matrix(0,num_penc-1,0,2*num_penc-1); /* eigen-vectors of tm */

/* initialize cT_clm */
   for(j=0; j<num_clm*num_penc; j++) {
      for(k=0; k<2*num_penc; k++)
         cT_clm[j][k]=0.0;
   }
   num_train=0;

printf("\nEnter the number of train images to be used ?");
   scanf("%d",&num_img);

printf("\nEnter 0 for spatial data, 1 for k space data : ");
   scanf("%s",k_flg);

counter=0;
   while( counter < num_img ) {
      if( k_flg[0] == '0' ) {    /* spatial data */
         Read_img(image,MAX_FFT_YPNT,MAX_FFT_XPNT);
```

```
      save_sint(image,MAX_FFT_YPNT,MAX_FFT_XPNT);
      system("vuim temp.dat -w 32 -h 16 -depth 2 -scale 4 %");
      sleep(2);

/* convert images into colume train matrice */
      num_train +=cnvt_img_TM_clm(image,MAX_FFT_YPNT,MAX_FFT_XPNT,cT_clm,num_clm
    }
    else {  /* in k space */ printf("\nEnter k space data filename :");
      scanf("%s",filename);

num_train += Read_k_TM_clm(cT_clm,num_clm,num_penc,num_fenc,filename);

}
    counter++;
  }   /* end of while */ printf("\nnumber of train img is %d",num_train);

/* colume train matrice divided by the number of train images */
  for(j=0; j<num_clm*num_penc; j++) {
     for(k=0; k<2*num_penc; k++)
       cT_clm[j][k] /=(float)num_train;
  }

/*  printf("\nDo you want to save training matrice ?");
    scanf("%s",flg);
       save_cfbin(cT,num_penc,num_penc);
       system("mv fc_2d.bin clm_trn_mtrx.bin");
*/

/* generate total train matrice for optimization */
  for(j=0; j<num_penc; j++) {
    for(k=0; k<2*num_penc; k++) {
      cT[j][k]=0.0;
      for(l=0; l<num_clm; l++)
        cT[j][k] +=cT_clm[l*num_penc+j][k];
    }
  }

/* diagnizing total train matrice */
  eigen_hm(cT,num_penc,num_penc,eig_vl,ceig_vct);

/* save eigen-values and eigen-functions of total train matrice */
  save_eig(eig_vl,num_penc,ceig_vct);

/* If colume train matrice want ot be weight by adjacet colums,
     add a function at this point */
/* weight_3pt(cT_clm,num_clm,num_penc); */

/* diagnizing colume train matrice and save them */
  Diag_TM_clm(cT_clm,num_clm,num_penc);

free_matrix(cT,0,num_penc-1,0,2*num_penc-1);
  free_matrix(cT_clm,0,num_clm*num_penc-1,0,2*num_penc-1);
  free_matrix(ceig_vct,0,num_penc-1,0,2*num_penc-1);
  free_vector(eig_vl,0,num_penc-1);

}
int
weight_3pt(cT_clm,nc,np)
float **cT_clm;    /* cT[0...nc*np-1][0...2*np-1]  */
int nc,np;
/* using 3 points mask (0.25 0.5 0.25) to clm train matrix along colume directio
{
  int j,k,l;
  float **tmp_cT_clm,wet0,wet1;

tmp_cT_clm=matrix(0,nc*np-1,0,2*np-1);
```

```c
    wet0=0.5;
    wet1=0.25;

for(j=0; j<np; j++) {
      for(k=0; k<2*np; k++) {
        tmp_cT_clm[j][k]=wet0*cT_clm[j][k]+wet1*cT_clm[np+j][k]; /* for 1st clm*/
        for(l=1; l<nc-1; l++)
          tmp_cT_clm[l*np+j][k]=wet0*cT_clm[l*np+j][k]+
                                wet1*(cT_clm[(l-1)*np+j][k]+cT_clm[(l+1)*np+j][k]);
        tmp_cT_clm[(nc-1)*np+j][k]=wet0*cT_clm[(nc-1)*np+j][k]+
                                wet1*cT_clm[(nc-2)*np+j][k];
      }
    } for(j=0; j<nc*np; j++)
       for(k=0; k<2*np; k++)
          cT_clm[j][k]=tmp_cT_clm[j][k];

free_matrix(tmp_cT_clm,0,nc*np-1,0,2*np-1);

} int
Diag_TM_clm(cT_clm,nc,np)
float **cT_clm;    /* cT_clm[0...nc*np-1][0...2*np-1]  */
int nc,np;
{
   int j,k,l;

float **ceig_vct,*eig_vl,**clm_eig_vl,**tmp_cT,thrshl,thrshl_cl;

ceig_vct=matrix(0,np-1,0,2*np-1);
   eig_vl=vector(0,np-1);
   clm_eig_vl=matrix(0,nc-1,0,np-1);
   tmp_cT=matrix(0,np-1,0,2*np-1);

/* diagnizing colume train matrice by columes*/
   for(l=0; l<nc; l++) {
printf("\nl = %d\n",l);
      thrshl_cl=sqrt(cT_clm[l*np+np/2][np]*cT_clm[l*np+np/2][np]+
                    cT_clm[l*np+np/2][np+1]*cT_clm[l*np+np/2][np+1]);
      if( fabs(thrshl_cl) > 0.001) {
        for(j=0; j<np; j++)   /* load cl cT into tmp cT */
          for(k=0; k<2*np; k++) {
            tmp_cT[j][k]=cT_clm[l*np+j][k];
          }
        eigen_hm(tmp_cT,np,np,eig_vl,ceig_vct);
printf("\neigen_vcts:\n");
        for(j=0; j<np; j++)   {
          clm_eig_vl[l][j]=eig_vl[j];
printf("\n eigen_vl: %f,:",eig_vl[j]);
          for(k=0; k<2*np; k++){
            cT_clm[l*np+j][k]=ceig_vct[j][k]; /* load in cl eig vct matrice */
/*          printf(" %f,",cT_clm[l*np+j][k]); */
          }
fflush(stdout);
        }
      }
      else {
        for(j=0; j<np; j++)
          clm_eig_vl[l][j]=0.0;
printf("\nzeros in train matrice");
      }
   }
```

```c
/* save eigen_vectors of colume train matrice in bin file */
/* first two numbers are nc*np and np */
save_cfbin(cT_clm,nc*np,np);
system("mv fc_2d.bin clm_tm_eig.bin");
sleep(1);

/* save eigen_values of colume train matrice in bin file */
/* first two numbers are nc and np */
save_cfbin(clm_eig_vl,nc,np/2);
system("mv fc_2d.bin clm_eig_vl.bin");

free_matrix(ceig_vct,0,np-1,0,2*np-1);
free_matrix(tmp_cT,0,np-1,0,2*np-1);
free_vector(eig_vl,0,np-1);
free_matrix(clm_eig_vl,0,nc-1,0,np-1);

} int
Read_k_TM_clm(cT,nc,np,nf,filename)
float **cT;      /* cT[0...nc*np-1][0...2*np-1] */
int nc,np,nf;
char *filename;
{
   float **tmp_cT_clm,**cta,*cta00,*temp_data;
   int fd,j,k,l,*np;

tmp_cT_clm=matrix(0,nc*np-1,0,2*np-1);
   cta=matrix(0,np-1,0,2*nf-1);
   cta00=vector(0,1);

if( (fd=open(filename,O_RDONLY)) < 0 )
     printf("\nError: %s can't open ", filename);
   else
     printf("\n%s open to read",filename);

read(fd,&j,sizeof(int));
   read(fd,&j,sizeof(int));

read_cfbin(fd,cta,np,nf);

/* normalize data to !cta(ky=0)(kx=0)! = NM_FACTOR */
   cta00[0]=cta[np/2][nf];
   cta00[1]=cta[np/2][nf+1];
   for(j=0; j<np; j++) {
     for(k=0; k<2*nf; k++)
       cta[j][k] *= NM_FACTOR/sqrt(cta00[0]*cta00[0]+cta00[1]*cta00[1]);
   }

/* get the training matrix of cT by colums with delta weight function */
   /* if nc < nf, only center of nc colums are used */
   train_m_clm(tmp_cT_clm,nc,np,cta,np,nf);

/* add into colume train matrix */
   for(j=0; j<nc*np; j++) {
     for(k=0; k<2*np;  k++)
        cT[j][k] +=tmp_cT_clm[j][k];
   } free_matrix(cta,0,np-1,0,2*nf-1);
   free_matrix(tmp_cT_clm,nc*np-1,0,2*np-1);
   free_vector(cta00,0,1);

return 1;

} int
Read_img(image,ny,nx)
Image image[][MAX_FFT_XPNT];
int ny,nx;
{
```

```
  short *tmp_data;
  int j,k,fd,n,hd_l;
  char filename[200];

if( (tmp_data=(short *)malloc(ny*nx*sizeof(short))) == NULL ) {
    fprintf(stderr,"%cERROR: Cannot allocate data\n",7);
    exit(-1);
  } printf("\nEnter the filename -->");
  scanf("%s",filename);

if( (fd=open(filename,O_RDONLY)) < 0 ) {
    printf(stderr,"%cERROR : can not open %s \n",7,filename);
    exit(-1);
  }
  else
    fprintf(stderr,"%s opened\n",filename);

hd_l=0;

n=ny*nx;

read_sbin(fd,tmp_data,n,hd_l);

for(j=0; j<ny; j++) {
    for(k=0; k<nx; k++ ) {
      image[j][k]=tmp_data[j*nx+k];
    }
  }

} int
cnvt_img_TM_clm(image,ny,nx,cT,nc,np)
Image image[][MAX_FFT_XPNT];
float **cT;
int ny,nx,np,nc;
/* input image[ny][nx] at the center of FOV
   This function transforms the image to k space in y direction by inverse fft,
   then generates colume training matrice cT[0...nc*np][0...2*np-1] */
{ float tmp_cT_clm,cta,*cta00;
  int j,k,l;
  char flg[20];

tmp_cT_clm=matrix(0,nc*np-1,0,2*np-1);
  cta=matrix(0,np-1,0,2*nx-1);
  cta00=vector(0,1);

/* generate complex matrix cta[p][x] in x-ky configuration */
  k_image(image,MAX_FFT_YPNT,MAX_FFT_XPNT,cta,np,nx);

/* normalize cta to !cat(ky=0)(kx=0)! = NM_FACTOR */
  cta00[0]=cta[np/2][nx];
  cta00[1]=cta[np/2][nx+1];
  for(j=0; j<np; j++) {
    for(k=0; k<2*nx; k++)
      cta[j][k] *= NM_FACTOR/sqrt(cta00[0]*cta00[0]+cta00[1]*cta00[1]);
  }

/* get the training matrix of cT by colums with delta weight function */
  /* if nc < nf, only center of nc colums are used */
  train_m_clm(tmp_cT_clm,nc,np,cta,np,nx);
```

```
             /* load tmp_cT_clm in cT */
             for(j=0; j<nc*np; j++) {
                for(k=0; k<2*np; k++)

cT[j][k] += tmp_cT_clm[j][k];
          } free_matrix(tmp_cT_clm,0,nc*np-1,0,2*np-1);
          free_matrix(cta,0,np-1,0,2*nx-1);
          free_vector(cta00,0,1);

return 1;
       } int
       save_eig(eig_vl,n1,ceig_vct)
       float *eig_vl,**ceig_vct;
       int n1;
       /* eig_vl[0...n1-1] and ceig_vct[0...n1-1][0...2*n1-1] */
       {
          int j,k;
          FILE *fp;
          char filename[20];

strcpy(filename,"tm_eig.dat");
          if( (fp=fopen(filename,"w")) ==NULL) {
             fprintf(stderr,"%cERROR : file %s can not open to write\n",7,filename);
             return(-1);
          }
          else
             fprintf(stderr,"\n%s opened for writing\n",filename);

fprintf(fp,"num_penc %d\n",n1);
          fprintf(fp,"eigen values :\n");
          for(j=0; j<n1; j++)
             fprintf(fp,"%f, ",eig_vl[j]);
          fprintf(fp,"\neigen vectors :\n");
          for(j=0; j<n1; j++) {
             for(k=0; k<n1; k++) {
                fprintf(fp,"%f, %f, ",ceig_vct[j][2*k],ceig_vct[j][2*k+1]);
             }
             fprintf(fp,"\n");
          }
          fclose(fp);

} int
       k_image(image,ny,nx,cta,np,nf)
       Image image[][MAX_FFT_XPNT];
       float **cta;    /* cta[0...np][0...2*nx-1] */
       int ny,nx,np,nf;
       /* inverse FFT images along x and y direction */
       {
          float *temp_data;
          int i,j,k,l,*nn;

temp_data=vector(0,2*nx*ny-1);   /* 2d complex data */
          nn=ivector(1,2);
             nn[1]=ny;
```

```
    nn[2]=nx;

/* load image in temp_data */
    for(j=0; j<ny; j++) {
       for(k=0; k<nx; k++) {
         i=j*nx+k;
          temp_data[2*i]=(float)image[j][k];
          temp_data[2*i+1]=0.0;
       }
    } fourn(temp_data-1,nn,2,-1);
    rotation_2d(temp_data,nn);

/* load temp_data back to cta */
    for(j=0; j<np; j++) {
       for(k=0; k<nf; k++) {
          i=(j+(ny-np)/2)*nx+k+(nx-nf)/2;
          cta[j][2*k]=SGN(0.5-j%2)*SGN(0.5-k%2)*temp_data[2*i];
          cta[j][2*k+1]=SGN(0.5-j%2)*SGN(0.5-k%2)*temp_data[2*i+1];
       }
    }

}

/*\\\\\\\\\\\\\\\\\\\\\\\\\\\\\\\\\\\\\\\\\\\\\\\/////////////////////////////////////// clm_opt_pm.c -- calculate  error colume by colume and  optimaze
                       total error of colume errors ///////////////////////////////////////////////////\\\\\\\\\\\\\\\\\\\\\\\\\\\\\\\\\\\\\\
include "paramtrc.h"

#define FACTOR      100.0
#define BEST_CMBNT  100
undef  DEBUG main()
{
   float **eig_vl_TT,**ceig_vct_TT,**tmp_eig_vct;
   float trc_tot,sum_trace,max_sl_trc,ns_fct;
   int num_penc,num_clm,m_dim,l_dim,l,j,k,*cmbnt_index,ns_fig;
   double *mini_trace, temp_trace;
   int **mini_trace_index,num_cmbnt,fd;
   char filename[20];
   FILE *fp;

/* read the number of colume and  phase encoding steps at first,
      then eigen values and vectors at first */
   strcpy(filename,"clm_eig_vl.bin");
   if( (fd=open(filename,O_RDONLY)) < 0 ) {  /* open clm eig vl file */
      printf("\nError: %s can't open ", filename);
      return(-1);
   }
   else
      printf("\n%s open to read",filename);
sleep(3);
   read(fd,&num_clm,sizeof(int));
   read(fd,&num_penc,sizeof(int));
   num_penc *= 2;
printf("\nnc %d and np %d",num_clm,num_penc);
sleep(3);
   eig_vl_TT=matrix(0,num_clm-1,0,num_penc-1);
   ceig_vct_TT=matrix(0,num_clm*num_penc-1,0,2*num_penc-1);
   tmp_eig_vct=matrix(0,num_penc-1,0,2*num_penc-1);

read_cfbin(fd,eig_vl_TT,num_clm,num_penc/2);

strcpy(filename,"clm_tm_eig.bin");
   if( (fd=open(filename,O_RDONLY)) < 0 ) {    /* open clm eig vct file */
      printf("\nError: %s can't open ", filename);
      return(-1);
```

```
    }
    else
     printf("\n%s open to read",filename);

read(fd,&num_clm,sizeof(int));
    read(fd,&num_penc,sizeof(int));

num_clm /= num_penc;
    printf("\nnc %d and np %d",num_clm,num_penc);
    sleep(3);
    read_cfbin(fd,ceig_vct_TT,num_clm*num_penc,num_penc);
    /* niose flag = 0 . no noise. */
    ns_flg=1;
    ns_fct=25.0;

/* chose M and L dimension */
    scanf("%d",&m_dim);
    printf("\n M is %d",m_dim);
    l_dim=m_dim;

/* initialize combination index */
    cmbnt_index=ivector(1,l_dim);
    for(j=1; j<=l_dim; j++)
        cmbnt_index[j]=j;
    cmbnt_index[l_dim]=l_dim-1;
    num_cmbnt=0;

/* initialize mini_trace and mini_trace_index */
    mini_trace=dvector(1,BEST_CMBNT);
    mini_trace_index=imatrix(1,BEST_CMBNT,1,l_dim);
    for(j=1; j<=BEST_CMBNT; j++)
        mini_trace[j]=1000000000.0;

/* start a loop to calculate traces for all combination */
    while( cmbnt_conf(cmbnt_index,l_dim,num_penc,&num_cmbnt) > 0 ) {
       max_sl_trc=0.0;
       printf("\nnum_cmbnt is %d :",num_cmbnt);
       for(j=1; j<=l_dim; j++)
       printf(" %d",cmbnt_index[j]-1);

/* calculate traces of QR and WT colume by colume*/
       sum_trace=0.0;
       for(l=0; l<num_clm; l++) {            /* loop for columes */
          if( (eig_vl_TT[l][0]) > 0.001 ) {
             for(j=0; j<num_penc; j++)        /* load clm eig_vct to array */
                for(k=0; k<2*num_penc; k++)
                   tmp_eig_vct[j][k]=ceig_vct_TT[l*num_penc+j][k];
             Trace_tot(eig_vl_TT[l],tmp_eig_vct,num_penc,m_dim,cmbnt_index+1,
                   l_dim,&trc_tot,ns_flg,ns_fct);
             sum_trace +=trc_tot;
             max_sl_trc=MAX(max_sl_trc,trc_tot);
          }
       } printf(" : tot trace is %f",sum_trace);
       printf("\nmax single clm trace %f",max_sl_trc);
       fflush(stdout);

/*     if( max_sl_trc < 0.3*sum_trace ) { */
       /* find minimum of traces */
       temp_trace=(double)sum_trace;
       mini_trace_search(temp_trace,mini_trace,BEST_CMBNT,cmbnt_index,l_dim,mini_
/*     }     */

} /* end of while */ printf("\nFirst %d minimum traces will be :\n",BEST_CMBNT);
    for(k=1; k<=BEST_CMBNT; k++) {
       for(j=1; j<=l_dim; j++)
          printf("%d ",mini_trace_index[k][j]-1);
```

```
    printf(": %d trace %e \n",k,mini_trace[k]);
}

/* write first 20 mini. trace index in file */ if( (fp=fopen("mini_trc_indx.dat","w"))==NULL) {
  fprintf(stderr,"%cERROR : file can't open to write\n",7);
  return(-1);
}
else
  fprintf(stderr,"file is open \n");
for(k=1; k<=BEST_CMBNT; k++) {
   for(j=1; j<=l_dim; j++)
     fprintf(fp,"%d ",mini_trace_index[k][j]-1);
   fprintf(fp,"\n");
} free_matrix(eig_vct_TT,0,num_clm*num_penc-1,0,2*num_penc-1);
free_matrix(tmp_eig_vct,0,num_penc-1,0,2*num_penc-1);
free_matrix(eig_vl_TT,0,num_clm-1,0,num_penc-1);
free_ivector(cmbnt_index,1,l_dim);
free_dvector(mini_trace,1,BEST_CMBNT);
free_imatrix(mini_trace_index,1,BEST_CMBNT,1,l_dim);

} int
Trace_tot(eig_vl_TT,eig_vct_TT,n,m,index,l,trc_tot,ns_flg,ns_fct)
float *eig_vl_TT,**eig_vct_TT,*trc_tot,ns_fct;
int *index,n,m,l,ns_flg;  /* index[0...l-1] combination index vector */
/* eig_vct_TT[0...n-1][0...2*n-1] clm eig_vct of train M complex matrix
   eig_vl_TT[0...n-1] real vector eig_values */
{ float cRR,cQQ,cr,cq,cW,adj_cr,trc_qr,trc_wt;
  float **eig_vct_TTp,*eig_vl_RR, eig_vct_RR,adj_eig_vct_RR,tmp1_m,tmp2_
  int i,j,k,min,max;

trc_wt=0.0; trc_qr=0.0;

cr=matrix(0,l-1,0,2*m-1);           /* lXm   complex matrix */
  adj_cr=matrix(0,m-1,0,2*l-1);       /* mXl   complex matrix */
  cq=matrix(0,n-l-1,0,2*m-1);         /* (n-l)Xm complex matrix */
  cRR=matrix(0,m-1,0,2*m-1);          /* mXm   complex Hermitian matrix */
  cQQ=matrix(0,m-1,0,2*m-1);          /* mXm   complex Hermitian matrix */
  eig_vl_RR=vector(0,m-1);            /* m dim real vector */
  eig_vct_RR=matrix(0,m-1,0,2*m-1);       /* mXm   complex matrix */
  adj_eig_vct_RR=matrix(0,m-1,0,2*m-1);   /* mXm   complex matrix */

/* load cr and cq */ load_qr(eig_vct_TT,n,m,index,l,cr,cq);

/* get adj_cr and cRR = (R+)R, mXm matrix */
  CM_adj(cr,adj_cr,l,m);
  CM_adjmutil(cr,l,m,cRR);

/* scale cRR by FACTOR */
  for(j=0; j<m; j++) {
   for(k=0; k<2*m; k++) {
     cRR[j][k] *= FACTOR;
   }
  }
```

```c
/* get eigen values and eigen functions of cRR */
eigen_hm(cRR,m,m,eig_vl_RR,eig_vct_RR);

/* get adjoint of eig_vct_RR */
CM_adj(eig_vct_RR,adj_eig_vct_RR,m,m);

/* calculate trace of QR */
  if( ns_flg > 0 ) {
    /* get cQQ = (Q+)Q, mXm matrix */

CM_adjmutil(cq,n-1,m,cQQ);

/* scale cQQ by FACTOR */
    for(j=0; j<m; j++) {
      for(k=0; k<2*m; k++) {
        cQQ[j][k] *= FACTOR;
      }
    } tmp1_m=matrix(0,m-1,0,2*m-1);     /* mXm  complex matrix */
    tmp2_m=matrix(0,m-1,0,2*m-1);     /* mXm  complex matrix */
      CM_mutil(adj_eig_vct_RR,m,m,cQQ,m,tmp1_m);
      CM_mutil(tmp1_m,m,m,eig_vct_RR,m,tmp2_m);
#if defined(DEBUG)
printf("\n(ER)+(cQQ)(ER): \n");
for(j=0; j<m; j++) {
   for(k=0; k<2*m; k++) {
      printf("%f, ",tmp2_m[j][k]);
   }
   printf("\n");
}
printf("\neig_vl_RR :\n");
for(j=0; j<m; j++) {
   printf("%f, ",eig_vl_RR[j]);
}
endif for(j=0; j<m; j++)
         trc_qr += tmp2_m[j][2*j]/fabs(eig_vl_RR[j]);
/*
      printf("\nqr trace %f",trc_qr);
*/
      free_matrix(tmp1_m,0,m-1,0,2*m-1);
      free_matrix(tmp2_m,0,m-1,0,2*m-1);

} /* end of trace of QR */

/* calculate trace of WT only for FM mode */ cW=matrix(0,n-1-1,0,2*n-1);    /* (n-1)Xn complex matrix */

/* scale eigen values of RR by 1/FACTOR */
   for(j=0; j<m; j++) {
      eig_vl_RR[j] /= FACTOR;     /* eig_vl_RR has right factor now */
   } tmp1_m=matrix(0,n-1-1,0,2*m-1);
   tmp2_m=matrix(0,n-1-1,0,2*m-1);

CM_mutil(cq,n-1,m,eig_vct_RR,m,tmp1_m);

for(k=0; k<m; k++) {
      for(j=0; j<(n-1); j++) {
         tmp1_m[j][2*k]   /= eig_vl_RR[k];
         tmp1_m[j][2*k+1] /= eig_vl_RR[k];
      }
   }
```

```
    CM_mutil(tmp1_m,n-1,m,adj_eig_vct_RR,m,tmp2_m);

CM_mutil(tmp2_m,n-1,m,adj_cr,1,cW);  /* this step is to get Z matrice */ free_matrix(tmp1_m,0,n-1-1,0,2*m-1);
    free_matrix(tmp2_m,0,n-1-1,0,2*m-1);

/* get -W matrix */
    for(j=0; j<n-1; j++){
      for(k=2*1; k<2*n; k++) {
        cW[j][k]=0.0;
      }
    }
    for(j=0; j<n-1; j++)
        cW[j][2*(1+j)] -= 1.0;

#if defined(DEBUG)
printf("\ncW : \n");
for(j=0; j<n-1; j++){
    for(k=0; k<2*n; k++)
        printf("%f, ",cW[j][k]);
    printf("\n");
}
endif /* reorder rows of eig_vct_TT */
    eig_vct_TTp=matrix(0,n-1,0,2*n-1);
    reorder_row(eig_vct_TT,n,2*n,index,1,eig_vct_TTp);
#if defined(DEBUG)
printf("\nreordered eig_vct_TT : \n");
for(j=0; j<n; j++){
    for(k=0; k<2*n; k++)
        printf("%f, ",eig_vct_TTp[j][k]);
    printf("\n");
}
endif /* get ((W(ET))+)(W(ET)) */
    tmp1_m=matrix(0,n-1-1,0,2*n-1);
    tmp2_m=matrix(0,n-1,0,2*n-1);

CM_mutil(cW,n-1,n,eig_vct_TTp,n,tmp1_m);
    CM_adjmutil(tmp1_m,n-1,n,tmp2_m);

#if defined(DEBUG)
printf("\n((W(ET))+)(W(ET)) : \n");
for(j=0; j<n; j++){
    for(k=0; k<2*n; k++)
        printf("%f, ",tmp2_m[j][k]);
    printf("\n");
}
endif for(j=0; j<n; j++)
        trc_wt += tmp2_m[j][2*j]*fabs(eig_vl_TT[j]);
/*  printf("\n wt trace %f",trc_wt);
    fflush(stdout);
*/

*trc_tot=ns_fct*trc_gr+trc_wt;

free_matrix(tmp1_m,0,n-1-1,0,2*n-1);
    free_matrix(tmp2_m,0,n-1,0,2*n-1);

free_matrix(cW,0,n-1-1,0,2*n-1);
    free_matrix(eig_vct_TTp,0,n-1,0,2*n-1);
    free_matrix(cRR,0,m-1,0,2*m-1);
```

```
        free_matrix(cQQ,0,m-1,0,2*m-1);
        free_matrix(eig_vct_RR,0,m-1,0,2*m-1);
        free_matrix(adj_eig_vct_RR,0,m-1,0,2*m-1);
        free_vector(eig_vl_RR,0,m-1);
        free_matrix(cr,0,l-1,0,2*m-1);
        free_matrix(adj_cr,0,m-1,0,2*l-1);
        free_matrix(cq,0,n-l-1,0,2*m-1);
} int
load_qr(cU,n,m,index,l,cr,cq)
float **cU,**cr,**cq;
int *index,n,m,l;
/* cU[0...n1][0...2*m-1], cr[0...l][0...2*m-1] and cq[0...n-l-1][0...2*m-1]
   are complex matrice. index[0...l-1] */
{
    int i,j,k,h;

i=0;
    j=0;
    h=0;
    while( h < n ) {
        if(i < l ) {
            if( h == (index[i]-1) ) {
                for(k=0; k<2*m; k++)
                    cr[i][k]=cU[h][k];
                i++;
            }
            else {
                for(k=0; k<2*m; k++) {
                    cq[j][k]=cU[h][k];
                }
                j++;
            }
        }
        else {
            for(k=0; k<2*m; k++) {
                cq[j][k]=cU[h][k];
            }
            j++;
        }
        h++;
    }
} int
reorder_row(rM,n,m,index,L,rMP)
float **rM,**rMP;
int n,m,L,*index;
/* input rM[0...n-1][0...n-1] real matrice   nXm
   and index[0...l-1] contained index in which l rows will put in first l rows
   output rMP[0...n-1][0...m-1] real matrice nXm reordered rows.
*/
{
    int j,k,l,nnl;

l=0;
    nnl=0;
    for(j=0; j<n; j++){
        if(j == (index[l]-1) ) {
            for(k=0; k<m; k++) {
                rMP[l][k]=rM[j][k];
            }
            l++;
        }
        else {
            for(k=0; k<m; k++) {
                rMP[L+nnl][k]=rM[j][k];
            }
            nnl++;
        }
    }
}
```

```
/*\\\\\\\\\\\\\\\\\\\\\\\\\\\\\\\\\\\\\\\\\\\\\\\////////////////////////////////// clm_recon_pm.c -- reconstruct 2-D images by feature-guided MR model input: eigen vectors of colume train matrice in including
                       # of columes and # of phase-encodings in bin file,
                       index from       train matrice
                       and Fourier components output reconed image by model compared with zero fill FT 5/10/92
/////////////////////////////////////////////////\\\\\\\\\\\\\\\\\\\\\\\\\\\\\\\\\
#include "paramtrc.h"

#define FACTOR      100.0
#define PHANTOM_FCT 65.0  /* 65.0 */
/*#define RAND_MAX  2.15e9 */
#define RAND_AMP    0.0   /* noise will be +/- rand_amp */
undef  DEBUG float ax,by;
main()
{
  float **ceig_vct_TT,**ct,**ct_rec,**ns_ct,**cAm,**cAr;
  float *err_pm,*err_ftzf;
  int num_clm,num_fenc,num_penc,m_dim,l_dim,num_rec,counter;
  int *mini_trace_index,fd,j,k,l,idumm;
  FILE *fp;
  char filename[200],flg[20],asc_flg[20];

ax=1.0;
  by=0.5;

/* read the number of columes and phase encoding steps at first,
     then colume eigen vectors */
  strcpy(filename,"clm_tm_eig.bin");

if( (fd=open(filename,O_RDONLY)) < 0 ) {
    fprintf(stderr,"%cERROR : file %s can not open to read\n",7,filename);
    exit(-1);
  }
  else
    fprintf(stderr,"\n%s opened for read\n",filename);

read(fd,&num_clm,sizeof(int));
  read(fd,&num_penc,sizeof(int));

num_clm /= num_penc;
  printf("\nnum of penc %d and num of nc %d",num_penc,num_clm);

ceig_vct_TT=matrix(0,num_clm*num_penc-1,0,2*num_penc-1);

read_cfbin(fd,ceig_vct_TT,num_clm*num_penc,num_penc);

/* chose m and L dimension */
  printf("\nEnter the choice of M -->");
  scanf("%d",&m_dim);
  printf("\nm dim is %d",m_dim);

l_dim=m_dim;

/* get configuration index */
  mini_trace_index=ivector(0,l_dim-1);
  read_index(mini_trace_index,l_dim);
```

```
printf("\nEnter the number of images to be reconstructed :");
scanf("%d",&num_rec);
printf("\nEnter 1 for ACSII format, 2 for BIN format : ");
scanf("%s",asc_flg);

err_pm=vector(0,num_rec-1);
err_ftzf=vector(0,num_rec-1);

idumm=-10;
ran1(&idumm);
counter=0;
while( counter < num_rec ) {
  /* set num of fenc */
  printf("\nEnter the filename of Fourier components -->");
  scanf("%s",filename);

if( asc_flg[0] == '1' ) {     /* acsii file */
    if( (fp=fopen(filename,"r")) ==NULL) {
      fprintf(stderr,"%cERROR : file %s can not open to read\n",7,filename);
      return(-1);
    }
    else
      fprintf(stderr,"\n%s opened for read\n",filename);
    fscanf(fp,"num_penc %d and num_fenc %d\n",&num_penc,&num_fenc);

/* get whole set of FOurier components*/
    ct=matrix(0,num_penc-1,0,2*num_fenc-1);

read_cfasc(fp,ct,num_penc,num_fenc);

}
  else {    /* bin files */ if( (fd=open(filename,O_RDONLY)) < 0 )
      printf("\nError: %s can't open ", filename);
    else
      printf("\n%s open to read",filename);

read(fd,&num_penc,sizeof(int));
    read(fd,&num_fenc,sizeof(int));

ct=matrix(0,num_penc-1,0,2*num_fenc-1);

read_cfbin(fd,ct,num_penc,num_fenc);

}

/* gerenate random noise */
  ns_ct=matrix(0,num_penc-1,0,2*num_fenc-1);
  srand(1749);
  for(j=0; j<num_penc; j++) {
    for(k=0; k<2*num_fenc; k++) { ns_ct[j][k]=ct[j][k]+RAND_AMP*gasdev(&idumm);
    }
  }

/* get cAm */
  cAm=matrix(0,l_dim-1,0,2*num_fenc-1);
  cAr=matrix(0,num_penc-l_dim-1,0,2*num_fenc-1);
  load_cr(ns_ct,num_penc,num_fenc,mini_trace_index,l_dim,cAm,cAr);

/* cAr will be calculated by colume training matrice */
  /* if num_clm < num_fenc, num_fenc/num_clm columes use one training matrix*/
  cal_clm_cAm_cAr(ceig_vct_TT,num_clm,num_penc,cAm,cAr,l_dim,num_fenc,mini_trac /* load cAm and cAr in ct_rec */
  ct_rec=matrix(0,num_penc-1,0,2*num_fenc-1);
  load_cA_ctrec(cAm,cAr,num_penc,num_fenc,mini_trace_index,l_dim,ct_rec);
```

```
Rec_image(ct_rec,num_penc,num_fenc);

/* recon image by 2d fft with l_dim phase encoding steps in the center */
ft_2d_image(ns_ct,num_penc,num_fenc,l_dim);

/* calculate discrepencies of image recon method */
dscrp_pm_ft(ct,ns_ct,ct_rec,num_penc,num_fenc,l_dim,
                &err_pm[counter],&err_ftzf[counter]);

printf("\nDo you want to plot Fourier components ?");
scanf("%s",flg);
if( flg[0] == 'y') {
  dspl_fc(ct,ct_rec,num_penc,num_fenc);
  system("vuim temp1.dat temp.dat -w 32 -h 16 -H 0 -d 2 -scale 8 &");
} counter++;

free_matrix(ct,0,num_penc-1,0,2*num_fenc-1);
free_matrix(ct_rec,0,num_penc-1,0,2*num_fenc-1);
free_matrix(ns_ct,0,num_penc-1,0,2*num_fenc-1);
free_matrix(cAm,0,l_dim-1,0,2*num_fenc-1);
free_matrix(cAr,0,num_penc-l_dim-1,0,2*num_fenc-1);

} /* end of while */ printf("\nDo you want to save error data ?");
scanf("%s",flg);
if( flg[0] == 'y') {
    write_ascii(err_pm,num_rec,1.0,(float)num_rec+1.0);
    system("mv temp.dat error_pm.dat &");
    sleep(1);
    write_ascii(err_ftzf,num_rec,1.0,(float)num_rec+1.0);
    system("mv temp.dat error_ftzf.dat &");
} free_matrix(ceig_vct_TT,0,num_clm*num_penc-1,0,2*num_penc-1);
free_ivector(mini_trace_index,0,l_dim-1);
free_vector(err_pm,0,num_rec-1);
free_vector(err_ftzf,0,num_rec-1);
  int cal_clm_cAm_cAr(ceig_vct_TT,nc,np,cAm,cAr,l_dim,nf,index,m_dim)
float ceig_vct_TT,cAm,**cAr;
int *index,nc,np,nf,l_dim,m_dim;
/* ceig_vct_TT[0...nc*np-1][0...2*np-1] eigen-vectors of clm training matrice
   cAm[0...l_dim-1][0...2*nf-1], cAr[0...np-l_dim-1][0...2*nf-1]
   index[0...l_dim-1]   */
{
  int j,k,l,i,group;
  float **cZ,**tmp_eig_vct;

tmp_eig_vct=matrix(0,np-1,0,2*np-1);

/* if nc < nf; nf/nc columes use on training matrix to recon */
  if( nc < nf)
    group=nf/nc;
  else
    group=1;

/* initializing cAr */
  for(j=0; j<np-l_dim; j++) {
    for(k=0; k<2*nf; k++)
      cAr[j][k]=0.0;
  }

/* calculate cAr by colume trainging matrice */
  cZ=matrix(0,np-l_dim-1,0,2*l_dim-1);
  for(l=0; l<nc; l++) {
    for(j=0; j<np; j++) {
```

```
      for(k=0; k<2*np; k++)  {
        tmp_eig_vct[j][k]=ceig_vct_TT[l*np+j][k];
      }
    }
    /* if */

/* get matrice cZ  */
    cllct_cz(tmp_eig_vct,np,cZ,l_dim,m_dim,index);
#if defined(DEBUG)
printf("\ncZ : \n");
for(j=0; j<num_penc-l_dim; j++) {
    for(k=0; k<l_dim; k++)
        printf("%f, %f, ",cZ[j][2*k],cZ[j][2*k+1]);
printf("\n");
}
endif /*calculate the l*gourp to (l+1)*group-1 columes of cAr */
    for(i=l*group; i<(l+1)*group; i++)
      Recon_cAr_clm(cZ,np-l_dim,l_dim,cAm,cAr,i);

} free_matrix(cZ,0,np-l_dim-1,0,2*l_dim-1);
  free_matrix(tmp_eig_vct,0,np-1,0,2*np-1);
} int
Recon_cAr_clm(cZ,np_rest,l_dim,cAm,cAr,l_clm)
float **cZ,**cAm,**cAr;
int np_rest,l_dim,l_clm;

/* input cZ[0...np_rest-1][0...2*l_dim-1] np_rest = np-1
         cAm[0...l_dim-1][0...2*nf-1]
   output cAr[0...np_rest-1][0...2*nf-1]
   the l_clm colume of cAr is calculated                    */
{ int ii,jj,kk;

for(ii=0; ii<np_rest; ii++) {
    for(kk=0; kk<l_dim; kk++) {
      cAr[ii][2*l_clm] += cZ[ii][2*kk]*cAm[kk][2*l_clm]-cZ[ii][2*kk+1]*
                          cAm[kk][2*l_clm+1];
      cAr[ii][2*l_clm+1] += cZ[ii][2*kk]*cAm[kk][2*l_clm+1]+cZ[ii][2*kk+1]*
                            cAm[kk][2*l_clm];
    }
  }
} int
load_cA_ctrec(cAm,cAr,np,nf,index,l,ct_rec)
float **cAm,**cAr,**ct_rec;
int np,nf,*index,l;
/* input cAm[0...l-1][0...2*nf-1] cAr[0...np-l-1][0...2*nf-1] index[0...l-1]
   output recon Fourier components */
{
  int hh,ii,jj,kk;

hh=0;
  for(jj=0; jj<np; jj++) {
      if(hh < l) {
         if(jj == (index[hh]-1) ) {
            for(kk=0; kk<nf; kk++) {
               ct_rec[jj][2*kk]=cAm[hh][2*kk];
               ct_rec[jj][2*kk+1]=cAm[hh][2*kk+1];
```

```
          }
          hh++;
        }
        else {
          for(kk=0; kk<nf; kk++) {
            ct_rec[jj][2*kk]=cAr[jj-hh][2*kk];
            ct_rec[jj][2*kk+1]=cAr[jj-hh][2*kk+1];
          }
        }
      }
      else {
        for(kk=0; kk<nf; kk++) {
          ct_rec[jj][2*kk]=cAr[jj-hh][2*kk];
          ct_rec[jj][2*kk+1]=cAr[jj-hh][2*kk+1];
        }
      }
    }
  }
} nt
 scrp_pm_ft(ct,ns_ct,ct_rec,np,nf,L,err_pm,err_ftzf)
float **ct,**ns_ct,**ct_rec,*err_pm,*err_ftzf;

int np,nf;
/* ct[0...np-1][0...2*nf-1], ct_rec[0...np-1][0...2*nf-1],
   ns_ct[0...np-1][0...2*nf-1]                              */
{
    float sum,diff_ftzf,diff_pm;
    int j,k,ii,hl,hh,hnp;

sum=0.0;
    for(j=0; j<np; j++) {
        for(k=0; k<nf; k++) {
            sum +=ct[j][2*k]*ct[j][2*k]+ct[j][2*k+1]*ct[j][2*k+1];
        }
    }

/* zero fill FT case */
    hl=(np-L)/2+(np-L)%2;
    hh=(np-L)/2;

diff_ftzf=0.0;
    for(j=0; j<hl; j++) {
        for(k=0; k<nf; k++) {
            diff_ftzf +=ct[j][2*k]*ct[j][2*k]+ct[j][2*k+1]*ct[j][2*k+1];
        }
    }
    for(j=hl; j<(np-hh); j++ ) {
        for(k=0; k<nf; k++) {
            diff_ftzf +=(ct[j][2*k]-ns_ct[j][2*k])*(ct[j][2*k]-ns_ct[j][2*k])+(ct[j]
        }
    }
    if( hh > 0 ) {
    for(j=(np-hh); j<np; j++) {
        for(k=0; k<nf; k++) {
            diff_ftzf +=ct[j][2*k]*ct[j][2*k]+ct[j][2*k+1]*ct[j][2*k+1];
        }
    }
    }

/* PM case */
    diff_pm=0.0;
    for(j=0; j<np; j++) {
        for(k=0; k<nf; k++) {
            diff_pm+=(ct_rec[j][2*k]-ct[j][2*k])*(ct_rec[j][2*k]-ct[j][2*k])+(ct_re
        }
    }
```

```
    *err_pm=sqrt(diff_pm/sum);
    *err_ftzf=sqrt(diff_ftzf/sum);

printf("\ndiscrepency: PM %f, FTZF %f \n",*err_pm,*err_ftzf);

} int
ft_2d_image(ct,np,nf,L)
float **ct;
int np,nf,L;
/* ct[0...np-1][0...2*nf-1] Fourier components
   image will be generated by 2d fft with L phase encode steps in the center
   and zero_fill to np
*/

{
    float *tmp_data;      /* 2d complex data */
    int lh,hh,ii,jj,kk,*nn;
    short image_arr[MAX_FFT_YPNT][MAX_FFT_XPNT];

tmp_data=vector(0,2*np*nf-1);    /* 2D complex data */
    nn=ivector(1,2);

nn[1]=np;
    nn[2]=nf;

/* load L of phase encode steps of ct in the center of tmp_data */
    lh=(np-L)/2+(np-L)%2;
    hh=(np-L)/2 ;
    for(jj=0; jj<lh; jj++) {
        for(kk=0; kk<nf; kk++) {
            ii=jj*2*nf+2*kk;
            tmp_data[ii]=0.0;
            tmp_data[ii+1]=0.0;
        }
    }
    for(jj=lh; jj<(np-hh); jj++) {
        for(kk=0; kk<nf; kk++) {
            ii=jj*2*nf+2*kk;
            tmp_data[ii]=ct[jj][2*kk];
            tmp_data[ii+1]=ct[jj][2*kk+1];
        }
    }
    if( hh > 0 ) {
        for(jj=(np-hh); jj<np; jj++) {
            for(kk=0; kk<nf; kk++) {
                ii=jj*2*nf+2*kk;
                tmp_data[ii]=0.0;
                tmp_data[ii+1]=0.0;
            }
        }
    }

/* reverse 2D fft */
    fourn(tmp_data-1,nn,2,1);    /* 2d fft */
    rotation_2d(tmp_data,nn);    /* 2d rotation */

/* load in image */
    for(jj=0; jj<np; jj++) {
        for(kk=0; kk<nf; kk++) {
            ii=jj*2*nf+2*kk;
            image_arr[jj][kk]=(short)(sqrt(tmp_data[ii]*tmp_data[ii]+tmp_data[ii+1]*
        }
    }
```

```c
    save_sint(image_arr,np,nf);
    sleep(1);
    system("vuim temp1.dat temp.dat -w 32 -h 16 -H 0 -d 2 -scale 8 &");

free_vector(tmp_data,0,2*np*nf-1);
    free_ivector(nn,1,2);
int
Rec_image(ct_rec,np,nf)
float **ct_rec;
int np,nf;
/* input ct_rec[0...np-1][0...2*nf-1] in x-ky configuration
   output recon image */
{
    float *tmp_data;
    int ii,jj,kk,*nn;
    short image_arr[MAX_FFT_YPNT][MAX_FFT_XPNT];

tmp_data=vector(0,2*np*nf-1);    /* 2 complex data */
    nn=ivector(1,2);

nn[1]=np;
    nn[2]=nf;

/* load ct_rec in tmp_data */
    for(jj=0; jj<np; jj++) {
        for(kk=0; kk<nf; kk++) {
            ii=jj*2*nf+2*kk;
            tmp_data[ii]=ct_rec[jj][2*kk];
            tmp_data[ii+1]=ct_rec[jj][2*kk+1];
        }
    }

/* reverse 2D fft */
    fourn(tmp_data-1,nn,2,1);    /* 2d fft */
    rotation_2d(tmp_data,nn);    /* 2d rotation */

/* load in image */
    for(jj=0; jj<np; jj++) {
        for(kk=0; kk<nf; kk++) {
            ii=jj*2*nf+2*kk;
            image_arr[jj][kk]=(short)(sqrt(tmp_data[ii]*tmp_data[ii]+
                    tmp_data[ii+1]*tmp_data[ii+1])/sqrt(4.0*ax*by)/PHANTOM_FCT);
        }
    } save_sint(image_arr,np,nf);
    sleep(1);
/*  system("vuim temp.dat -w 32 -h 16 -H 0 -d 2 -scale 8 &"); */
    system("mv temp.dat temp1.dat &");
    sleep(1);

free_vector(tmp_data,0,2*np*nf-1);
    free_ivector(nn,1,2);
} int
read_index(index,l)
int *index,l;            /* index[0...l-1]  */
    FILE *fp;
    char filename[200];

int j;
```

```
    printf("\nEnter the filename of index of mini trace -->");
    scanf("%s",filename);
    if( (fp=fopen(filename,"r")) ==NULL) {
       fprintf(stderr,"%cERROR : file %s can not open to read\n",7,filename);
       return(-1);
    }
    else
       fprintf(stderr,"\n%s opened for read\n",filename);

for(j=0; j<l; j++)
       fscanf(fp,"%d ",&index[j]);

fclose(fp);

for(j=0; j<l; j++)
       index[j] +=1;

} int
cllct_cz(eig_vct_TT,n,cZ,l,m,index)
float **eig_vct_TT,**cZ;
int *index,n,l,m;
/* input eig_vct_TT[0...n-1][0...2*n-1],index[0...l-1]
   output cZ[0...n-1][0...2*l-1]  */
{ float cr,cq,cRR,adj_cr,**eig_vct_RR,*eig_vl_RR,**adj_eig_vct_RR;
   float tmp1_m,tmp2_m;
   int j,k;

cr=matrix(0,l-1,0,2*m-1);         /* lXm  complex matrix */
   adj_cr=matrix(0,m-1,0,2*l-1);     /* mXl  complex matrix */
   cq=matrix(0,n-l-1,0,2*m-1);       /* (n-l)Xm complex matrix */
   cRR=matrix(0,m-1,0,2*m-1);        /* mXm  complex Hermitian matrix */
   eig_vl_RR=vector(0,m-1);          /* m dim real vector */
   eig_vct_RR=matrix(0,m-1,0,2*m-1);         /* mXm  complex matrix */
   adj_eig_vct_RR=matrix(0,m-1,0,2*m-1);     /* mXm  complex matrix */
   tmp1_m=matrix(0,n-l-1,0,2*m-1);
   tmp2_m=matrix(0,n-l-1,0,2*m-1);

/* load cr and cq */
   load_qr(eig_vct_TT,n,m,index,l,cr,cq);
#if defined(DEBUG)
printf("\ncr :");
for(j=0; j<l; j++) {
for(k=0; k<m; k++) {
    printf("%f, %f, ",cr[j][2*k],cr[j][2*k+1]);
    }
printf("\n");
}
endif /* get adj_cr and cRR = (R+)R, mXm matrix */
   CM_adj(cr,adj_cr,l,m);
   CM_adjmutil(cr,l,m,cRR);
   /* scale cRR by FACTOR */ for(j=0; j<m; j++) {
    for(k=0; k<2*m; k++) {
       cRR[j][k] *= FACTOR;
    }
   }

/* get eigen values and eigen functions of cRR */
   eigen_hm(cRR,m,m,eig_vl_RR,eig_vct_RR);
```

```
/* get adjoint of eig_vct_RR */
CM_adj(eig_vct_RR,adj_eig_vct_RR,m,m);

/* scale eigen values of RR by 1/FACTOR */
for(j=0; j<m; j++) {
    eig_vl_RR[j] /= FACTOR;     /* eig_vl_RR has right factor now */
}

/* clacu1ate cZ */
CM_muti1(cq,n-1,m,eig_vct_RR,m,tmp1_m);         /* (cq)(eig_vct_RR)     */ for(k=0; k<m; k++) {                            /* (cq)(eig_vct_RR)(1/eig_vl_RR) */
    for(j=0; j<(n-1); j++) {
        tmp1_m[j][2*k] /= eig_vl_RR[k];
        tmp1_m[j][2*k+1] /= eig_vl_RR[k];
    }
}

CM_muti1(tmp1_m,n-1,m,adj_eig_vct_RR,m,tmp2_m); /* (cq)(eig_vct_RR)
                                                   X(1/eig_vl_RR)(adj_eig_vct_RR) */

CM_muti1(tmp2_m,n-1,m,adj_cr,1,cZ); /* (cq)(eig_vct_RR)(1/eig_vl_RR)
                                       x(adj_eig_vct_RR)(adj_cr)          */ free_matrix(tmp1_m,0,n-1-1,0,2*m-1);
free_matrix(tmp2_m,0,n-1-1,0,2*m-1);
free_matrix(cr,0,l-1,0,2*m-1);
free_matrix(cq,0,n-1-1,0,2*m-1);
free_matrix(cRR,0,m-1,0,2*m-1);
free_matrix(eig_vct_RR,0,m-1,0,2*m-1);
free_matrix(adj_eig_vct_RR,0,m-1,0,2*m-1);
free_matrix(adj_cr,0,m-1,0,2*1-1);
free_vector(eig_vl_RR,0,m-1);

} int
load_qr(cU,n,m,index,l,cr,cq)
float **cU,**cr,**cq;
int *index,n,m,l;
/* cU[0...n1][0...2*m-1], cr[0...l][0...2*m-1] and cq[0...n-1-1][0...2*m-1]
   are complex matrice. index[0...l-1] */
{
  int i,j,k,h;

i=0;
  j=0;
  h=0;
  while( h < n ) {
    if(i < l ) {
      if( h == (index[i]-1) ) { for(k=0; k<2*m; k++)
         cr[i][k]=cU[h][k];
         i++;
      }
      else {
        for(k=0; k<2*m; k++) {
           cq[j][k]=cU[h][k];
        }
        j++;
      }
    }
    else {
      for(k=0; k<2*m; k++) {
         cq[j][k]=cU[h][k];
      }
      j++;
```

```
        }
      h++;
   }

} int
reorder_row(rM,n,m,index,L,rMP)
float **rM,**rMP;
int n,m,L,*index;
/* input rM[0...n-1][0...m-1] real matrice   nXm
   and index[0...l-1] contained index in which l rows will put in first l rows
   output rMP[0...n-1][0...m-1] real matrice nXm reordered rows.
*/
{
   int j,k,l,nl;

l=0;
   nl=0;
   for(j=0; j<n; j++){
      if(j == (index[l]-1) ) {
         for(k=0; k<m; k++) {
              rMP[l][k]=rM[j][k];
         }
         l++;
      }
      else {
         for(k=0; k<m; k++) {
              rMP[L+nl][k]=rM[j][k];
         }
         nl++;
      }
   }

}

/*\\\\\\\\\\\\\\\\\\\\\\\\\\\\\\\\\\\\\\\\\\\\\\//////////////////////////////////////// paramtrc.h -- used by tn_mtrx.c

////////////////////////////////////////////////\\\\\\\\\\\\\\\\\\\\\\\\\\\\\\\\\\\\\\\\*/
#include <stdio.h>
include <fcntl.h>
#include <math.h>
#include <nr.h>
#include <nrutil.h>
/**#include "complex.h"*/ define SGN(a)      ((a)>0 ? (1):(-1))
define MAX(a,b)    ((a)>(b) ? (a):(b))
#define MIN(a,b)    ((a)<(b) ? (a):(b))

#define PI          3.14159265
#define FLT_PRSN       1e-7
define DBL_PRSN       1e-16 define MAX_FENC     32
define MAX_PENC     16
#define MAX_FFT_XPNT 32
define MAX_FFT_YPNT 16 define M_DIM         10
define L_DIM          6 typedef unsigned short Image;

fcomplex **cmatrix();
void free_cmatrix();
void jacobi_yr();

include <math.h> define SWAP(a,b) tempr=(a);(a)=(b);(b)=tempr
```

```
void fourn(data,nn,ndim,isign)
float data[];
int nn[],ndim,isign;
{
        int i1,i2,i3,i2rev,i3rev,ip1,ip2,ip3,ifp1,ifp2;
        int ibit,idim,k1,k2,n,nprev,nrem,ntot;
        float tempi,tempr;
        double theta,wi,wpi,wpr,wr,wtemp;

ntot=1;
        for (idim=1;idim<=ndim;idim++)
                ntot *= nn[idim];
        nprev=1;
        for (idim=ndim;idim>=1;idim--) {
                n=nn[idim];
                nrem=ntot/(n*nprev);
                ip1=nprev << 1;
                ip2=ip1*n;
                ip3=ip2*nrem;
                i2rev=1;
                for (i2=1;i2<=ip2;i2+=ip1) {
                        if (i2 < i2rev) {
                                for (i1=i2;i1<=i2+ip1-2;i1+=2) {
                                        for (i3=i1;i3<=ip3;i3+=ip2) {
                                                i3rev=i2rev+i3-i2;
                                                SWAP(data[i3],data[i3rev]);
                                                SWAP(data[i3+1],data[i3rev+1]);
                                        }
                                }
                        }
                        ibit=ip2 >> 1;
                        while (ibit >= ip1 && i2rev > ibit) {
                                i2rev -= ibit;
                                ibit >>= 1;
                        }
                        i2rev += ibit;
                }
                ifp1=ip1;
                while (ifp1 < ip2) {
                        ifp2=ifp1 << 1;
                        theta=isign*6.28318530717959/(ifp2/ip1);
                        wtemp=sin(0.5*theta);
                        wpr = -2.0*wtemp*wtemp;
                        wpi=sin(theta);
                        wr=1.0;
                        wi=0.0;
                        for (i3=1;i3<=ifp1;i3+=ip1) {
                                for (i1=i3;i1<=i3+ip1-2;i1+=2) {
                                        for (i2=i1;i2<=ip3;i2+=ifp2) {
                                                k1=i2;
                                                k2=k1+ifp1;
                                                tempr=wr*data[k2]-wi*data[k2+1];
                                                tempi=wr*data[k2+1]+wi*data[k2];
                                                data[k2]=data[k1]-tempr;
                                                data[k2+1]=data[k1+1]-tempi;
                                                data[k1] += tempr;
                                                data[k1+1] += tempi;
                                        }
                                }
                                wr=(wtemp=wr)*wpr-wi*wpi+wr;
                                wi=wi*wpr+wtemp*wpi+wi;
                        }
                        ifp1=ifp2;
                }
                nprev *= n;
        }
}
#undef SWAP
```

```
void eigsrt(d,v,n)
float d[],**v;
int n;
{
        int k,j,i;
        float p;

for (i=1;i<n;i++) {
                k=i;
                p=d[i];
                for (j=i+1;j<=n;j++) {
                        if (d[j] >= p) {
                                k=j;
                                p=d[j];
                        }
                }
                if (k != i) {
                        d[k]=d[i];
                        d[i]=p;
                        for (j=1;j<=n;j++) {
                                p=v[j][i];
                                v[j][i]=v[j][k];
                                v[j][k]=p;
                        }
                }
        }
} typedef struct FCOMPLEX {float r,i;} fcomplex;
typedef struct IMMENSE {unsigned long l,r;} immense;
typedef struct GREAT {unsigned short l,c,r;} great;

#define TRADITIONAL 1   /* but leave LINT_ARGS and ANSI undefined */
#ifdef LINT_ARGS
        void adi(double **, double **, double **, double **,
                double **, double **, double **, double **,
                int, int, double, double, double);
        void amoeba(float **, float *, int, float, float (*)(), int *);
        void anneal(float *, float *, int *, int);
        void avevar(float *, int, float *, float *);
        void balanc(float **, int);
        void bcucof(float *, float *, float *, float *, float,
                float, float **);
        void bcuint(float *, float *, float *, float *, float,
                float, float, float, float, float, float *,
                float *, float *);
        float bessi(int, float);
        float bessi0(float);
        float bessi1(float);
        float bessj(int, float);
        float bessj0(float);
        float bessj1(float);
        float bessk(int, float);
        float bessk0(float);
        float bessk1(float);
        float bessy(int, float);
        float bessy0(float);
        float bessy1(float);
        float beta(float, float);
        float betacf(float, float, float);
        float betai(float, float, float);
        float bico(int, int);
        void bksub(int, int, int, int, int, float ***);
        float bnldev(float, int, int *);
        float brent(float, float, float, float (*)(), float, float *);
        void bsstep(float *, float *, int, float *, float,
                float, float *, float *, float *, void (*)());
        void caldat(long, int *, int *, int *);
        float cel(float, float, float, float);
        void chder(float, float, float *, float *, int);
        float chebev(float, float, float *, int, float);
        void chebft(float, float, float *, int, float (*)());
        void chebpc(float *, float *, int);
        void chint(float, float, float *, float *, int);
```

```
void chsone(float *, float *, int, int, float *,
        float *, float *);
void chstwo(float *, float *, int, int, float *,
        float *, float *);
void cntab1(int **, int, int, float *, float *,
        float *, float *, float *);
void cntab2(int **, int, int, float *, float *,
        float *, float *, float *, float *, float *, float *);
void convlv(float *, int, float *, int, int, float *);
void correl(float *, float *, int, float *);
void cosft(float *, int, int);
void covsrt(float **, int, int *, int);
void crank(int, float *, float *);
float dbrent(float, float, float, float (*)(), float (*)(),
        float, float *);
void dcpoly(float *, int, float, float *, int);
void des(immense, immense, int *, int, immense *);
void ks(immense, int, great *);
void cyfun(unsigned long, great, unsigned long *);
float df1dim(float);
void dfpmin(float *, int, float, int *, float *, float (*)(),
        void (*)());
void difeq(int, int, int, int, int, int, int *, int,
        float **, float **);
void dlinmin(float *, float *, int, float *, float (*)(), void (*)());
void eclass(int *, int, int *, int *, int);
void eclazz(int *, int, int (*)());
void eigsrt(float *, float **, int);
float el2(float, float, float, float);
void elmhes(float **, int);
float erf(float);
float erfc(float);
float erfcc(float);
void eulsum(float *, float, int, float *);
float evlmem(float, float *, int, float);
float expdev(int *);
float f1dim(float);
float factln(int);
float factrl(int);
void fgauss(float, float *, float *, float *, int);
void fit(float *, float *, int, float *, int, float *,
        float *, float *, float *, float *, float *);
void fixrts(float *, int);
void fleg(float, float *, int);
void flmoon(int, int, long *, float *);
void four1(float *, int, int);
void fourn(float *, int *, int, int);
void fpoly(float, float *, int);
void frprmn(float *, int, float, int *, float *, float (*)(),
        void (*)());
void ftest(float *, int, float *, int, float *, float *);
float gamdev(int, int *);
float gammln(float);
float gammp(float, float);
float gammq(float, float);
float gasdev(int *);
void gauleg(double, double, double *, double *, int);
void gaussj(float **, int, float **, int);
void gcf(float *, float, float, float *);
float golden(float, float, float, float (*)(), float, float *);
void gser(float *, float, float, float *);
void hqr(float **, int, float *, float *);
void hunt(float *, int, float, int *);
void indexx(int, float *, int *);
int irbit1(unsigned long int *);
int irbit2(unsigned long int *);
void jacobi(float **, int, float *, float **, int *);
long julday(int, int, int);
void kendl1(float *, float *, int, float *, float *, float *);
void kendl2(float **, int, int, float *, float *, float *);
void ksone(float *, int, float (*)(), float *, float *);
void kstwo(float *, int, float *, int, float *, float *);
void laguer(fcomplex *, int, fcomplex *, float, int);
void lfit(float *, float *, float *, int, float *, int,
```

```
        int *, int, float **, float *, void (*)());
void linmin(float *, float *, int, float *, float (*)());
void locate(float *, int, float, int *);
void lubksb(float **, int, int *, float *);
void ludcmp(float **, int, int *, float *);
void mdian1(float *, int, float *);
void mdian2(float *, int, float *);
void medfit(float *, float *, int, float *, float *, float *);
void memcof(float *, int, int, float *, float *);
float midexp(float (*)(), float, float, int);
float midinf(float (*)(), float, float, int);
float midpnt(float (*)(), float, float, int);
float midsql(float (*)(), float, float, int);
float midsqu(float (*)(), float, float, int);
void mmid(float *, float *, int, float, float, int, float *,
        void (*)());
void mnbrak(float *, float *, float *, float *,
        float *, float *, float (*)());
void mnewt(int, float *, int, float, float);
void moment(float *, int, float *, float *, float *,
        float *, float *, float *);
void mprove(float **, float **, int, int *, float *, float *);
void mrqcof(float *, float *, float *, int, float *, int,
        int *, int, float **, float *, float *, void (*)());
void mrqmin(float *, float *, float *, int, float *, int,
        int *, int, float **, float **, float *, void (*)(),
        float *);
void odeint(float *, int, float, float, float, float,
        float, int *, int *, void (*)(), void (*)());
void pcshft(float, float, float *, int);
void pearsn(float *, float *, int, float *, float *, float *);
void piksr2(int, float *, float *);
void piksrt(int, float *);
void pinvs(int, int, int, int, int, int, float ***, float **);
float plgndr(int, int, float);
float poidev(float, int *);
void polcoe(float *, float *, int, float *);
void polcof(float *, float *, int, float *);
void poldiv(float *, int, float *, int, float *, float *);
void polin2(float *, float *, float **, int, int, float,
        float, float *, float *);
void polint(float *, float *, int, float, float *, float *);
void powell(float *, float **, int, float, int *, float *, float (*)());
void predic(float *, int, float *, int, float *, int);
float probks(float);
void pzextr(int, float, float *, float *, float *, int, int);
void qcksrt(int, float *);
float qgaus(float (*)(float), float, float);
float qromb(float (*)(float), float, float);
float qromo(float (*)(float), float, float, float (*)());
void qroot(float *, int, float *, float *, float);
float qsimp(float (*)(float), float, float);
float qtrap(float (*)(float), float, float);
float quad3d(float (*)(float), float, float);
float ran0(int *);
float ran1(int *);
float ran2(long *);
float ran3(int *);
float ran4(int *);
void rank(int, int *, int *);
void ratint(float *, float *, int, float, float *, float *);
void realft(float *, int, int);
void red(int, int, int, int, int, int, int, int, int, int,
        int, float ***, float **);
void rk4(float *, float *, int, float, float, float *, void (*)());
void rkdumb(float *, int, float, float, int, void (*)());
void rkqc(float *, float *, int, float *, float, float,
        float *, float *, float *, void (*)());
float rofunc(float);
float rtbis(float (*)(), float, float, float);
float rtflsp(float (*)(), float, float, float);
float rtnewt(void (*)(), float, float, float);
float rtsafe(void (*)(), float, float, float);
float rtsec(float (*)(), float, float, float);
```

```c
    void rzextr(int, float, float *, float *, float *, int, int);
    void scrsho(float (*)());
    void shell(int, float *);
    void shoot(int, float *, float *, int, float, float, float,
        float, float, float *, float *);
    void shootf(int, float *, float *, float *, float *, int, int,
        float, float, float, float, float, float, float *,
        float *, float *);
    void simp1(float **, int, int *, int, int, int *, float *);
    void simp2(float **, int, int *, int, int *, int, float *);
    void simp3(float **, int, int, int, int);
    void simplx(float **, int, int, int, int, int,
        int *, int *, int *);
    void sinft(float *, int);
    void smooft(float *, int, float);
    void sncndn(float, float, float *, float *, float *);
    void solvde(int, float, float, float *, int *, int, int,
        int, float **, float ***, float **);
    void sor(double **, double **, double **, double **, double **,
        double **, double **, int, double);
    void sort(int, float *);
    void sort2(int, float *, float *);
    void sort3(int, float *, float *, float *);
    void sparse(float *, int, float *, float *);
    void spctrm(FILE *, float *, int, int, int);
    void spear(float *, float *, int, float *,
        float *, float *, float *);
    void splie2(float *, float *, float **, int, int, float **);
    void splin2(float *, float *, float **, float **, int, int,
        float, float, float *);
    void spline(float *, float *, int, float, float, float *);
    void splint(float *, float *, float *, int, float, float *);
    void svbksb(float **, float *, float **, int, int,
        float *, float *);
    void svdcmp(float **, int, int, float *, float **);
    void svdfit(float *, float *, float *, int, float *, int,
        float **, float **, float *, float *, void (*)());
    void svdvar(float **, int, float *, float **);
    void toeplz(float *, float *, float *, int);
    void totest(float *, float *, int, float *, float *);
    void tqli(float *, float *, int, float **);
    float trapzd(float (*)(float), float, float, int);
    void tred2(float **, int, float *, float *);
    void tridag(float *, float *, float *, float *, float *, int);
    void ttest(float *, int, float *, int, float *, float *);
    void tutest(float *, int, float *, int, float *, float *);
    void twofft(float *, float *, float *, float *, int);
    void vander(float *, float *, float *, int);
    int zbrac(float (*)(), float *, float *);
    void zbrak(float (*)(), float, float, int, float *, float *, int *);
    float zbrent(float (*)(), float, float, float);
    void zroots(fcomplex *, int, fcomplex *, int);
#endif
#ifdef ANSI
    void adi(double **a, double **b, double **c, double **d, double **e,
        double **f, double **g, double **u, int jmax, int k,
        double alpha, double beta, double eps);
    void amoeba(float **p, float *y, int ndim, float ftol,
        float (*funk)(float *), int *iter);
    void anneal(float *x, float *y, int *iorder, int ncity);
    void avevar(float *data, int n, float *ave, float *svar);
    void balanc(float **a, int n);
    void bcucof(float *y, float *y1, float *y2, float *y12, float d1,
        float d2, float **c);
    void bcuint(float *y, float *y1, float *y2, float *y12, float x1l,
        float x1u, float x2l, float x2u, float x1, float x2,
        float *ansy, float *ansy1, float *ansy2);
    float bessi(int n, float x);
    float bessi0(float x);
    float bessi1(float x);
    float bessj(int n, float x);
    float bessj0(float x);
    float bessj1(float x);
    float bessk(int n, float x);
```

```
float   bessk0(float x);
float   bessk1(float x);
float   bessy(int n, float x);
float   bessy0(float x);
float   bessy1(float x);
float   beta(float z, float w);
float   betacf(float a, float b, float x);
float   betai(float a, float b, float x);
float   bico(int n, int k);
void    bksub(int ne, int nb, int jf, int k1, int k2, float ***c);
float   bnldev(float pp, int n, int *idum);
float   brent(float ax, float bx, float cx, float (*f)(float), float tol,
            float *xmin);
void    bsstep(float *y, float *dydx, int nv, float *xx, float htry,
            float eps, float *yscal, float *hdid, float *hnext,
            void (*derivs)(float,float *,float *));
void    caldat(long julian, int *mm, int *id, int *iyyy);
float   cel(float qqc, float pp, float aa, float bb);
void    chder(float a, float b, float *c, float *cder, int n);
float   chebev(float a, float b, float *c, int m, float x);
void    chebft(float a, float b, float *c, int n, float (*func)(float));
void    chebpc(float *c, float *d, int n);
void    chint(float a, float b, float *c, float *cint, int n);
void    chsone(float *bins, float *ebins, int nbins, int knstrn,
            float *df, float *chsq, float *prob);
void    chstwo(float *bins1, float *bins2, int nbins, int knstrn,
            float *df, float *chsq, float *prob);
void    cntab1(int **nn, int ni, int nj, float *chisq, float *df,
            float *prob, float *cramrv, float *ccc);
void    cntab2(int **nn, int ni, int nj, float *h, float *hx, float *hy,
            float *hygx, float *hxgy, float *uygx, float *uxgy,
            float *uxy);
void    convlv(float *data, int n, float *respns, int m, int isign,
            float *ans);
void    correl(float *data1, float *data2, int n, float *ans);
void    cosft(float *y, int n, int isign);
void    covsrt(float **covar, int ma, int *lista, int mfit);
void    crank(int n, float *w, float *s);
float   dbrent(float ax, float bx, float cx, float (*f)(float),
            float (*df)(float), float tol, float *xmin);
void    ddpoly(float *c, int nc, float x, float *pd, int nd);
void    des(immense inp, immense key, int *newkey, int isw, immense *out);
void    ks(immense key, int n, great *kn);
void    cyfun(unsigned long ir, great k, unsigned long *iout);
float   df1dim(float x);
void    dfpmin(float *p, int n, float ftol, int *iter, float *fret,
            float (*func)(float *), void (*dfunc)(float *,float *));
void    difeq(int k, int k1, int k2, int jsf, int is1, int isf,
            int *indexv, int ne, float **s, float **y);
void    dlinmin(float *p, float *xi, int n, float *fret,
            float (*func)(float *), void (*dfunc)(float *,float *));
void    eclass(int *nf, int n, int *lista, int *listb, int m);
void    eclazz(int *nf, int n, int (*equiv)(int,int));
void    eigsrt(float *d, float **v, int n);
float   el2(float x, float qqc, float aa, float bb);
void    elmhes(float **a, int n);
float   erf(float x);
float   erfc(float x);
float   erfcc(float x);
void    eulsum(float *sum, float term, int jterm, float *wksp);
float   evlmem(float fdt, float *cof, int m, float pm);
float   expdev(int *idum);
float   f1dim(float x);
float   factln(int n);
float   factrl(int n);
void    fgauss(float x, float *a, float *y, float *dyda, int na);
void    fit(float *x, float *y, int ndata, float *sig, int mwt, float *a,
            float *b, float *siga, float *sigb, float *chi2, float *q);
void    fixrts(float *d, int npoles);
void    fleg(float x, float *pl, int nl);
void    flmoon(int n, int nph, long *jd, float *frac);
void    four1(float *data, int nn, int isign);
void    fourn(float *data, int *nn, int ndim, int isign);
```

```
void    fpoly(float x, float *p, int np);
void    frprmn(float *p, int n, float ftol, int *iter, float *fret,
               float (*func)(float *), void (*dfunc)(float *,float *));
void    ftest(float *data1, int n1, float *data2, int n2, float *f,
              float *prob);
float   gamdev(int ia, int *idum);
float   gammln(float xx);
float   gammp(float a, float x);
float   gammq(float a, float x);
float   gasdev(int *idum);
void    gauleg(double x1, double x2, double *x, double *w, int n);
void    gaussj(float **a, int n, float **b, int m);
void    gcf(float *gammcf, float a, float x, float *gln);
float   golden(float ax, float bx, float cx, float (*f)(float), float tol,
               float *xmin);
void    gser(float *gamser, float a, float x, float *gln);
void    hqr(float **a, int n, float *wr, float *wi);
void    hunt(float *xx, int n, float x, int *jlo);
void    indexx(int n, float *arrin, int *indx);
int     irbit1(unsigned long int *iseed);
int     irbit2(unsigned long int *iseed);
void    jacobi(float **a, int n, float *d, float **v, int *nrot);
long    julday(int mm, int id, int iyyy);
void    kendl1(float *data1, float *data2, int n, float *tau, float *z,
               float *prob);
void    kendl2(float **tab, int i, int j, float *tau, float *z,
               float *prob);
void    ksone(float *data, int n, float (*func)(float), float *d,
              float *prob);
void    kstwo(float *data1, int n1, float *data2, int n2, float *d,
              float *prob);
void    laguer(fcomplex *a, int m, fcomplex *x, float eps, int polish);
void    lfit(float *x, float *y, float *sig, int ndata, float *a, int ma,
             int *lista, int mfit, float **covar, float *chisq,
             void (*funcs)(float,float *,int));
void    linmin(float *p, float *xi, int n, float *fret, float (*func)(floa
void    locate(float *xx, int n, float x, int *j);
void    lubksb(float **a, int n, int *indx, float *b);
void    ludcmp(float **a, int n, int *indx, float *d);
void    mdian1(float *x, int n, float *xmed);
void    mdian2(float *x, int n, float *xmed);
void    medfit(float *x, float *y, int ndata, float *a, float *b,
               float *abdev);
void    memcof(float *data, int n, int m, float *pm, float *cof);
float   midexp(float (*funk)(float), float aa, float bb, int n);
float   midinf(float (*funk)(float), float aa, float bb, int n);
float   midpnt(float (*func)(float), float a, float b, int n);
float   midsql(float (*funk)(float), float aa, float bb, int n);
float   midsqu(float (*funk)(float), float aa, float bb, int n);
void    mmid(float *y, float *dydx, int nvar, float xs, float htot,
             int nstep, float *yout,
             void (*derivs)(float,float *,float *));
void    mnbrak(float *ax, float *bx, float *cx, float *fa, float *fb,
               float *fc, float (*func)(float));
void    mnewt(int ntrial, float *x, int n, float tolx, float tolf);
void    moment(float *data, int n, float *ave, float *adev, float *sdev,
               float *svar, float *skew, float *curt);
void    mprove(float **a, float **alud, int n, int *indx, float *b,
               float *x);
void    mrqcof(float *x, float *y, float *sig, int ndata, float *a, int ma
               int *lista, int mfit, float **alpha, float *beta, float
               *chisq, void (*funcs)(float,float *,float *,int));
void    mrqmin(float *x, float *y, float *sig, int ndata, float *a,
               int ma, int *lista, int mfit, float **covar, float **alpha,
               float *chisq, void (*funcs)(float,float *,float *,float *,
               int),float *alamda);
void    odeint(float *ystart, int nvar, float x1, float x2, float eps,
               float h1, float hmin, int *nok, int *nbad,
               void (*derivs)(float,float *,float *),
               void (*rkqc)(float *,float *,int,float *,float,float,float
               *,float *,float *,void (*)(float,float *,float *)));
void    pcshft(float a, float b, float *d, int n);
void    pearsn(float *x, float *y, int n, float *r, float *prob, float *z)
```

```
void    piksr2(int n, float *arr, float *brr);
void    piksrt(int n, float *arr);
void    pinvs(int ie1, int ie2, int je1, int jsf, int jc1, int k,
            float ***c, float **s);
float   plgndr(int l, int m, float x);
float   poidev(float xm, int *idum);
void    polcoe(float *x, float *y, int n, float *cof);
void    polcof(float *xa, float *ya, int n, float *cof);
void    poldiv(float *u, int n, float *v, int nv, float *q, float *r);
void    polin2(float *x1a, float *x2a, float **ya, int m, int n, float x1,
            float x2, float *y, float *dy);
void    polint(float *xa, float *ya, int n, float x, float *y, float *dy);
void    powell(float *p, float **xi, int n, float ftol, int *iter,
            float *fret, float (*func)(float *));
void    predic(float *data, int ndata, float *d, int npoles,
            float *future, int nfut);
float   probks(float alam);
void    pzextr(int iest, float xest, float *yest, float *yz, float *dy,
            int nv, int nuse);
void    qcksrt(int n, float *arr);
float   qgaus(float (*func)(float), float a, float b);
float   qromb(float (*func)(float), float a, float b);
float   qromo(float (*func)(float), float a, float b,
            float (*choose)(float (*)(float),float,float,int));
void    qroot(float *p, int n, float *b, float *c, float eps);
float   qsimp(float (*func)(float), float a, float b);
float   qtrap(float (*func)(float), float a, float b);
float   quad3d(float (*func)(float,float,float), float x1, float x2);
float   ran0(int *idum);
float   ran1(int *idum);
float   ran2(long *idum);
float   ran3(int *idum);
float   ran4(int *idum);
void    rank(int n, int *indx, int *irank);
void    ratint(float *xa, float *ya, int n, float x, float *y, float *dy);
void    realft(float *data, int n, int isign);
void    red(int iz1, int iz2, int jz1, int jz2, int jm1, int jm2, int jmf,
            int ic1, int jc1, int jcf, int kc, float ***c, float **s);
void    rk4(float *y, float *dydx, int n, float x, float h, float *yout,
            void (*derivs)(float,float *,float *));
void    rkdumb(float *vstart, int nvar, float x1, float x2, int nstep,
            void (*derivs)(float,float *,float *));
void    rkqc(float *y, float *dydx, int n, float *x, float htry,
            float eps, float *yscal, float *hdid, float *hnext,
            void (*derivs)(float,float *,float *));
float   rofunc(float b);
float   rtbis(float (*func)(float), float x1, float x2, float xacc);
float   rtflsp(float (*func)(float), float x1, float x2, float xacc);
float   rtnewt(void (*funcd)(float,float *,float *), float x1, float x2,
            float xacc);
float   rtsafe(void (*funcd)(float,float *,float *), float x1, float x2,
            float xacc);
float   rtsec(float (*func)(float), float x1, float x2, float xacc);
void    rzextr(int iest, float xest, float *yest, float *yz, float *dy,
            int nv, int nuse);
void    scrsho(float (*fx)(float));
void    shell(int n, float *arr);
void    shoot(int nvar, float *v, float *delv, int n2, float x1, float x2,
            float eps, float h1, float hmin, float *f, float *dv);
void    shootf(int nvar, float *v1, float *v2, float *delv1, float *delv2,
            int n1, int n2, float x1, float x2, float xf, float eps,
            float h1, float hmin, float *f, float *dv1, float *dv2);
void    simp1(float **a, int mm, int *ll, int nll, int iabf, int *kp,
            float *bmax);
void    simp2(float **a, int n, int *l2, int nl2, int *ip, int kp,
            float *q1);
void    simp3(float **a, int i1, int k1, int ip, int kp);
void    simplx(float **a, int m, int n, int m1, int m2, int m3,
            int *icase, int *izrov, int *iposv);
void    sinft(float *y, int n);
void    smooft(float *y, int n, float pts);
void    sncndn(float uu, float emmc, float *sn, float *cn, float *dn);
```

```c
    void    solvde(int itmax, float conv, float slowc, float *scalv,
                int *indexv, int ne, int nb, int m, float **y, float ***c,
                float **s);
    void    sor(double **a, double **b, double **c, double **d, double **e,
                double **f, double **u, int jmax, double rjac);
    void    sort(int n, float *ra);
    void    sort2(int n, float *ra, float *rb);
    void    sort3(int n, float *ra, float *rb, float *rc);
    void    sparse(float *b, int n, float *x, float *rsq);
    void    spctrm(FILE *fp, float *p, int m, int k, int ovrlap);
    void    spear(float *data1, float *data2, int n, float *d, float *zd,
                float *probd, float *rs, float *probrs);
    void    splie2(float *x1a, float *x2a, float **ya, int m, int n,
                float **y2a);
    void    splin2(float *x1a, float *x2a, float **ya, float **y2a, int m,
                int n, float x1, float x2, float *y);
    void    spline(float *x, float *y, int n, float yp1, float ypn, float *y2)
    void    splint(float *xa, float *ya, float *y2a, int n, float x, float *y)
    void    svbksb(float **u, float *w, float **v, int m, int n, float *b,
                float *x);
    void    svdcmp(float **a, int m, int n, float *w, float **v);
    void    svdfit(float *x, float *y, float *sig, int ndata, float *a,
                int ma, float **u, float **v, float *w, float *chisq,
                void (*funcs)(float,float *,int));
    void    svdvar(float **v, int ma, float *w, float **cvm);
    void    toeplz(float *r, float *x, float *y, int n);
    void    tptest(float *data1, float *data2, int n, float *t, float *prob);
    void    tqli(float *d, float *e, int n, float **z);
    float   trapzd(float (*func)(float), float a, float b, int n);
    void    tred2(float **a, int n, float *d, float *e);
    void    tridag(float *a, float *b, float *c, float *r, float *u, int n);
    void    ttest(float *data1, int n1, float *data2, int n2, float *t,
                float *prob);
    void    tutest(float *data1, int n1, float *data2, int n2, float *t,
                float *prob);
    void    twofft(float *data1, float *data2, float *fft1, float *fft2,
                int n);
    void    vander(float *x, float *w, float *q, int n);
    int     zbrac(float (*func)(float), float *x1, float *x2);
    void    zbrak(float (*fx)(float), float x1, float x2, int n, float *xb1,
                float *xb2, int *nb);
    float   zbrent(float (*func)(float), float x1, float x2, float tol);
    void    zroots(fcomplex *a, int m, fcomplex *roots, int polish);
#endif
#ifdef TRADITIONAL
    void    adi();
    void    amoeba();
    void    anneal();
    void    avevar();
    void    balanc();
    void    bcucof();
    void    bcuint();
    float   bessi();
    float   bessi0();
    float   bessi1();
    float   bessj();
    float   bessj0();
    float   bessj1();
    float   bessk();
    float   bessk0();
    float   bessk1();
    float   bessy();
    float   bessy0();
    float   bessy1();
    float   beta();
    float   betacf();
    float   betai();
    float   bico();
    void    bksub();
    float   bnldev();
    float   brent();
    void    bsstep();
    void    caldat();
    float   cel();
```

```
void chder();
float chebev();
void chebft();
void chebpc();
void chint();
void chsone();
void chstwo();
void cntab1();
void cntab2();
void convlv();
void correl();
void cosft();
void covsrt();
void crank();
float dbrent();
void ddpoly();
void des();
void ks();
void cyfun();
float df1dim();
void dfpmin();
void dlinmin();
void difeq();
void eclass();
void eclazz();
void eigsrt();
float el2();
void elmhes();
float erf();
float erfc();
float erfcc();
void eulsum();
float avimem();
float expdev();
float fidim();
float factln();
float factrl();
void fgauss();
void fit();
void fixrts();
void fleg();
void flmon();
void four1();
void fourn();
void fpoly();
void frprmn();
void ftest();
float gamdev();
float gammln();
float gammp();
float gammq();
float gasdev();
void gauleg();
void gaussj();
void gcf();
float golden();
void gser();
void hqr();
void hunt();
void indexx();
int irbit1();
int irbit2();
void jacobi();
long julday();
void kendl1();
void kendl2();
void ksone();
void kstwo();
void laguer();
void lfit();
void linmin();
void locate();
void lubksb();
void ludcmp();
```

```
void mdian1();
void mdian2();
void medfit();
void memcof();
float midexp();
float midinf();
float midpnt();
float midsql();
float midsqu();
void mmid();
void mnbrak();
void mnewt();
void moment();
void mprove();
void mrqcof();
void mrqmin();
void odeint();
void pcshft();
void pearsn();
void piksr2();
void piksrt();
void pinvs();
float plgndr();
float poidev();
void polcoe();
void polcof();
void poldiv();
void polin2();
void polint();
void powell();
void predic();
float probks();
void pzextr();
void qcksrt();
float qgaus();
float qromb();
float qromo();
void qroot();
float qsimp();
float qtrap();
float quad3d();
float ran0();
float ran1();
float ran2();
float ran3();
float ran4();
void rank();
void ratint();
void realft();
void red();
void rk4();
void rkdumb();
void rkqc();
float rofunc();
float rtbis();
float rtflsp();
float rtnewt();
float rtsafe();
float rtsec();
void rzextr();
void scrsho();
void shell();
void shoot();
void shootf();
void simp1();
void simp2();
void simp3();
void simplx();
void sinft();
void smooft();
void sncndn();
void solvde();
void sor();
void sort();
```

```
                void sort2();
                void sort2();
                void sparse();
                void spctrm();
                void spear();
                void splie2();
                void splin2();
                void spline();
                void splint();
                void svbksb();
                void svdcmp();
                void svdfit();
                void svdvar();
                void toeplz();
                void trtest();
                void tqli();
                float trapzd();
                void tred2();
                void tridag();
                void ttest();
                void tutest();
                void twofft();
                void vander();
                int zbrac();
                void zbrak();
                float zbrent();
                void zroots();
#endif
        float *vector();
        float **matrix();
        float **convert_matrix();
        double *dvector();
        double **dmatrix();
        int *ivector();
        int **imatrix();
        float **submatrix();
        void free_vector();
        void free_dvector();
        void free_ivector();
        void free_matrix();
        void free_dmatrix();
        void free_imatrix();
        void free_submatrix();
        void free_convert_matrix();
        void nrerror();

#include <malloc.h>
        #include <stdio.h> void nrerror(error_text)
        char error_text[];
        {
                void exit();

fprintf(stderr,"Numerical Recipes run-time error...\n");
                fprintf(stderr,"%s\n",error_text);
                fprintf(stderr,"...now exiting to system...\n");
                exit(1);
        } float *vector(nl,nh)
        int nl,nh;
        {
                float *v;

v=(float *)malloc((unsigned) (nh-nl+1)*sizeof(float));
                if (!v) nrerror("allocation failure in vector()");
                return v-nl;
        }
```

```
int *ivector(nl,nh)
int nl,nh;
{
        int *v;

v=(int *)malloc((unsigned) (nh-nl+1)*sizeof(int));
        if (!v) nrerror("allocation failure in ivector()");
        return v-nl;
} double *dvector(nl,nh)
int nl,nh;
{
        double *v;

v=(double *)malloc((unsigned) (nh-nl+1)*sizeof(double));
        if (!v) nrerror("allocation failure in dvector()");
        return v-nl;
} float **matrix(nrl,nrh,ncl,nch)
int nrl,nrh,ncl,nch;
{
        int i;
        float **m;

m=(float **) malloc((unsigned) (nrh-nrl+1)*sizeof(float*));
        if (!m) nrerror("allocation failure 1 in matrix()");
        m -= nrl;

for(i=nrl;i<=nrh;i++) {
                m[i]=(float *) malloc((unsigned) (nch-ncl+1)*sizeof(float));
                if (!m[i]) nrerror("allocation failure 2 in matrix()");
                m[i] -= ncl;
        }
        return m;
} double **dmatrix(nrl,nrh,ncl,nch)
int nrl,nrh,ncl,nch;
{
        int i;
        double **m;

m=(double **) malloc((unsigned) (nrh-nrl+1)*sizeof(double*));
        if (!m) nrerror("allocation failure 1 in dmatrix()");
        m -= nrl;

for(i=nrl;i<=nrh;i++) {
                m[i]=(double *) malloc((unsigned) (nch-ncl+1)*sizeof(double));
                if (!m[i]) nrerror("allocation failure 2 in dmatrix()");
                m[i] -= ncl;
        }
        return m;
} int **imatrix(nrl,nrh,ncl,nch)
int nrl,nrh,ncl,nch;
{
        int i,**m;

m=(int **)malloc((unsigned) (nrh-nrl+1)*sizeof(int*));
        if (!m) nrerror("allocation failure 1 in imatrix()");
        m -= nrl;

for(i=nrl;i<=nrh;i++) {
                m[i]=(int *)malloc((unsigned) (nch-ncl+1)*sizeof(int));
                if (!m[i]) nrerror("allocation failure 2 in imatrix()");
                m[i] -= ncl;
        }
        return m;
}
```

```
float **submatrix(a,oldrl,oldrh,oldcl,oldch,newrl,newcl)
float **a;
int oldrl,oldrh,oldcl,oldch,newrl,newcl;
{
        int i,j;
        float **m;

m=(float **) malloc((unsigned) (oldrh-oldrl+1)*sizeof(float*));
        if (!m) nrerror("allocation failure in submatrix()");
        m -= newrl;

for(i=oldrl,j=newrl;i<=oldrh;i++,j++) m[j]=a[i]+oldcl-newcl;

return m;
}
void free_vector(v,nl,nh)
float *v;
int nl,nh;
{
        free((char*) (v+nl));
} void free_ivector(v,nl,nh)
int *v,nl,nh;
{
        free((char*) (v+nl));
} void free_dvector(v,nl,nh)
double *v;
int nl,nh;
{
        free((char*) (v+nl));
} void free_matrix(m,nrl,nrh,ncl,nch)
float **m;
int nrl,nrh,ncl,nch;
{
        int i;

for(i=nrh;i>=nrl;i--) free((char*) (m[i]+ncl));
        free((char*) (m+nrl));
} void free_dmatrix(m,nrl,nrh,ncl,nch)
double **m;
int nrl,nrh,ncl,nch;
{
        int i;

for(i=nrh;i>=nrl;i--) free((char*) (m[i]+ncl));
        free((char*) (m+nrl));
} void free_imatrix(m,nrl,nrh,ncl,nch)
int **m;
int nrl,nrh,ncl,nch;
{
        int i;

for(i=nrh;i>=nrl;i--) free((char*) (m[i]+ncl));
        free((char*) (m+nrl));
} void free_submatrix(b,nrl,nrh,ncl,nch)
float **b;
int nrl,nrh,ncl,nch;
{
```

```
        free((char*) (b+nrl));
} float **convert_matrix(a,nrl,nrh,ncl,nch)
float *a;
int nrl,nrh,ncl,nch;
{
        int i,j,nrow,ncol;
        float **m;

nrow=nrh-nrl+1;
        ncol=nch-ncl+1;
        m = (float **) malloc((unsigned) (nrow)*sizeof(float*));
        if (!m) nrerror("allocation failure in convert_matrix()");
        m -= nrl;
        for(i=0,j=nrl;i<=nrow-1;i++,j++) m[j]=a+ncol*i-ncl;
        return m;
} void free_convert_matrix(b,nrl,nrh,ncl,nch)
float **b;
int nrl,nrh,ncl,nch;
{
        free((char*) (b+nrl));
}

/*\\\\\\\\\\\\\\\\\\\\\\\\\\\\\\\\\\\\\\\\//////////////////////////////////////// paramtrx_util.c -- used by paramtrx programs

////////////////////////////////////////\\\\\\\\\\\\\\\\\\\\\\\\\\\\\\\\\\\\\\\\*/
/*#include <stdio.h>
#include <fcntl.h>
#include <math.h>
#include <nr.h>
#include <nrutil.h> */
#include "paramtrc.h"

/*
   int save_cta(cta,np,nf)   save complex float data in ASCII format int save_sint(data,n,m)   save short int data in a  binaraty file int rotation_2d(data,nn)  rotate 2D complex data int shift(pt,h_length)    shift 1D complex data int train_m(cT,n1,n2,cta,m1,m2)

input cta, output cT(n)(np) = cta(n)(m) x conjugate of cta(m)(np)

int eigen_nm(cT,n1,n2,eig_vl,ceig_vct)

input complex Hermitian matrix, return eigen values and vectors int CM_mutil(a,n,m,b,np,c)  complex matrix product, c = a x b int CM_adjmutil(a,n,m,c)    output c = adjoint of a mutiply of a int CM_adj(a,a_adj,n,m)     output complex conjugate of a[m][n]

int histogram(data,rl,rh,num,hist,num_lv)

input data[0...num-1] float array range from rl to rh output hist[0...num_lv-1] probability of data in the range from rl to r int save_cfbin(cta,np,nf)  save complex float data in binaraty format
```

```
*/
int
dspl_raw(ct,np,nf)
float **ct;
int np,nf;
{
   short fc_sl_mgntd[MAX_PENC][MAX_FENC];
   int j,k;
   float **m_fc,scale_fct,max,min;

m_fc=matrix(0,np-1,0,nf-1);

/* get magnitude of Fourier components */
   for(j=0; j<np; j++) {
      for(k=0; k<nf; k++) {
         m_fc[j][k]=sqrt(ct[j][2*k]*ct[j][2*k]+ct[j][2*k+1]*ct[j][2*k+1]);
      }
   }

/* find max and mini */
   max=m_fc[0][0];
   min=m_fc[0][0];
   for(j=0; j<np; j++) {
      for(k=0; k<nf; k++) {
         max=MAX(max,m_fc[j][k]);
         min=MIN(min,m_fc[j][k]);
      }
   }

/* scale magnitudes */
   scale_fct=(max-min)/2000.0;
   for(j=0; j<np; j++) {
      for(k=0; k<nf; k++) {
         fc_sl_mgntd[j][k]=(short)((m_fc[j][k]-min)/scale_fct);
      }
   }
   /* display Fourier components */
   save_sint(fc_sl_mgntd,np,nf);

free_matrix(m_fc,0,np-1,0,nf-1);
} int
dspl_fc(ct,ct_rec,np,nf)
float **ct,**ct_rec;
int np,nf;
{
   short fc_sl_mgntd[MAX_PENC][MAX_FENC],fc_rec_sl_mgntd[MAX_PENC][MAX_FENC];
   int j,k;
   float **m_fc,**m_fc_rec,scale_fct,max,min;

m_fc=matrix(0,np-1,0,nf-1);
   m_fc_rec=matrix(0,np-1,0,nf-1);

/* set magnitude of Fourier components */
   for(j=0; j<np; j++) {
      for(k=0; k<nf; k++) {
         m_fc[j][k]=sqrt(ct[j][2*k]*ct[j][2*k]+ct[j][2*k+1]*ct[j][2*k+1]);
         m_fc_rec[j][k]=sqrt(ct_rec[j][2*k]*ct_rec[j][2*k]+ct_rec[j][2*k+1]*ct_re
      }
   }

/* find max and mini */
   max=m_fc[0][0];
   min=m_fc[0][0];
   for(j=0; j<np; j++) {
      for(k=0; k<nf; k++) {
         max=MAX(max,m_fc[j][k]);
         min=MIN(min,m_fc[j][k]);
         max=MAX(max,m_fc_rec[j][k]);
         min=MIN(min,m_fc_rec[j][k]);
      }
   }
printf("\nmax %f and min %f ",max,min);

/* scale magnitudes */
```

```c
    scale_fct=(max-min)/2000.0;
    for(j=0; j<np; j++) {
       for(k=0; k<nf; k++) {
          fc_sl_mgntd[j][k]=(short)((m_fc[j][k]-min)/scale_fct);
          fc_rec_sl_mgntd[j][k]=(short)((m_fc_rec[j][k]-min)/scale_fct);
       }
    }
    /* display Fourier components */
    save_sint(fc_rec_sl_mgntd,np,nf);
    system("mv temp.dat temp1.dat &");
    sleep(1);
    save_sint(fc_sl_mgntd,np,nf);

sleep(1);

free_matrix(m_fc,0,np-1,0,nf-1);
    free_matrix(m_fc_rec,0,np-1,0,nf-1);

} int
read_cfasc(fp,cta,np,nf)  /* read complex data in ASCII file */
float **cta;
int np,nf;
FILE *fp;
{
   int j,k;

for(j=0; j<np; j++) {
      for(k=0; k<nf; k++)
         fscanf(fp,"%f, %f, ",&cta[j][2*k],&cta[j][2*k+1]);
      fprintf(fp,"\n");
   }
   fclose(fp);

} int
read_cfbin(fd,cta,np,nf)   /* read complex data in BIN file */
float **cta;
int np,nf;
{
   int j;

for(j=0; j<np; j++ ) {
     if( (read(fd,cta[j],2*nf*sizeof(float))) < 2*nf*sizeof(float) ) {
        printf("\nError to read");
     }
   }
   close(fd);

} int
save_cfbin(cta,np,nf)
float **cta;
int np,nf;              /* cta[0...np-1][0...2*nf-1] comply matrice */
{
   int fd,j,k;
   char filename[20],flg[5];

strcpy(filename,"fc_2d.bin");
   if( (fd=open(filename,O_RDWR|O_CREAT,0666)) < 0 ) {
      fprintf(stderr,"%cERROR : can not create %s \n",7,filename);
      exit(-1);
   }
   else
      fprintf(stderr,"%s created\n",filename);

write(fd,&np,sizeof(int));
   write(fd,&nf,sizeof(int));
```

```c
    for(j=0; j<np; j++ ) {
       if( (write(fd,cta[j],2*nf*sizeof(float))) < 2*nf*sizeof(float) ) {
         printf("\n error to write");
       }
    }
    close(fd);

} int
write_cfbin(fd,cta,np,nf)
int fd,np,nf;
float **cta; /* cta[0...np-1][0...2*nf-1] compelx matrice */
{
   int j,k;

for(j=0; j<np; j++ ) {
      if( (write(fd,cta[j],2*nf*sizeof(float))) < 2*nf*sizeof(float) ) {
        printf("\n error to write");
      }
   }
   close(fd);
} int
save_cta(cta,np,nf)   /* save complex float data in ASCII format */
float **cta;
int np,nf;            /*  cta[0...np-1][0...2*nf-1] compelx matrice */
{ int j,k;
   FILE *fp;
   char filename[20];

strcpy(filename,"fc_2d.dat");
   if( (fp=fopen(filename,"w")) ==NULL) {
      fprintf(stderr,"%cERROR : file %s can not open to write\n",7,filename);
      return(-1);
   }
   else
      fprintf(stderr,"\n%s opened for writing\n",filename);

fprintf(fp,"num_penc %d and num_fenc %d\n",np,nf);
   for(j=0; j<np; j++) {
      for(k=0; k<nf; k++) {
         fprintf(fp,"%f, %f, ",cta[j][2*k],cta[j][2*k+1]);
      }
      fprintf(fp,"\n");
   }
   fclose(fp);

} int
save_sint(data,n,m) /* save short int data in a file */
short **data;
int n,m;            /* data[0...n-1][0..m-1]  */
{ int fd,j,k;
   char filename[20],fig[5];

/* printf("\nenter file name to write :");
   scanf("%s",filename);
*/
   strcpy(filename,"temp.dat");
   if( (fd=open(filename,O_RDWR|O_CREAT,0666)) < 0 ) {
      fprintf(stderr,"%cERROR : can not create %s \n",7,filename);
      exit(-1);
   }
   else
      fprintf(stderr,"%s created\n",filename);
```

```
    if( (write(fd,data,n*m*sizeof(short))) < n*m*sizeof(short) ) {
      printf("\n error to write");
    } close(fd);
} int
rotation_2d(data,nn)
float *data;     /* data[0....2*ny*nx-1]  complex array */
int nn[];  /* nn[1..2] nn[1]=ny nn[2]=nx   */
{ float *tmp_array;
    int j,k;

tmp_array=vector(0,nn[1]-1);

/* rotate data along second dim */
    for(j=0; j<nn[1]; j++)
      shift(data+j*2*nn[2],nn[2]);

/* rotate data along first dim */
    for(j=0; j<2*nn[2]; j++) {
       for(k=0; k<nn[1]; k++) {
          tmp_array[k]=data[k*2*nn[2]+j];
       }
       shift(tmp_array,nn[1]/2);
       for(k=0; k<nn[1]; k++) {
          data[k*2*nn[2]+j]=tmp_array[k];
       }
    } free_vector(tmp_array,0,nn[1]-1);
} int shift(pt,h_length)
float pt[];
int h_length;
{
    float temp;
    int i;                       /* loop index */ for(i=0; i<h_length; i++)
      {
        temp=pt[i];
        pt[i]=pt[i+h_length];
        pt[i+h_length]=temp;
      }
} int
train_m(cT,n1,n2,cta,m1,m2)
float **cT,**cta;              /* cT and cta are complex pointers */
int n1,n2,m1,m2;              /* cT[0...n1-1][0...2*n2-1] cta[0...m1][0...2*m2-1]*/
/* input cta, output cT(n)(np) = cta(n)(m) x conjugate of cta(m)(np)  */
{
    int j,k,l;

/* calculate training matrix */
    for(j=0; j<n1; j++) {
      for(k=0; k<n2; k++) {
        cT[j][2*k]=0.0;
        cT[j][2*k+1]=0.0;
        for(l=0; l<m2; l++) {
           cT[j][2*k]   +=cta[j][2*l]*cta[k][2*l]+cta[j][2*l+1]*cta[k][2*l+1];
           cT[j][2*k+1] +=-cta[j][2*l]*cta[k][2*l+1]+cta[j][2*l+1]*cta[k][2*l]
;
        }
      }
    }
}
```

```
int
train_m_clm(cT_clm,nc,np,cta,npp,nx)
float **cT_clm,**cta;
int nc,np,npp,nx;
/* cT_clm[0...nc*np-1][0...2*np-1]  train matrice by columes
   cta[0...npp-1][0...2*nx-1]  Fourier components by columes
   usually np=npp, nc <= nx
   if nc < nx, nx/nc columes form one training matrix  */
{ int j,k,l,i,group;

if( nc < nx )
    group=nx/nc;
  else
    group=1;
printf("\ngroup is %d",group);

/* initialize cT_clm */
  for(l=0; l<nc*np; l++)
     for(j=0; j<2*np; j++)
        cT_clm[l][j]=0.0;

/* calculate cT_clm */
  for(l=0; l<nc; l++) {    /* columes */
   for(j=0; j<np; j++) {   /* phase_encodings */
    for(k=0; k<np; k++) {  /* phase-encodings */
      for(i=l*group; i<(l+1)*group; i++) {
        cT_clm[l*np+j][2*k] +=cta[j][2*i]*cta[k][2*i]+
                      cta[j][2*i+1]*cta[k][2*i+1];
        cT_clm[l*np+j][2*k+1] +=-cta[j][2*i]*cta[k][2*i+1]+
                      cta[j][2*i+1]*cta[k][2*i];
     }
    }
   }
  }

} int
eigen_hm(cT,n1,n2,eig_vl,ceig_vct)
float **cT,*eig_vl,**ceig_vct;
int n1,n2;
/* input cT[0...n1-1][0...2*n2-1] complex Hermitian matrix
   return ceig_vct[0...n1-1][0...2*n2-1] eig_vl[0...n1-1] */
{
  float **rT,*d,*e,**uv;
  int j,k,nrot;

rT=matrix(1,2*n1,1,2*n2);
 uv=matrix(1,2*n1,1,2*n2);
 d=vector(1,2*n1);
 e=vector(1,2*n1);

for(j=0; j<n1; j++) {
    for(k=0; k<n2; k++) {
       rT[j+1][k+1]=cT[j][2*k];
       rT[j+1][n2+k+1]=-cT[j][2*k+1];
       rT[n1+j+1][k+1]=cT[j][2*k+1];
       rT[n1+j+1][n2+k+1]=cT[j][2*k];
    }
 }

/*  printf("\ncT I");
  for(j=0; j<n1; j++) {
     for(k=0; k<n2; k++) {
        printf("%f, ",cT[j][2*k]);
     }
     printf("\n");
  }
  printf("\ncT Q");
  for(j=0; j<n1; j++) {
     for(k=0; k<n2; k++) {
        printf("%f, ",cT[j][2*k+1]);
     }
     printf("\n");
```

```
     printf("\n\nT A");
     for(j=0; j<n1; j++) {
        for(k=0; k<n2; k++) {
           printf("%f, ",rT[j+1][k+1]);
        }
        printf("\n");
     }
     printf("\n\nT -B");
     for(j=0; j<n1; j++) {
        for(k=0; k<n2; k++) {
           printf("%f, ",rT[j+1][n2+k+1]);
        }
        printf("\n");
     }
     printf("\n\nT B");
     for(j=0; j<n1; j++) {
        for(k=0; k<n2; k++) {
           printf("%f, ",rT[n1+j+1][k+1]);
        }
        printf("\n");
     }
     printf("\n\nT low A");
     for(j=0; j<n1; j++) {
        for(k=0; k<n2; k++) {
           printf("%f, ",rT[n1+j+1][n2+k+1]);
        }
        printf("\n");
     }
*/
     /* solve eigen problems of  rT[1...2*n1][1...2*n2]  matrix */
     /* jacobi is better than svdcmp and tred2 and qtli, but slower . */

/*   jacobi_yc(rT,2*n1,d,uv,&nrot);
     printf("\n num. of jacobi rotation %d",nrot);
*/
/*   svdcmp(rT,2*n1,2*n1,d,uv);   */ for(j=1; j<=2*n1; j++) {
        for(k=1; k<=2*n2; k++)
           uv[j][k]=rT[j][k];
     }
     tred2(uv,2*n1,d,e);
     tqli_yc(d,e,2*n1,uv);

eigsrt(d,uv,2*n1);

for(j=1; j<=n1; j++) {
        eig_v[j-1]=d[2*j];
/*      printf("\n%f, %f",d[2*j],d[2*j-1]); */
     } for(j=0; j<n1; j++) {
        for(k=0; k<n2; k++) {
           ceig_vct[j][2*k]=uv[j+1][2*k+1];
           ceig_vct[j][2*k+1]=uv[n1+j+1][2*k+1];
        }
     }
     free_matrix(uv,1,2*n1,1,2*n2);
     free_matrix(rT,1,2*n1,1,2*n2);
     free_vector(d,1,2*n1);
     free_vector(e,1,2*n1);
} fcomplex **cmatrix(nrl,nrh,ncl,nch)
int nrl,nrh,ncl,nch;
{
     int i;
     fcomplex **m;

m=(fcomplex **)malloc((unsigned) (nch-nrl+1)*sizeof(fcomplex*));
     if(!m) nrerror("allocation failure 1 in cmatrix()");
     m -=nrl;
```

```
    for(i=nrl; i<=nrh; i++) {
        m[i]=(fcomplex *)malloc((unsigned) (nch-ncl+1)*sizeof(fcomplex));
        if(!m[i]) nrerror("allocation failure 2 in matrix()");
        m[i] -=ncl;
    } return m;
} void free_cmatrix(m,nrl,nrh,ncl,nch)
fcomplex **m;
int nrl,nrh,ncl,nch;
{
    int i;

for(i=nrh; i>=nrl; i--) free((char*)(m[i]+ncl));
    free((char*) (m+nrl));
} int CM_mutil(a,n,m,b,np,c)
float c,a,**b;
int n,m,np;
/* c[0,n-1][0,2*np-1],a[0,n-1][0,2*m-1] and b[0,m-1][0,2*np-1] are complex
   matrix. c[n][np]=a[n][m]*b[m][np]  */
{
    int j,k,l;
    float sum,temp;

for(j=0;j<n; j++) {
        for(k=0; k<np; k++) {
            c[j][2*k]=0.0;
            c[j][2*k+1]=0.0;
            for(l=0; l<m; l++){
                c[j][2*k]   += a[j][2*l]*b[l][2*k]-a[j][2*l+1]*b[l][2*k+1];
                c[j][2*k+1] += a[j][2*l]*b[l][2*k+1]+a[j][2*l+1]*b[l][2*k];
            }
        }
    }
} int
CM_adjmutil(a,n,m,c)
float **a,**c;
int n,m;
/* input a[0...n-1][0...2*m-1] complex matrice
   output c[0..m-1][0...2*m-1] complex matrice
   c(m)(m)=a*(m)(n)Xa(n)(m) adjoint of a mutiply of a */
{
    int j,k,l;

for(j=0; j<m; j++) {
        for(k=0; k<m; k++) {
            c[j][2*k]=0.0;
            c[j][2*k+1]=0.0;
            for(l=0; l<n; l++){
                c[j][2*k]   += a[l][2*j]*a[l][2*k]+a[l][2*j+1]*a[l][2*k+1];
                c[j][2*k+1] += a[l][2*j]*a[l][2*k+1]-a[l][2*j+1]*a[l][2*k];
            }
        }
    }
} int CM_adj(a,a_adj,n,m)
float a,a_adj;
int n,m;
/* a[0...n-1][0...2*m-1] and a_adj[0...m-1][0...2*n-1]
   a[n][m] = complex conjugate of a_adj[m][n]  */
{
```

```
    int j,k;

for(j=0; j<n; j++)  {
       for(k=0; k<m; k++)   {
           a_adj[k][2*j]=a[j][2*k];
           a_adj[k][2*j+1]=-a[j][2*k+1];
       }
    }

}
int
histogram(data,rl,rh,num,hist,num_lv)
float *data,rl,rh,*hist;
int num,num_lv;
/* input data[0...num-1] float array range from rl to rh
   output hist[0...num_lv-1] probability of data in the range from rl to rh
*/
{
  float scale;
  int j,k;

scale=(rh-rl)/(float)num_lv;
  for(j=0; j<num_lv; j++ )
      hist[j]=0.0;

for(j=0; j<num; j++ )
      hist[(int)((data[j]-rl)/scale)]++;
include <math.h> define SIGN(a,b) ((b)<0 ? -fabs(a) : fabs(a))

void tqli_yc(d,e,n,z)
float d[],e[],**z;
int n;
{
        int m,l,iter,i,k;
        float s,r,p,g,f,dd,c,b;
        void nrerror();

for (i=2;i<=n;i++) e[i-1]=e[i];
        e[n]=0.0;
        for (l=1;l<=n;l++) {
                iter=0;
                do {
                        for (m=l;m<=n-1;m++) {
                                dd=fabs(d[m])+fabs(d[m+1]);
                                if (fabs(e[m])+dd == dd) break;
                        }
                        if (m != l) {
                                if (iter++ == 60) {m=l; break;} /*nrerror("Too m
                                g=(d[l+1]-d[l])/(2.0*e[l]);
                                r=sqrt((g*g)+1.0);
                                g=d[m]-d[l]+e[l]/(g+SIGN(r,g));
                                s=c=1.0;
                                p=0.0;
                                for (i=m-1;i>=l;i--) {
                                        f=s*e[i];
                                        b=c*e[i];
                                        if (fabs(f) >= fabs(g)) {
                                                c=g/f;
                                                r=sqrt((c*c)+1.0);
                                                e[i+1]=f*r;
                                                c *= (s=1.0/r);
                                        } else {
                                                s=f/g;
                                                r=sqrt((s*s)+1.0);
                                                e[i+1]=g*r;
                                                s *= (c=1.0/r);
                                        }
                                        g=d[i+1]-p;
                                        r=(d[i]-g)*s+2.0*c*b;
                                        p=s*r;
```

```
                        d[i+1]=g+p;
                        g=c*r-b;
                        /* Next loop can be omitted if eigenvect
                        for (k=1;k<=n;k++) {
                                f=z[k][i+1];
                                z[k][i+1]=s*z[k][i]+c*f;
                                z[k][i]=c*z[k][i]-s*f;
                        }
                   }
                   d[l]=d[l]-p;
                   e[l]=g;
                   e[m]=0.0;
              }
         } while (m != 1);
    } include <stdio.h> define MAX_POINTS 200 int plot(func)
float (*func)();

/* plot a function over the interval x1 to x2. */
{
   float x1, x2;
   float ydata[MAX_POINTS],x,dx;
   int i;

printf("\nEnter x1 nad x2 ( x1=x2 to stop) :\n");
   scanf("%f %f", &x1, &x2);
   printf("\nx1 and x2 %f %f\n",x1,x2);

if (x1 == x2) return;

dx=(x2-x1)/(MAX_POINTS);
   x=x1;

for(i=0; i<MAX_POINTS; i++) {
       ydata[i]=(*func)(x);
       x += dx;
   } if(write_ascii(ydata,MAX_POINTS,x1,x2)<0 )
       return;

system("xgraph temp.dat &");

} int write_ascii(ydata,num,x1,x2)
float *ydata,x1,x2;
int num;

/* write a ASCII file as x, ydata, named as temp.dat. num is the number of point {
   int i;
   float dx,x;
   FILE *fp;

if( (fp=fopen("temp.dat","w"))==NULL) {
      fprintf(stderr,"%cERROR : temp file can not open for xgraph \n",7);
      return(-1);
   }
   else
      fprintf(stderr,"temp file  opened for xgraph \n");

dx=(x2-x1)/(float)num;
   x=x1;
   for(i=0; i<num; i++) {
       fprintf(fp,"%f     %f \n",x,ydata[i]);
       x +=dx;
   }
```

```
/*\\\\\\\\\\\\\\\\\\\\\\\\\\\\\\\\\///////////////////////// trace_util.c contains functions which are used by trace_inva.c

////////////////////////////////////\\\\\\\\\\\\\\\\\\\\\\\\\*/ include <stdio.h>
include <fcntl.h>
#include <math.h>
#include <sys/types.h>
include <unistd.h> int  cmbnt_conf(index,num_ele,max_ele,num_cmbnt)
int *index,num_ele,max_ele,*num_cmbnt;
/* right end forward one step move */
/* cmbnt_conf calculates combination configurations of num_ele out
   max_ele, puts configuration in index[1...num_ele] and updates
   *num_cmbnt. When all the combinations have been calculated, it
   return -1.
*/
{
    int last_ele,i,j;

last_ele=num_ele;

i=0;

index[last_ele] +=1;
    while(index[last_ele-i] >(max_ele-i)) {
      if(i == (last_ele-1))
         return -1;
      i++;
      index[last_ele-i] +=1;
      for(j=i; j>0; j--)
         index[last_ele-j+1]=index[last_ele-j]+1;
    }
    *num_cmbnt +=1;
     return 1;
} int
nfw_cmbnt_conf(index,num_ele,max_ele,m,num_cmbnt)
int *index,num_ele,max_ele,m,*num_cmbnt;
/* middle element forward one step move */
/* cmbnt_conf calculates combination configurations of num_ele out
   max_ele, puts configuration in index[1...num_ele] and updates
   *num_cmbnt. When all the combinations have been calculated, it
   return -1.
*/
{
    int last_ele,i,j;

index[m] +=1;

i=0;
   if( index[m] == index[m+1]) {
     while( index[m-i] > (max_ele-num_ele+m-i)  ) {
       if( (m-i) == 1 ) {
          for(j=m; j>0; j--)
             index[m]=max_ele-num_ele+j-1;
            *num_cmbnt +=1;
            return 1;
          }
         i++;
         index[m-i] +=1;
         for(j=i; j>0; j--)
            index[m-j+1]=index[m-j]+1;
      }
      i=0;
      while( index[m+i] == index[m+i+1]  ) {
         i++;
         index[m+i]+=1;
      }
```

```
         }
         if( index[m] > max_ele ) {
             index[m]=max_ele;
  printf("\nreach boundary");
             *num_cmbnt +=1;
             return 1;
         }
       *num_cmbnt +=1;
         return 1;
} int
mbw_cmbnt_conf(index,num_ele,max_ele,m,num_cmbnt)
int *index,num_ele,max_ele,m,*num_cmbnt;
/* middle element backward one step move */
/* cmbnt_conf calculates combination configurations of num_ele out
   max_ele, puts configuration in index[1...num_ele] and updates
   *num_cmbnt. When all the combinations have been calculated, it
   return -1.
*/
{
    int last_ele,i,j;

index[m] -=1;
    i=0;
    while( index[m+i]  < (m +i) ) {
      if( index[num_ele] <= num_ele) {
        for(j=1; j<=num_ele; j++)
            index[j]=j+1;
        num_cmbnt +=1;
        return 1;
      }
      index[m+i] +=1;
      i++;
      index[m+i] -=1;
    } i=0;
    while( index[m-i] <= index[m-i-1]) {
        i++;
        index[m-i] -=1;
    }
    *num_cmbnt +=1;
    return 1;
}
int  lbw_cmbnt_conf(index,num_ele,max_ele,num_cmbnt)
int *index,num_ele,max_ele,*num_cmbnt;
/* left end backward one step move */
/* cmbnt_conf calculates combination configurations of num_ele out
   max_ele, puts configuration in index[1...num_ele] and updates
   *num_cmbnt. When all the combinations have been calculated, it
   return -1.
*/
{
    int first_ele,i,j;

first_ele=1;

i=0;

index[first_ele] -=1;
    while(index[first_ele+i] < (first_ele+i)) {
      if(i == (num_ele-1))
          return -1;
      i++;
      index[first_ele+i] -=1;
      for(j=i; j>0; j--)
         index[first_ele+j-1]=index[first_ele+j]-1;
    }
    *num_cmbnt +=1;
    return 1;
}
```

```
int  rbw_cmbnt_conf(index,num_ele,max_ele,num_cmbnt)
int  *index,num_ele,max_ele,*num_cmbnt;
/* right end backward one step move */
/* cmbnt_conf calculates combination configurations of num_ele out
   max_ele, puts configuration in index[1...num_ele] and updates
   *num_cmbnt. When all the combinations have been calculated, it
   return -1.
*/
{
   int last_ele,i,j;

last_ele=num_ele;

i=0;

index[last_ele] -=1;

while( (index[last_ele-i] <= index[last_ele-i-1] ) ) {
      i++;
      index[last_ele-i] -=1;
   }
   if( index[1] < 1 )
      return -1;
   *num_cmbnt +=1;
   return 1;
} int lfw_cmbnt_conf(index,num_ele,max_ele,num_cmbnt)
int *index,num_ele,max_ele,*num_cmbnt;
/* left end forward one step move */
/* cmbnt_conf calculates combination configurations of num_ele out
   max_ele, puts configuration in index[1...num_ele] and updates
   *num_cmbnt. When all the combinations have been calculated, it
   return -1.
*/
{
   int first_ele,i,j;

first_ele=1;

i=0;

index[first_ele] +=1;

while(index[first_ele+i] >= index[first_ele+i+1] ) {
      if(index[first_ele+i] > (max_ele-num_ele+i+1)) {
         return -1;
      }
      i++;
      index[first_ele+i] +=1;
   }
   *num_cmbnt +=1;
   return 1;
} int read_spin(fd,data,n,hd_1)
short *data;          /* data[0...n-1] 2 bytes integer */
int fd,n,hd_1;        /* hd_1 is the number of bytes to skip */
{
   if( (lseek(fd,hd_1,SEEK_SET)) != hd_1 ) {
      printf("\nError: offset pointer");
   }
   if( (read(fd,data,n*sizeof(short))) < n*sizeof(short) ){
      printf("\n error to read");
   } close(fd);

} int mini_trace_search(trace,mini_trace,best_cmbnt,index,num_ele,mini_trace_index
double trace,*mini_trace;
int best_cmbnt,*index,num_ele,**mini_trace_index;
```

```
/* mini_trace[1...best_cmbnt],index[1...num_ele],mini_trace_index[1...best_cmbnt
{
   int i,j,last,first,position;

last=best_cmbnt;   first=1;

if(trace>=mini_trace[last])
     return;

/* find the position of this trace in mini_trace array */
   for(i=1; i<last+1 ; i++) {
      if(trace<mini_trace[i]) {
         position=i;
         i=last+1;
      }
   }

/* update mini_trace and mini_trace_index */
   for(i=last; i>position; i--) {
      mini_trace[i]=mini_trace[i-1];
      for(j=1; j<=num_ele; j++)
         mini_trace_index[i][j]=mini_trace_index[i-1][j];
   }
   mini_trace[position]=trace;
   for(j=1; j<=num_ele; j++)
      mini_trace_index[position][j]=index[j];

/*#if defined(DEBUG)
   printf("\n MINI_TRACE array sofar is \n");
   for(i=1; i<best_cmbnt+1; i++)
      printf("%e, ",mini_trace[i]);
#endif */
}
include <math.h> define ROTATE(a,i,j,k,l) g=a[i][j];h=a[k][l];a[i][j]=g-s*(h+g*tau);\
        a[k][l]=h+s*(g-h*tau);

void jacobi_yc(a,n,d,v,nrot)
float **a,d[],**v;
int n,*nrot;
{
        int j,iq,ip,i;
        float tresh,theta,tau,t,sm,s,h,g,c,*b,*z,*vector();
        void nrerror(),free_vector();

b=vector(1,n);
        z=vector(1,n);
        for (ip=1;ip<=n;ip++) {
                for (iq=1;iq<=n;iq++) v[ip][iq]=0.0;
                v[ip][ip]=1.0;
        }
        for (ip=1;ip<=n;ip++) {
                b[ip]=d[ip]=a[ip][ip];
                z[ip]=0.0;
        }
        *nrot=0;
        for (i=1;i<=70;i++) {
                sm=0.0;
                for (ip=1;ip<=n-1;ip++) {
                        for (iq=ip+1;iq<=n;iq++)
                                sm += fabs(a[ip][iq]);
                }
                if (sm == 0.0) {
                        free_vector(z,1,n);
                        free_vector(b,1,n);
                        return;
                }
                if (i < 4)
                        tresh=0.2*sm/(n*n);
                else
```

```
                tresh=0.0;
    for (ip=1;ip<=n-1;ip++) {
        for (iq=ip+1;iq<=n;iq++) {
            g=100.0*fabs(a[ip][iq]);
            if (i > 4 && fabs(d[ip])+g == fabs(d[ip])
                && fabs(d[iq])+g == fabs(d[iq]))
                a[ip][iq]=0.0;
            else if (fabs(a[ip][iq]) > tresh) {
                h=d[iq]-d[ip];
                if (fabs(h)+g == fabs(h))
                    t=(a[ip][iq])/h;
                else {
                    theta=0.5*h/(a[ip][iq]);
                    t=1.0/(fabs(theta)+sqrt(1.0+thet
                    if (theta < 0.0) t = -t;
                }
                c=1.0/sqrt(1+t*t);
                s=t*c;
                tau=s/(1.0+c);
                h=t*a[ip][iq];
                z[ip] -= h;
                z[iq] += h;
                d[ip] -= h;
                d[iq] += h;
                a[ip][iq]=0.0;
                for (j=1;j<=ip-1;j++) {
                    ROTATE(a,j,ip,j,iq)
                }
                for (j=ip+1;j<=iq-1;j++) {
                    ROTATE(a,ip,j,j,iq)
                }
                for (j=iq+1;j<=n;j++) {
                    ROTATE(a,ip,j,iq,j)
                }
                for (j=1;j<=n;j++) {
                    ROTATE(v,j,ip,j,iq)
                }
                ++(*nrot);
            }
        }
    }
    for (ip=1;ip<=n;ip++) {
        b[ip] += z[ip];
        d[ip]=b[ip];
        z[ip]=0.0;
    }
    nrerror("Too many iterations in routine JACOBI");
} undef ROTATE
define M1 259200
#define IA1 7141
#define IC1 54773
#define RM1 (1.0/M1)
#define M2 134456
#define IA2 8121
#define IC2 28411
#define RM2 (1.0/M2)
#define M3 243000
#define IA3 4561
define IC3 51349 float ran1(idum)
int *idum;
{
    static long ix1,ix2,ix3;
    static float r[98];
    float temp;
    static int iff=0;
    int j;
    void nrerror();
```

```
        if (*idum < 0 || iff == 0) {
                iff=1;
                ix1=(IC1-(*idum)) % M1;
                ix1=(IA1*ix1+IC1) % M1;
                ix2=ix1 % M2;
                ix1=(IA1*ix1+IC1) % M1;
                ix3=ix1 % M3;
                for (j=1;j<=97;j++) {
                        ix1=(IA1*ix1+IC1) % M1;
                        ix2=(IA2*ix2+IC2) % M2;
                        r[j]=(ix1+ix2*RM2)*RM1;
                }
                *idum=1;
        }
        ix1=(IA1*ix1+IC1) % M1;
        ix2=(IA2*ix2+IC2) % M2;
        ix3=(IA3*ix3+IC3) % M3;
        j=1 + ((97*ix3)/M3);
        if (j > 97 || j < 1) nrerror("RAN1: This cannot happen.");
        temp=r[j];
        r[j]=(ix1+ix2*RM2)*RM1;
        return temp;
} undef M1
undef IA1
#undef IC1
#undef RM1
#undef M2
#undef IA2
#undef IC2
#undef RM2
#undef M3
#undef IA3
#undef IC3
include <math.h> float gasdev(idum)
int *idum;
{
        static int iset=0;
        static float gset;
        float fac,r,v1,v2;
        float ran1();

if (iset == 0) {
                do {
                        v1=2.0*ran1(idum)-1.0;
                        v2=2.0*ran1(idum)-1.0;
                        r=v1*v1+v2*v2;
                } while (r >= 1.0);
                fac=sqrt(-2.0*log(r)/r);
                gset=v1*fac;
                iset=1;
                return v2*fac;
        } else {
                iset=0;
                return gset;
        }
}
```

What is claimed is:

1. A method for obtaining a visual image of a target object comprising the steps selecting a plurality of training objects each of said training object having a predetermined feature in common with a target object;

placing each said training object in a position for said predetermined feature to be scanned by a scanning system;

scanning each of said plurality of training objects using scanning system for generating training signals, said scanning system sampling multiple lines to represent images of said training objects;

acquiring preselected training signals from said plurality of training objects resembling the target object to be scanned, said training signals representing images of said plurality of training objects having at least one predetermined feature in common with the target object, wherein said training signals are acquired from said plurality of training objects independent of a physical position of said training objects;

deriving, from said training signals, a set of basis functions that provide a convergent series expansion of said images of said training objects;

an operator selecting and inputting scanning systems parameters including an estimated signal-to-noise level, number of said basis functions, and number of said signal measurements of the target object into said scanning system through a user input device;

determining a signal measurement prescription for the target object based on said scanning system parameters;

selecting a target object to be scanned and placing said target object in a position for said predetermined feature to be scanned by said scanning system;

generating a control signal based on said signal measurement prescription so as to control said scanning system to scan said predetermined feature of said target object and acquiring target signals of the target object said scanning system sampling multiple lines to represent an image of said target object;

generating a truncated basis function expansion of the image from said acquired target signals;

estimating additional signal measurements based on said truncated basis function and reconstructing the visual image of the target object using said obtained target signals and said estimated additional signal measurements wherein said visual image is displayed on a visual display device.

2. The method of claim 1 further comprising the step of deriving a set of orthonormal basis functions from the acquired training signals.

3. The method of claim 1 wherein acquiring preselected training signals and deriving said basis functions are not repeated for each target object to be imaged.

4. The method of claim 1 wherein said set of basis functions is derived by diagonalizing training matrices calculated from the training signals.

5. The method of claim 1 wherein measurements of said signals are projection measurements.

6. The method of claim 1 wherein measurements of said signals are phase-encoded signal measurements.

7. The method of claim 2 wherein said orthonormal basis functions comprise a convergent non-Fourier expansion for a set of said training signals.

8. The method of claim 1 wherein reconstructing the image includes applying a back-projection reconstruction technique.

9. The method of claim 1 wherein reconstructing the image includes applying a Fourier transformation reconstruction technique.

10. An apparatus for obtaining a visual image of a target object comprising:

means for selecting a plurality of training objects, each of said training objects having a predetermined feature in common with the target object;

means for placing each of said training objects in a position to be scanned by a scanning means;

said scanning means capable of scanning each of said plurality of training objects for generating training signals, said scanning means sampling multiple lines to represent images of said training objects;

means for acquiring preselected training signals from said plurality of training objects resembling the target object to be scanned, said training signals representing images of said plurality of training objects having at least one predetermined feature in common with the target object, wherein said training signals are acquired from said plurality of training objects independent of a physical position of said training objects;

means for deriving, from said training signals, a set of basis functions that provide a convergent series expansion of said images of said training objects;

an operating selecting and inputting scanning means parameter including an estimated signal-to-noise level, number of said basis functions, and number of said signal measurements of the target object, into said scanning means, through a user input device;

means for determining a signal measurement prescription for the target object based on said scanning means parameters;

means for selecting a target object to be scanned;

means for placing the target object in a position to be scanned, means for generating a control signal based on said signal measurement prescription so as to control means for acquiring target signals of the target object using said scanning means, said scanning means sampling multiple lines to represent an image of said target object;

means for generating a truncated basis function expansion of the image from said acquired target signals;

means for estimating additional signal measurements based on said truncated basis function expansion; and means for reconstructing the visual image of the target object using said obtained target signals and said estimated additional signal measurements.

11. The apparatus of claim 10 wherein measurements of said signals are projection measurements.

12. The apparatus of claim 10 wherein measurements of said signals are phase-encoded signal measurements.

13. The apparatus of claim 10 wherein said reconstructing means comprises means for applying a back-projection reconstruction technique.

14. The apparatus of claim 10 wherein said reconstructing means includes means for applying a Fourier transformation reconstruction technique.

* * * * *